(12) United States Patent
Oyu et al.

(10) Patent No.: US 9,496,383 B2
(45) Date of Patent: Nov. 15, 2016

(54) SEMICONDUCTOR DEVICE AND METHOD OF FORMING THE SAME

(71) Applicant: PS4 LUXCO S.A.R.L., Luxembourg (LU)

(72) Inventors: Kiyonori Oyu, Tokyo (JP); Koji Taniguchi, Tokyo (JP); Koji Hamada, Tokyo (JP); Hiroaki Taketani, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 0 days.

(21) Appl. No.: 14/307,889

(22) Filed: Jun. 18, 2014

(65) Prior Publication Data

US 2014/0299928 A1 Oct. 9, 2014

Related U.S. Application Data

(63) Continuation of application No. 13/458,298, filed on Apr. 27, 2012, now Pat. No. 9,041,085.

(30) Foreign Application Priority Data

Apr. 28, 2011 (JP) .................. 2011-102400

(51) Int. Cl.
*H01L 29/78* (2006.01)
*H01L 27/108* (2006.01)
(Continued)

(52) U.S. Cl.
CPC ....... *H01L 29/7813* (2013.01); *H01L 27/0207* (2013.01); *H01L 27/108* (2013.01); *H01L 27/10817* (2013.01); *H01L 27/10876* (2013.01); *H01L 28/91* (2013.01); *H01L 29/1037* (2013.01); *H01L 29/4236* (2013.01); *H01L 29/66621* (2013.01); *H01L 29/785* (2013.01)

(58) Field of Classification Search
CPC ............. H01L 29/785; H01L 29/6679; H01L 27/1211; H01L 27/0886; H01L 21/823821; H01L 21/823431; H01L 27/0924; H01L 29/4236; H01L 29/7834
See application file for complete search history.

(56) References Cited

U.S. PATENT DOCUMENTS 5,303,714 A 4/1994 Abele
5,371,024 A 12/1994 Hieda et al.
(Continued)

FOREIGN PATENT DOCUMENTS

JP 2006054431 2/2006
JP 2006-339476 12/2006
(Continued)

OTHER PUBLICATIONS

Office Action dated May 24, 2013 in U.S. Appl. No. 13/479,810.
(Continued)

*Primary Examiner* — Ermias Woldegeorgis
*Assistant Examiner* — John Bodnar

(57) ABSTRACT

A semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; and a second diffusion region in the semiconductor substrate. The second diffusion region covers a second side of the first gate groove. The second diffusion region has a bottom which is deeper than a top of the first fin structure.

3 Claims, 44 Drawing Sheets

(51) Int. Cl.
  *H01L 27/02* (2006.01)
  *H01L 49/02* (2006.01)
  *H01L 29/423* (2006.01)
  *H01L 29/66* (2006.01)
  *H01L 29/10* (2006.01)

(56) References Cited

U.S. PATENT DOCUMENTS

| | | | |
|---|---|---|---|
| 6,501,119 B1 | 12/2002 | Ohno | |
| 7,465,637 B2 | 12/2008 | Yamazaki | |
| 7,521,776 B2 | 4/2009 | Cannon et al. | |
| 7,622,354 B2 | 11/2009 | Dreeskornfeld | |
| 7,659,571 B2 | 2/2010 | Yamazaki | |
| 7,687,339 B1* | 3/2010 | Schultz | H01L 21/0337 257/E27.099 |
| 7,767,531 B2 | 8/2010 | Shin et al. | |
| 7,795,096 B2 | 9/2010 | Wang | |
| 8,373,226 B2 | 2/2013 | Taketani | |
| 8,395,198 B2 | 3/2013 | Uchiyama | |
| 8,716,774 B2 | 5/2014 | Mikasa | |
| 2001/0003367 A1 | 6/2001 | Hshieh et al. | |
| 2005/0121709 A1 | 6/2005 | Ozaki | |
| 2005/0133836 A1 | 6/2005 | Seo et al. | |
| 2005/0167741 A1 | 8/2005 | Divakaruni et al. | |
| 2005/0173744 A1 | 8/2005 | Kim et al. | |
| 2005/0196947 A1 | 9/2005 | Seo et al. | |
| 2006/0049445 A1 | 3/2006 | Lee et al. | |
| 2006/0056228 A1 | 3/2006 | Schloesser et al. | |
| 2006/0273388 A1 | 12/2006 | Yamazaki | |
| 2007/0072375 A1 | 3/2007 | Yamazaki | |
| 2007/0096182 A1 | 5/2007 | Schloesser et al. | |
| 2007/0241380 A1 | 10/2007 | Hasunuma | |
| 2008/0003753 A1* | 1/2008 | Seo et al. | 438/296 |
| 2008/0012067 A1* | 1/2008 | Wu | H01L 27/10876 257/330 |
| 2008/0073708 A1 | 3/2008 | Aiso | |
| 2008/0079046 A1 | 4/2008 | Ozaki | |
| 2008/0128800 A1* | 6/2008 | Song | H01L 29/4236 257/330 |
| 2008/0157211 A1 | 7/2008 | Wang | |
| 2008/0191288 A1 | 8/2008 | Kwon et al. | |
| 2008/0277745 A1 | 11/2008 | Hsu et al. | |
| 2008/0283957 A1 | 11/2008 | Kang et al. | |
| 2008/0284029 A1 | 11/2008 | Kim et al. | |
| 2009/0096014 A1 | 4/2009 | Choi et al. | |
| 2009/0114967 A1 | 5/2009 | Lee et al. | |
| 2010/0237397 A1 | 9/2010 | Uchiyama | |
| 2011/0033994 A1 | 2/2011 | Fujimoto et al. | |
| 2011/0049599 A1 | 3/2011 | Taketani | |
| 2011/0057239 A1 | 3/2011 | Arao | |
| 2011/0068393 A1 | 3/2011 | Cho et al. | |
| 2011/0133292 A1* | 6/2011 | Lee | H01L 21/823431 257/401 |
| 2011/0169066 A1 | 7/2011 | Moon et al. | |
| 2012/0012927 A1 | 1/2012 | Uchiyama | |
| 2012/0049255 A1 | 3/2012 | Ryu | |
| 2012/0112258 A1 | 5/2012 | Mine | |
| 2012/0119294 A1 | 5/2012 | Greene et al. | |
| 2012/0132968 A1 | 5/2012 | Choi | |
| 2012/0132971 A1 | 5/2012 | Mikasa | |
| 2012/0139028 A1 | 6/2012 | Park et al. | |
| 2012/0164812 A1 | 6/2012 | Ryu et al. | |
| 2012/0217559 A1 | 8/2012 | Kim et al. | |
| 2012/0261747 A1 | 10/2012 | Park et al. | |
| 2012/0273859 A1 | 11/2012 | Oyu et al. | |
| 2012/0286358 A1 | 11/2012 | Sammi | |
| 2012/0299073 A1 | 11/2012 | Mikasa | |
| 2012/0305999 A1 | 12/2012 | Okonogi | |
| 2013/0052786 A1 | 2/2013 | Lee et al. | |
| 2013/0181271 A1 | 7/2013 | Oyu et al. | |
| 2013/0214338 A1 | 8/2013 | Mikasa | |

FOREIGN PATENT DOCUMENTS

| | | |
|---|---|---|
| JP | 2007-081095 | 3/2007 |
| JP | 2008078381 | 4/2008 |
| JP | 2008166786 | 7/2008 |
| JP | 2011054629 | 3/2011 |
| KR | 100691018 | 3/2007 |
| KR | 1020100134230 | 12/2010 |

OTHER PUBLICATIONS

Notice of Allowance dated Nov. 14, 2013 in U.S. Appl. No. 13/736,381.
Office Action dated Apr. 11, 2013 in U.S. Appl. No. 13/485,335.
Office Action dated May 23, 2014 in U.S. Appl. No. 13/485,335.
Final Office Action dated Sep. 9, 2013 in U.S. Appl. No. 13/485,335.
Office Action dated Mar. 13, 2014 in U.S. Appl. No. 13/934,935.
Notice of Allowance and Fees Due in U.S. Appl. No. 13/736,381; Dated: Feb. 14, 2014.
U.S. Office Action dated Jul. 30, 2014; U.S. Appl. No. 13/934,935.

* cited by examiner

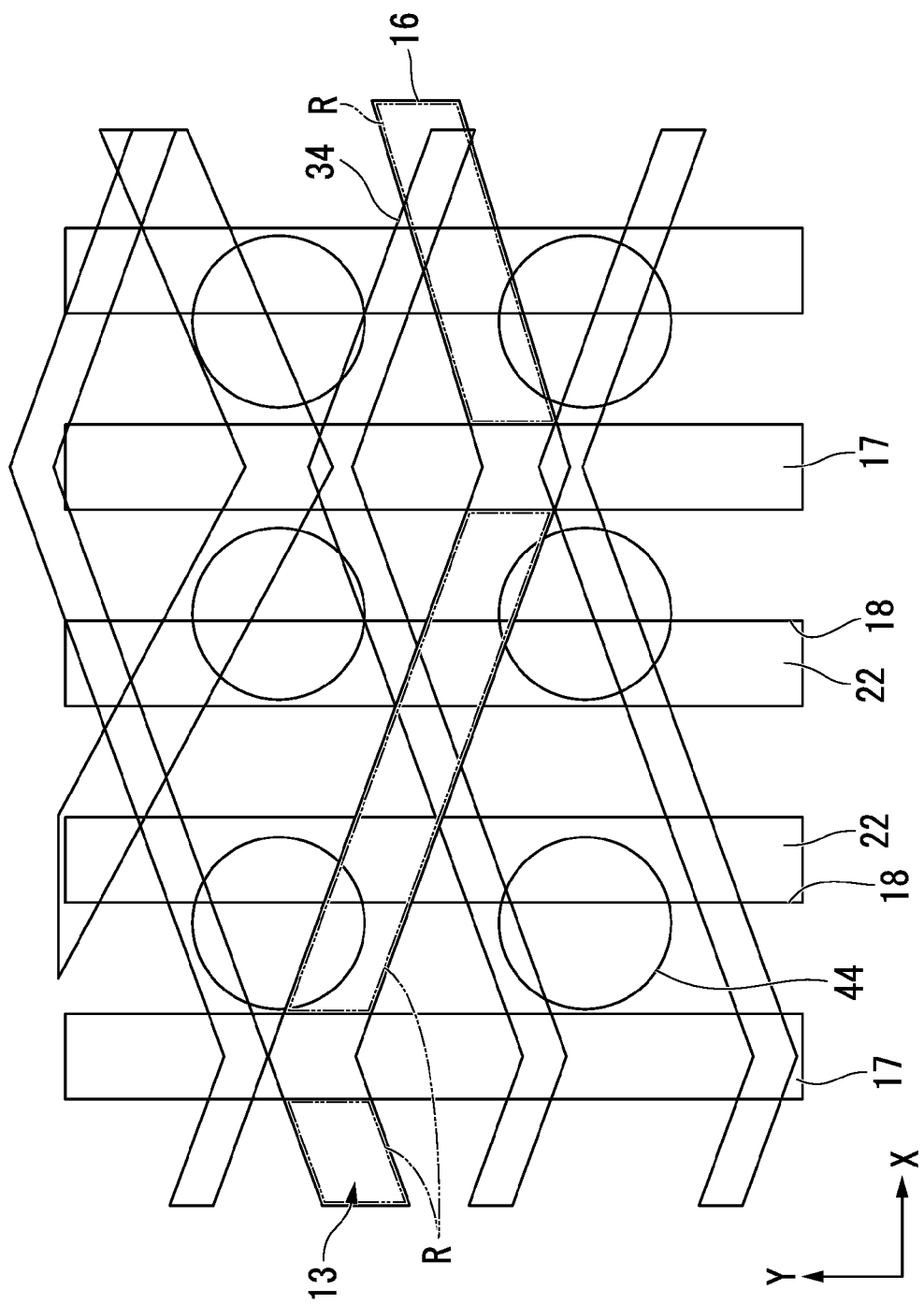

RELATED ART

SEMICONDUCTOR DEVICE AND METHOD OF FORMING THE SAME

This application is a continuation application of application Ser. No. 13/458,298 filed Apr. 27, 2012, which claims the priority of Japan Application No. 2011-102400 filed Apr. 28, 2011. The entire contents of each of the above-identified applications are hereby incorporated by reference.

BACKGROUND OF THE INVENTION

1. Field of the Invention

The present invention generally relates to a semiconductor device and a method of forming the same.

Priority is claimed on Japanese Patent Application No. 2011-102400, filed Apr. 28, 2011, the content of which is incorporated herein by reference.

2. Description of the Related Art

Recently, a size of a semiconductor device such as a dynamic random access memory (DRAM) has decreased. Thereby, when a transistor is configured to have a short gate length, a short channel effect of the transistor becomes remarkable, a sub-threshold current increases, and a threshold voltage (Vt) of the transistor decreases.

When an impurity concentration of a semiconductor substrate is increased to suppress the threshold voltage (Vt) of the transistor from decreasing, a junction leak current may increase.

For this reason, when the DRAM is used as the semiconductor device and a size of a memory cell of the DRAM is decreased, a refresh characteristic is severely deteriorated.

As a structure to resolve the above problems, a so-called trench gate type transistor (referred to as a "recess channel transistor") in which a gate electrode is buried in a groove formed on the side of a main surface of a semiconductor substrate is disclosed in Japanese Laid-Open Patent Publications Nos. 2006-339476 and 2007-081095. By configuring the transistor as the trench gate type transistor, an effective channel length (gate length) can be physically and sufficiently secured and a DRAM that has a fine cell in which a minimum processing dimension is 60 nm or less can be realized.

Japanese Laid-Open Patent Publication No. 2007-081095 discloses a DRAM that includes two grooves formed in a semiconductor substrate to be adjacent to each other, gate electrodes formed in the grooves through a gate insulating film, a first impurity diffusion region formed in a main surface of the semiconductor substrate positioned between the two gate electrodes as an impurity diffusion region common to the two gate electrodes, and a second impurity diffusion region formed in the main surface of the semiconductor substrate positioned at an element isolation region side of the two gate electrodes.

In the DRAM that has the trench gate type transistor described in Japanese Laid-Open Patent Publications Nos. 2006-339476 and 2007-081095, a channel region of the transistor is formed on three surfaces of both sides and a bottom surface of a trench.

The inventors have found that an on-state current of the transistor cannot be sufficiently secured and a normal operation of the DRAM becomes difficult when the size of the transistor having the above-described configuration is further decreased. This phenomenon is generated because the channel region of the transistor is formed on the three surfaces forming the trench and channel resistance increases, as described above.

If an arrangement pitch of the trench gate is narrowed, when a certain transistor is operated, an operation state of the transistor interferes with another transistor adjacent to the transistor and the transistor cannot be operated independently.

This phenomenon is generated because the channel region is formed between the adjacent trench gates.

In the trench gate type transistor, because the gate electrode is formed to protrude to an upper side of a surface of the semiconductor substrate, it becomes very difficult to form a bit line or a capacitor to be formed in the following process due to the protruding gate electrode and it becomes difficult to manufacture the DRAM.

Accordingly, there is a demand to provide a semiconductor device and a manufacturing method thereof that can sufficiently secure an on-state current of a transistor, prevent operation interference of adjacent transistors, and resolve manufacturing difficulty in the DRAM including the transistor using the trench.

SUMMARY

In one embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; and a second diffusion region in the semiconductor substrate. The second diffusion region covers a second side of the first gate groove. The second diffusion region has a bottom which is deeper than a top of the first fin structure.

In another embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; a second diffusion region in the semiconductor substrate, the second diffusion region covering a second side of the first gate groove; and a channel region extending. The channel region extends between the first and second diffusion regions through the surface of the fin structure and along the first side of the first gate groove, without the channel region extending along the second side of the first gate groove.

In still another embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; and a second diffusion region in the semiconductor substrate, the second diffusion region covering a second side of the first gate groove. The first gate groove has a bottom that has a depth from a surface of the semiconductor substrate in the range from 150 nm to 200 nm, and the first fin structure has a height in the range from 10 nm to 40 nm.

BRIEF DESCRIPTION OF THE DRAWINGS

The above features and advantages of the present invention will be more apparent from the following description of certain preferred embodiments taken in conjunction with the accompanying drawings, in which:

FIG. 17 is a fragmentary schematic plan view of another memory cell array of a semiconductor device in accordance with other embodiments of the invention;

DETAILED DESCRIPTION OF THE PREFERRED EMBODIMENTS

Before describing the present invention, the related art will be explained in detail with reference to FIGS. 21, and 22, in order to facilitate the understanding of the present invention.

The inventors have discovered the following new fact. If a size of a memory cell of a dynamic random access memory (DRAM) decreases, an interval between two adjacent cells that are provided in one active region decreases. As a result, when data "0" is stored in one cell and data "1" is stored in the other cell and access is continuously performed with respect to the cell storing the data "0," a disturbance failure between adjacent cells (hereinafter, simply referred to as a "disturbance failure") in which the data "1" stored in the cell is destroyed is generated. The disturbance failure lowers reliability of a semiconductor device.

Figure 21:
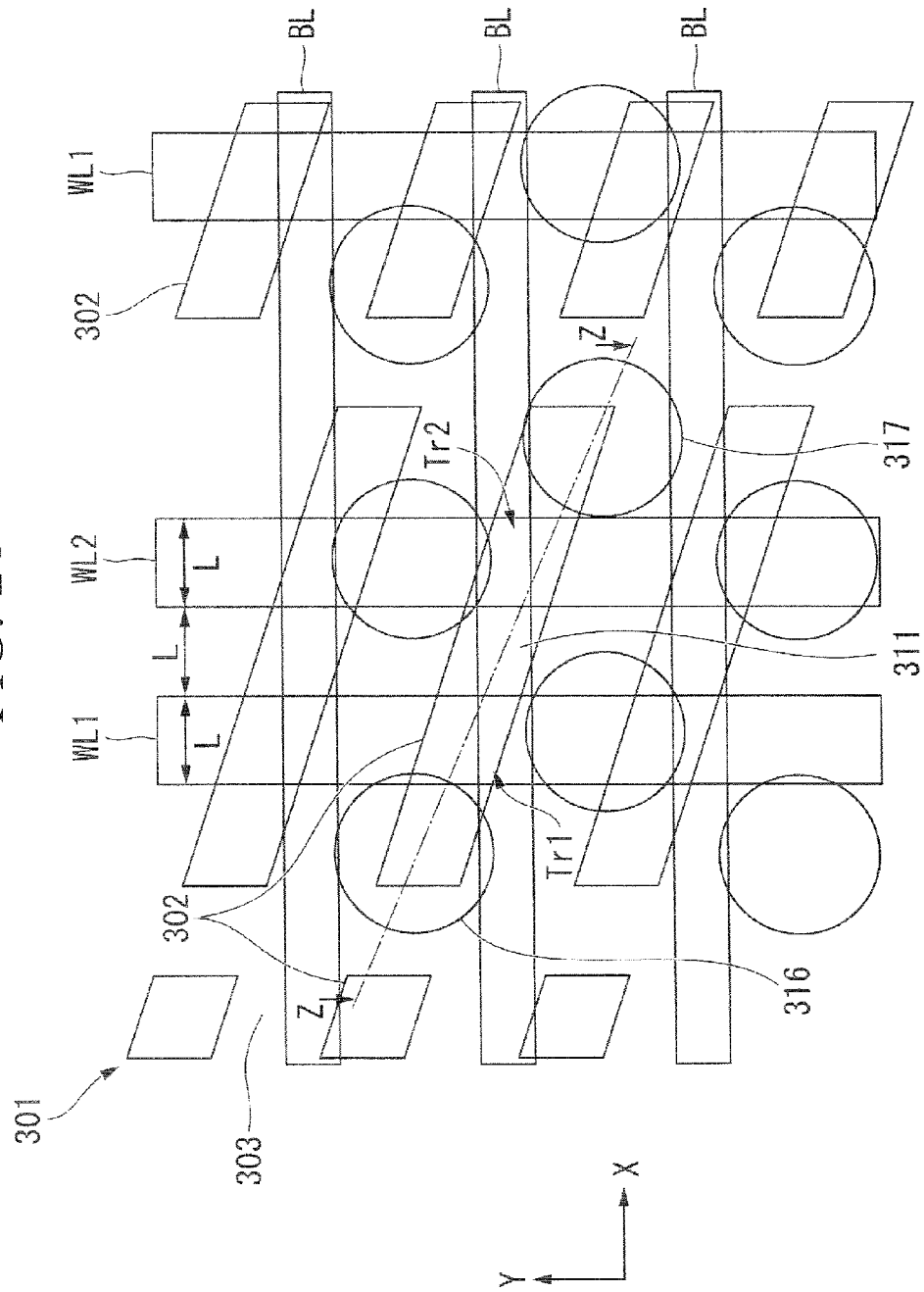
FIG. 21 is a fragmentary schematic plan view of a memory cell array of a semiconductor device in the related art.
Figure 22:
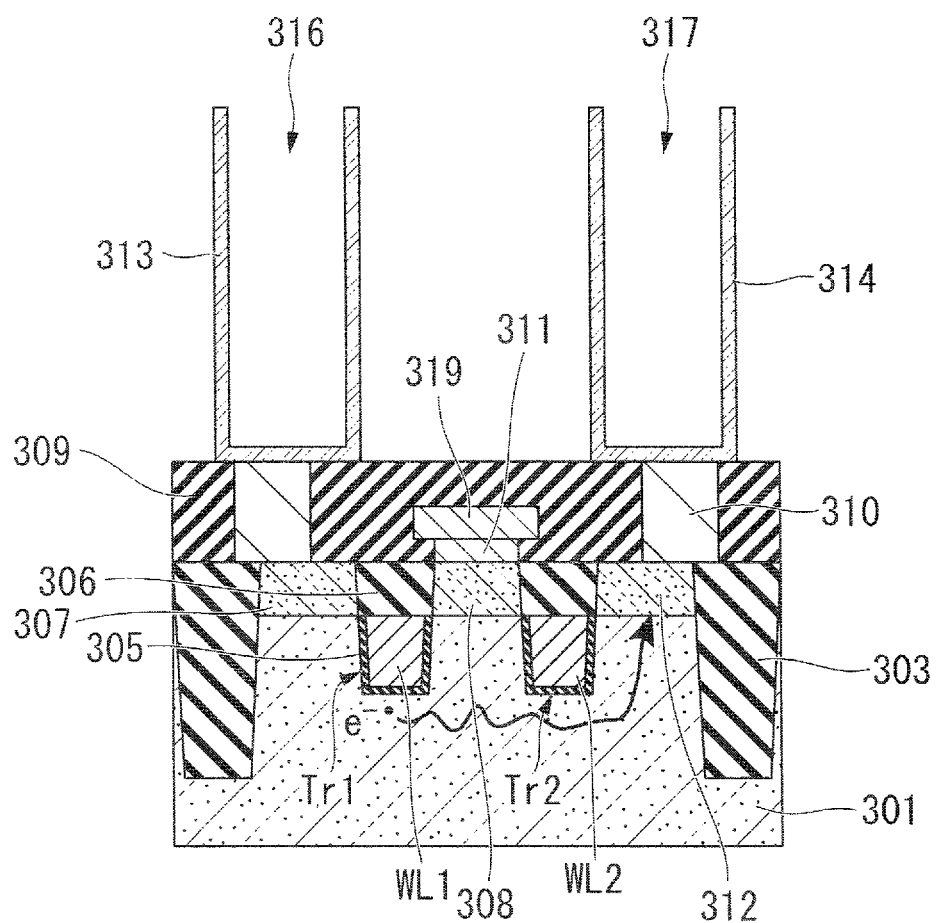
FIG. 22 is a fragmentary cross sectional elevation view of a memory cell array of the semiconductor device in the related art.

FIG. 21 is a plan view showing an example of a layout of a DRAM according to the related art and FIG. 22 is a cross-sectional view of the DRAM shown in FIG. 21 in a Z-Z direction.

Next, what the inventors discovered with respect to the disturbance failure described above will be described with reference to FIGS. 21 and 22.

Referring to FIG. 21, a plurality of active regions 302 are regularly arranged on a surface of a semiconductor substrate 301. Each active region 302 is surrounded by an element isolation region 303 that buries a groove formed in the surface of the semiconductor substrate 301 with an insulating film. In a Y direction that crosses the active region 302, a plurality of word lines WL that extend in the Y direction are arranged.

Referring to FIG. 22, word lines WL1 and WL2 are formed to be buried through a gate insulating film 305 in grooves provided over the plurality of active regions 302 and the element isolation region 303 in the surface of the semiconductor substrate 301.

On top surfaces of the word lines WL1 and WL2, cap insulating films 306 are formed to be buried in the grooves. In one active region 302, two word lines, that is, the word lines WL1 and WL2, are provided to cross the active region 302.

The two word lines WL1 and WL2 form gate electrodes of two transistors Tr1 and Tr2 that correspond to the word lines. The transistor Tr1 includes the gate electrode formed of the word line WL1, a drain diffusion layer 307, and a source diffusion layer 308.

The transistor Tr2 includes the gate electrode formed of the word line WL2, a drain diffusion layer 312, and the source diffusion layer 308. The source diffusion layer 308 is common to the transistors Tr1 and Tr2 and is connected to a bit line BL in a bit line contact 311.

Meanwhile, the drain diffusion layers 307 and 312 are connected to lower electrodes 313 and 314 (storage nodes) through a capacitor contact plug 310 formed in an interlayer insulating film 309.

The lower electrodes 313 and 314 form capacitive elements 316 and 317 with capacitor insulating films and upper electrodes (not shown in the drawings), respectively. The surface of the semiconductor substrate 301 that corresponds to bottom surfaces of the grooves in which the word lines WL1 and WL2 are buried and two facing sides becomes channels of the transistors Tr1 and Tr2.

For example, if a state of the word line WL1 is set to an on state, a channel of the transistor Tr1 is formed, and potential of a low (L) level is applied to a bit line 319, a state of the lower electrode 313 becomes an "L" state. Then, if the state of the word line WL1 is set to an off state, information of L (data "0") is stored in the lower electrode 313.

For example, if a state of the word line WL2 is set to an on state, a channel of the transistor Tr2 is formed, and potential of a high (H) level is applied to the bit line 319, a state of the lower electrode 314 becomes an "H" state. Then, if the state of the word line WL2 is set to an off state, information of H (data "1") is stored in the lower electrode 314.

On the basis of the operation state, "L" is stored in the lower electrode 313 and "H" is stored in the lower electrode 314. In this state, on/off of the word line WL1 that corresponds to the L-side lower electrode 313 is repeated (which corresponds to a cell operation of another active region using the same word line WL1).

As a result, electrons "e$^-$" that are induced in the channel of the transistor Tr1 may reach the adjacent drain diffusion layer 312, destroy the "H" information stored in the lower electrode 314, and change the state of the lower electrode 314 to the "L" state.

That is, a failure of a mode in which the data "1" changes the data "0" is generated. The failure depends on the number of times of on/off of the word line WL1. For example, if the number of times of on/off is 10,000 times, one of the plurality of cells is destroyed and if the number of times of on/off is 100,000 times, ten cells are destroyed.

Each of the adjacent cells originally needs to hold information independently. However, if the disturbance failure in which an operation state of one adjacent cell changes a storage state of another adjacent cell is generated, a normal operation of the semiconductor device (DRAM) is disturbed and reliability is lowered.

The disturbance failure is not generated when a cell size is large, that is, when an interval L between the word lines WL1 and WL2 defined with a minimum processing dimension F is 70 nm as shown in FIG. 21.

However, if the memory cell is reduced and the interval between the word lines WL1 and WL2 is less than 50 nm, the disturbance failure becomes remarkable. If the interval further decreases, the disturbance failure becomes further remarkable.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; and a second diffusion region in the semiconductor substrate. The second diffusion region covers a second side of the first gate groove. The second diffusion region has a bottom which is deeper than a top of the first fin structure.

In some cases, the bottom of the second diffusion region is shallower than a bottom of the first fin structure.

In some cases, the first gate groove has a bottom that has a depth from a surface of the semiconductor substrate in the range from 150 nm to 200 nm, and the first fin structure has a height in the range from 10 nm to 40 nm.

In some cases, the semiconductor device may further include, but is not limited to, a first gate insulating film that covers the first gate groove and a surface of the first fin structure; and a first gate electrode on the first gate insulating film in a lower portion of the first gate groove. The first gate electrode extends over the first fin structure.

In some cases, the semiconductor substrate has a second gate groove having a first groove that is covered by the second diffusion region.

In some cases, the semiconductor device may further include, but is not limited to, a second fin structure underneath the second gate groove; and a third diffusion region in the semiconductor substrate. The third diffusion region covers an upper portion of a first side of the second gate groove. The second diffusion region has a bottom which is deeper than a top of the second fin structure and shallower than a bottom of the second fin structure.

In some cases, the second gate groove has a bottom that has a depth from a surface of the semiconductor substrate in the range from 150 nm to 200 nm, and the second fin structure has a height in the range from 10 nm to 40 nm.

In some cases, the semiconductor device may further include, but is not limited to, a second gate insulating film that covers the second gate groove and a surface of the second fin structure; and a second gate electrode on the second gate insulating film in a lower portion of the second gate groove. The second gate electrode extends over the second fin structure.

In some cases, the first diffusion region has a bottom that which is shallower by a range of 5 nm to 10 nm than a top surface of the gate electrode.

In some cases, the first fin structure has a top ridge and first and second side surfaces opposing to each other. The top ridge extends between the first and second sides of the first gate groove. The first and second side surfaces extend in parallel to a first direction in which the top ridge extends.

In some cases, the semiconductor device may further include, but is not limited to, a plurality of first isolation regions in the semiconductor device. The plurality of first isolation regions defines active regions. The plurality of first isolation regions extend in the first direction. The gate groove extends in a second direction and across the active region and the first isolation region.

In some cases, the semiconductor device may further include, but is not limited to, a plurality of second isolation regions extending in a second direction and in the semiconductor device. The plurality of second isolation regions defines device regions in each of the active regions.

In some cases, the semiconductor device may further include, but is not limited to, a bit line electrically coupled to the second diffusion region. The bit line extends across the gate groove.

In some cases, the semiconductor device may further include, but is not limited to, a capacitor electrically coupled to the first diffusion region.

In some cases, the semiconductor device may further include, but is not limited to, a channel region extending between the first and second diffusion regions through the surface of the fin structure and along the first side of the first gate groove, without the channel region extending along the second side of the first gate groove.

In some cases, the semiconductor device may further include, but is not limited to, a channel region extending from a bottom of the first diffusion region and along the first side of the first gate groove. The channel region further extends along the bottom of the first gate groove. The channel region further extends from the second diffusion region and along the second side of the first gate groove.

In some cases, the first gate insulating film has an equivalent oxide thickness in the range of 4 nm to 6 nm, and the gate electrode has a work function in the range from 4.6 eV to 4.8 eV, and the first gate electrode has a threshold voltage in the range from 0.8 V to 1.0 V.

In another embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; a second diffusion region in the semiconductor substrate, the second diffusion region covering a second side of the first gate groove; and a channel region extending. The channel region extends between the first and second diffusion regions through the surface of the fin structure and along the first side of the first gate groove, without the channel region extending along the second side of the first gate groove.

In some cases, the first gate groove has a bottom that has a depth from a surface of the semiconductor substrate in the range from 150 nm to 200 nm, and the first fin structure has a height in the range from 10 nm to 40 nm.

In still another embodiment, a semiconductor device may include, but is not limited to, a semiconductor substrate having a first gate groove; a first fin structure underneath the first gate groove; a first diffusion region in the semiconductor substrate, the first diffusion region covering an upper portion of a first side of the first gate groove; and a second diffusion region in the semiconductor substrate, the second diffusion region covering a second side of the first gate groove. The first gate groove has a bottom that has a depth from a surface of the semiconductor substrate in the range from 150 nm to 200 nm, and the first fin structure has a height in the range from 10 nm to 40 nm.

In the semiconductor device according to the present invention, a first impurity diffusion region that covers an upper portion of a gate insulating film arranged on a first side and a second impurity diffusion region that covers the gate insulating film arranged on at least a second side are provided in the semiconductor substrate and a fin portion that is formed such that a part of an active region protrudes from a bottom portion of a gate electrode groove is provided. As a result, because a channel region is formed on two surfaces of the bottom portion of the gate electrode groove and a lower portion of the first side and the fin portion, the channel resistance can be decreased as compared with the semiconductor device according to the related art in which the channel region is formed on three surfaces of the bottom surface and the facing sides of the gate electrode groove. Thereby, the on-state current of the transistor can be sufficiently secured.

The gate electrode groove is provided in the second side of the gate electrode groove and another transistor is arranged on the gate electrode groove to be adjacent thereto. As a result, the channel region is not formed between the gate electrode grooves. Thereby, when the arrangement pitch of the gate electrode grooves is narrowed, even when a certain transistor is operated, the operation state thereof does not interfere with another transistor adjacent to the certain transistor. Therefore, each transistor can be operated independently.

The gate electrode that is arranged to bury a lower portion of the gate electrode groove and step over the fin portion through the gate insulating film and the buried insulating film that is arranged to bury the gate electrode groove and covers the top surface of the gate electrode are provided and the gate electrode can be prevented from protruding to the upper side of the surface of the semiconductor substrate. Thereby, when the DRAM is used as the semiconductor device, the bit line or the capacitor that is formed in the following process can be easily formed. Therefore, the semiconductor device can be easily manufactured.

EMBODIMENTS

Semiconductor Device

Figure 1:
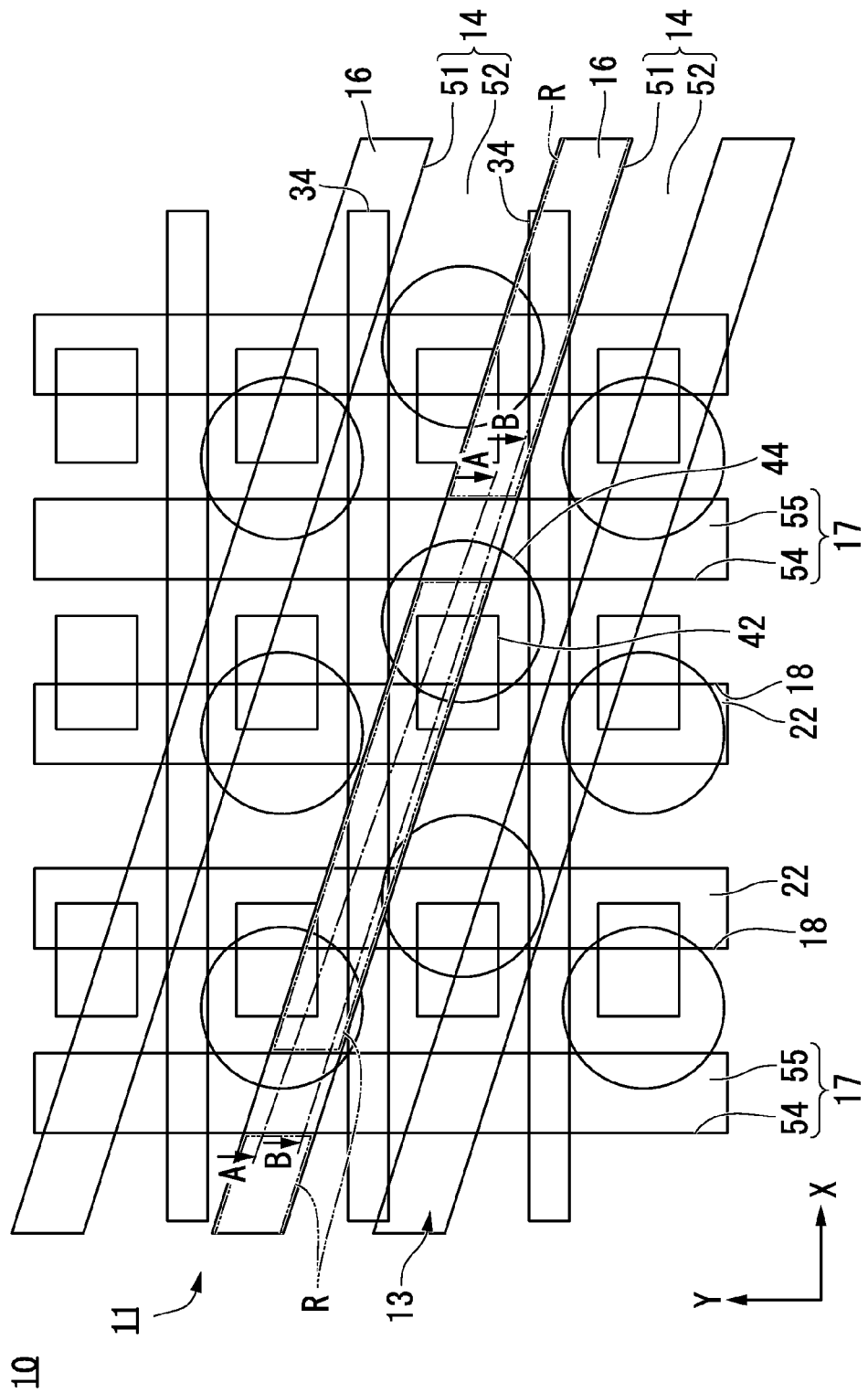
FIG. 1 is a fragmentary schematic plan view of a memory cell array of a semiconductor device in accordance with one or more embodiments of the invention.
Figure 2A:
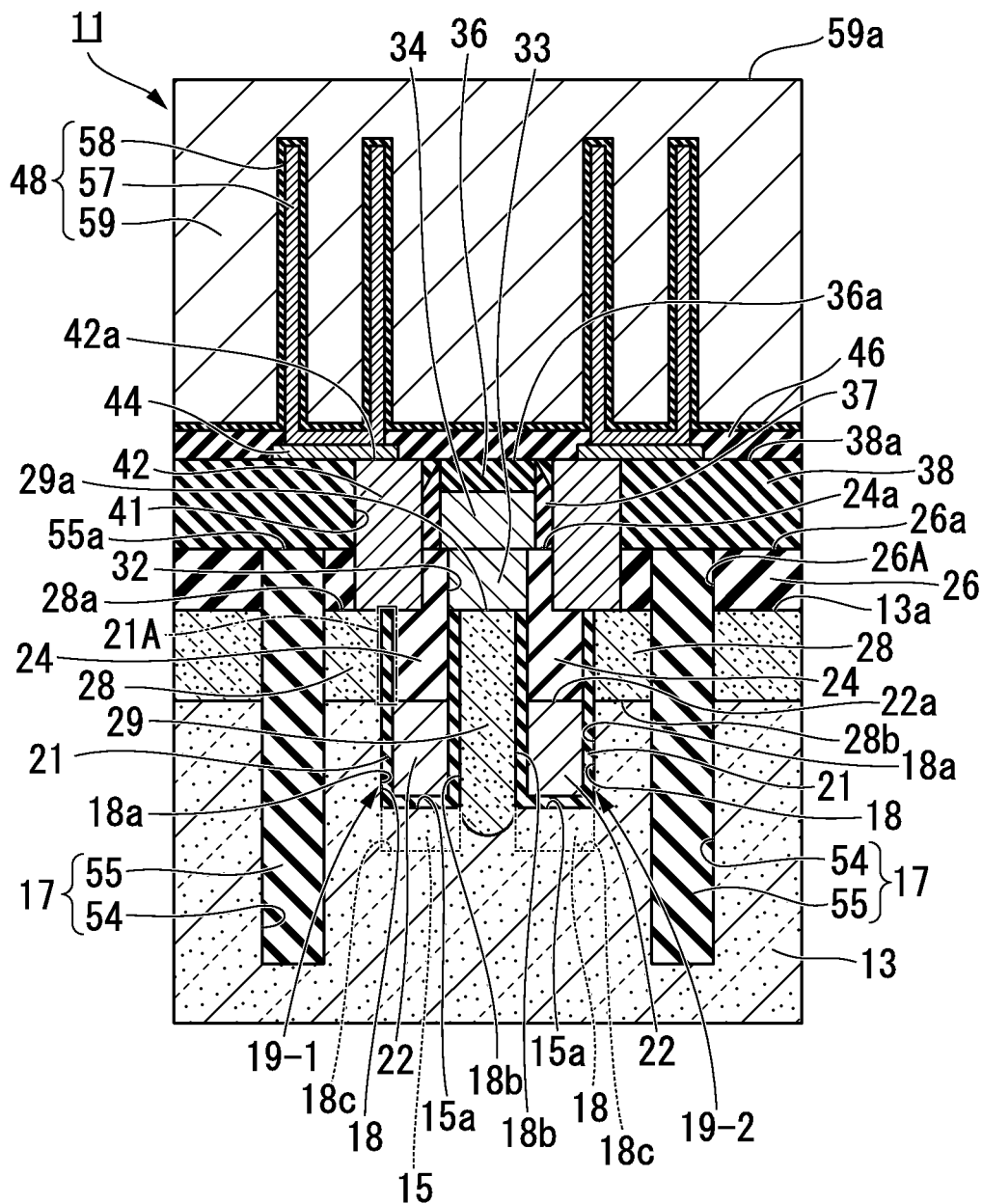
FIG. 2A is a fragmentary cross sectional elevation view of the memory cell array, taken along an A-A line of FIG. 1.
Figure 2B:
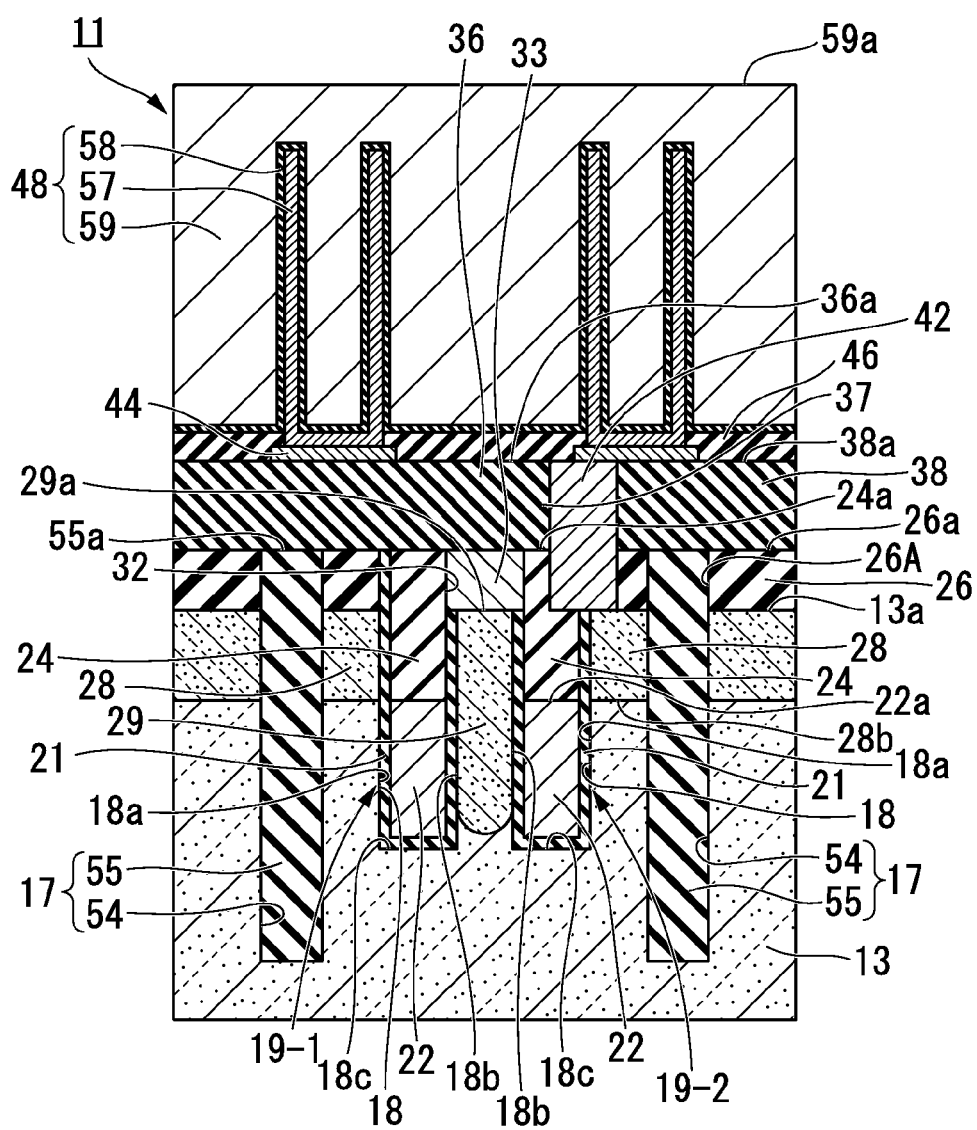
FIG. 2B is a fragmentary cross sectional elevation view of the memory cell array, taken along a B-B line of FIG. 1.
Figure 2C:
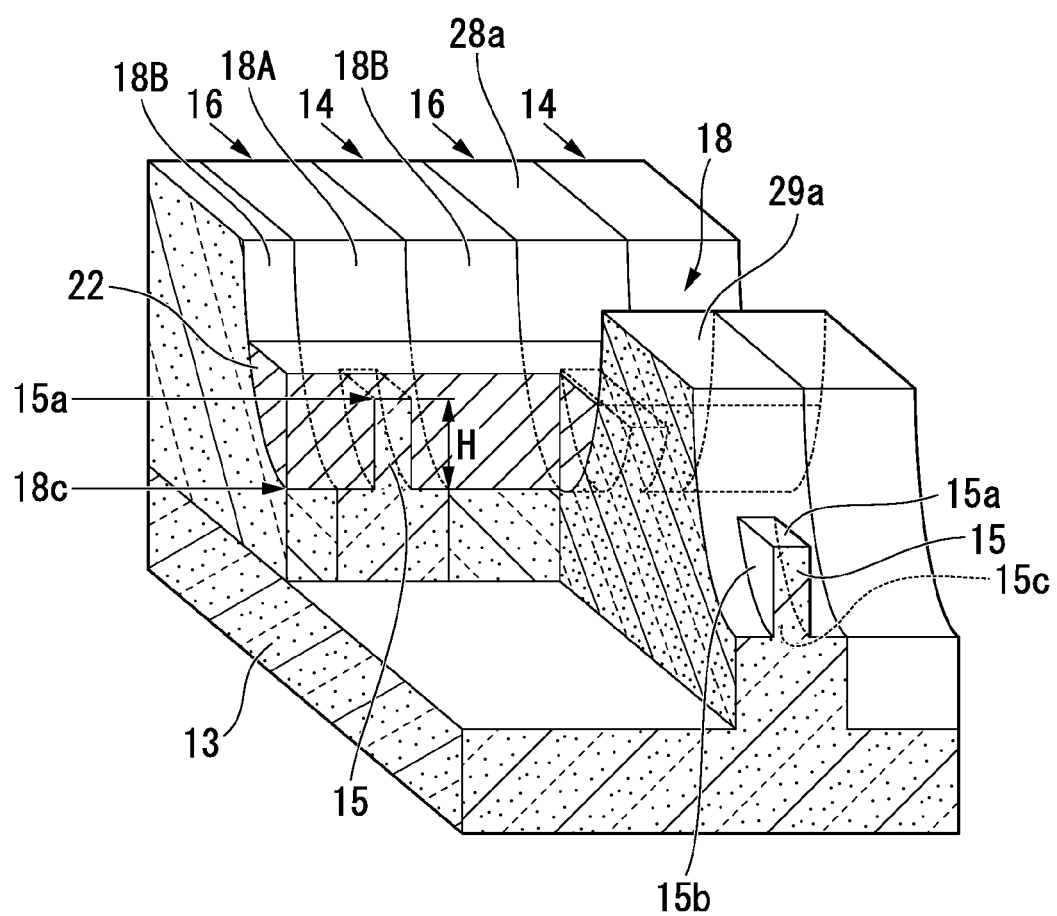
FIG. 2C is a fragmentary perspective view of the semiconductor device including a fin structure of FIGS. 1, 2A and 2B.

FIG. 1 is a schematic plan view of a memory cell array that is provided in the semiconductor device according to the embodiment of the present invention. FIG. 2A is a cross-sectional view of the memory cell array shown in FIG. 1 in an A-A direction. FIG. 2B is a cross-sectional view of the memory cell array shown in FIG. 1 in a B-B direction. FIG. 2C is a perspective view showing a cross-sectional structure of a fin portion that is provided in a gate electrode groove in the semiconductor device according to this embodiment.

In FIGS. 1, 2A, and 2B, a dynamic random access memory (DRAM) is shown as an example of a semiconductor device 10 according to the embodiment of the present invention. FIG. 1 shows an example of a layout of a memory cell array of the DRAM.

In FIG. 1, an X direction shows an extension direction of a bit line 34 and a Y direction shows an extension direction (second direction) of a gate electrode 22 and a second element isolation region 17 crossing an X direction.

In FIG. 1, only a semiconductor substrate 13, a first element isolation region 14, an active region 16, the second element isolation region 17, a gate electrode groove 18, the gate electrode 22, the bit line 34, a capacitor contact plug 42, a capacitor contact pad 44, and a plurality of element formation regions R among components of a memory cell array 11 are shown and the other components of the memory cell array 11 are not shown, to simplify the description.

FIG. 2A schematically shows the bit line 34 that extends in the X direction shown in FIG. 1. In FIGS. 2A to 2C, the same components as those of the semiconductor device 10 shown in FIG. 1 are denoted by the same reference numerals.

The semiconductor device 10 according to the embodiment of the present invention has a memory cell region that is provided with the memory cell array 11 shown in FIGS. 1, 2A, and 2B and a peripheral circuit region (formation region of a peripheral circuit) (not shown in the drawings) that is arranged around a memory cell region.

As shown in FIGS. 1, 2A, and 2B, the memory cell array 11 that is provided in the semiconductor device 10 includes the semiconductor substrate 13, the first element isolation region 14, the active region 16 having the plurality of element formation regions R, the second element isolation region 17, the gate electrode groove 18, a fin portion 15 that is formed such that a part of the active region 16 protrudes from a bottom portion 18c of the gate electrode groove 18, first and second transistors 19-1 and 19-2, a gate insulating film 21, the gate electrode 22 that is a buried type gate electrode, a buried insulating film 24, a mask insulating film 26, a first impurity diffusion region 28, a second impurity diffusion region 29, an opening 32, a bit line contact plug 33, a bit line 34, a cap insulating film 36, a sidewall film 37, an interlayer insulating film 38, a contact hole 41, a capacitor contact plug 42, a capacitor contact pad 44, a silicon nitride film 46, and a capacitor 48.

As shown in FIGS. 1, 2A, and 2B, the semiconductor substrate 13 is a substrate that is formed in a plate shape.

As the semiconductor substrate 13, a p-type single crystalline silicon substrate may be used. In this case, a p-type impurity concentration of the semiconductor substrate 13 may be set to 1E16 atoms/cm$^2$.

As shown in FIG. 1, the first element isolation region 14 has a first element isolation groove 51 and a first element isolation insulating film 52. The first element isolation grooves 51 are formed in the semiconductor substrate 13 to extend in a direction (first direction) inclined with respect to the X direction shown in FIG. 1 by a predetermined angle. The first element isolation grooves 51 are formed at a predetermined interval with respect to the Y direction shown in FIG. 1. The depth of the first element isolation groove 51 may be set to 250 nm.

The first element isolation insulating films 52 are arranged to bury the first element isolation grooves 51. Although not shown in the drawings, a top surface of the first element isolation insulating film 52 is flush with a main surface 13a of the semiconductor substrate 13. As the first element isolation insulating film 52, a silicon oxide film ($SiO_2$ film) may be used.

The first element isolation region 14 that has the above-described configuration partitions the active region 16 that extends in a stripe shape with respect to the second direction.

As shown in FIGS. 1, 2A, and 2B, the second element isolation region 17 has a second element isolation groove 54 and a second element isolation insulating film 55. The second element isolation groove 54 is formed in the semiconductor substrate 13 to extend in the Y direction (second direction) shown in FIG. 1. Thereby, the second element isolation groove 54 cuts a part of the first element isolation region 14. The second element isolation groove 54 is formed to sandwich the two gate electrodes 22 arranged to be adjacent to the second element isolation groove.

Each of the gate electrodes 22 forms a word line of the memory cell. That is, the memory cell according to this embodiment is configured such that one second element isolation region 17 and the two gate electrodes 22 (word lines) extending in the Y direction form a pair and are repetitively arranged in the X direction.

The depth of the second element isolation groove 54 may be set to 250 nm.

The second element isolation insulating film 55 is arranged to bury the second element isolation groove 54 and an opening 26A formed in the mask insulating film 26. A top surface 55a of the second element isolation insulating film 55 is flush with a top surface 26a of the mask insulating film 26. As the second element isolation insulating film 55, a silicon oxide film ($SiO_2$ film) may be used.

The second element isolation region 17 that has the above-described configuration partitions the plurality of element formation regions R with respect to the second direction.

As such, the first element isolation region 14 that is formed by burying the first element isolation insulating film 52 in the first element isolation groove 51 formed in the semiconductor substrate 13 and the second element isolation region 17 that is formed by burying the second element isolation insulating film 55 in the second element isolation groove 54 in the semiconductor substrate 13 are provided and the active region 16 is partitioned into the plurality of element formation regions R. As a result, as compared with the case in which a dummy gate electrode (not shown in the drawings) to which negative potential is applied is provided in the second element isolation groove 54 through the gate insulating film 21 and the plurality of element formation regions R are partitioned, the potential of the dummy gate electrode does not exert a bad influence upon the first and second transistors 19-1 and 19-2. Therefore, the first and second transistors 19-1 and 19-2 may be easily turned on and a retention characteristic of the data of the memory cell array 11 may be improved.

As shown in FIGS. 1, 2A, and 2B, the two (pair of) gate electrode grooves 18 are provided in the semiconductor substrate 13 positioned between the two second element isolation regions 17 to extend in the Y direction. The gate electrode groove 18 is partitioned by an inner surface including the first and second sides 18a and 18b facing each other and the bottom portion 18c. The pair of gate electrode grooves 18 are arranged such that the second sides 18b face each other.

As shown in FIGS. 2B and 2C, the gate electrode groove 18 is configured such that the depth of the bottom portion 18c thereof is less than the depths of the first and second element isolation grooves 51 and 54 (depths of the first and second element isolation regions 14 and 17). When the depths of the first and second element isolation grooves 51 and 54 are 250 nm, the depth of the gate electrode groove 18 is preferably set to 150 to 200 nm.

As shown in FIGS. 1 and 2C, the gate electrode groove 18 extends to transverse the first element isolation region 14 and the active region 16. That is, the gate electrode groove 18 is configured such that the first groove portion 18A formed in the active region 16 is continuous to the second groove portion 18B formed in the first element isolation region 14.

As shown in FIGS. 2B and 2C, the bottom portion of the second groove portion 18B of the gate electrode groove 18 that is formed in the first element isolation region 14 becomes the bottom portion 18c of the gate electrode groove 18.

As shown in FIGS. 2A and 2C, the bottom portion of the first groove portion 18A of the gate electrode groove 18 that is formed in the active region 16 is configured such that the depth of an end facing the second groove portion 18B is equal to the depth of the bottom portion of the second groove portion. Meanwhile, in a center portion of the first groove portion 18A, the fin portion 15 is formed such that a part of the active region 16 protrudes from the bottom portion.

As shown in FIGS. 2A to 2C, the fin portion 15 has an upper portion 15a and a pair of facing sides 15b and 15c.

The upper portion 15a extends in an extension direction (first direction) of the active region 16. Both ends of the upper portion 15a in the extension direction are provided over the first side 18a and the second side 18b forming the gate electrode groove 18 in the first groove portion 18A.

The pair of sides 15b and 15c are arranged to be parallel to the extension direction (first direction) of the active region 16.

As a shape of the fin portion 15, a corner may have an acute angle and may be round (may not have the acute angle), as shown in FIG. 2C.

In this embodiment, the height of the fin portion 15 means the height from a lowest portion of the bottom portion 18c of the gate electrode groove 18 to a portion contacting the upper portion 15a extending in a vertical direction, as shown by H in FIG. 2C.

The height H of the fin portion 15 is preferably in a range of 10 to 40 nm when the depth of the gate electrode groove 18 is 150 to 220 nm. In other words, the upper portion 15a of the fin portion 15 is preferably positioned at the depth of 100 nm or more from the surface of the semiconductor substrate 13.

When the height H of the fin portion 15 is less than 10 nm, this is not preferable because a subthreshold factor (S factor) increases and an OFF leak current increases. This is not preferable because a current driving capability is lowered and a writing characteristic is deteriorated. Meanwhile, if the height H of the fin portion 15 is more than 40 nm, this is not preferable because the disturbance failure is not sufficiently suppressed.

Figure 18:
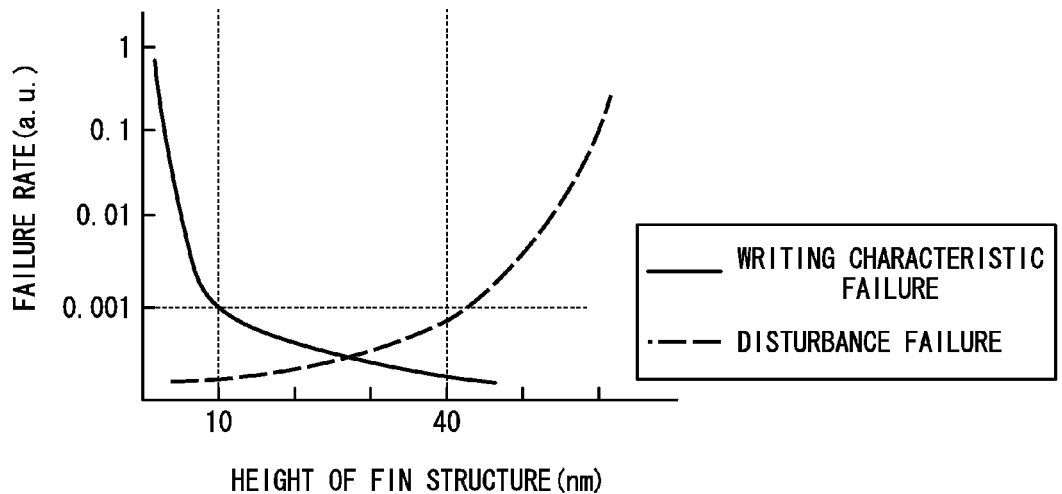
FIG. 18 is a diagram illustrating variation of failure rate over height of fin structure.

Meanwhile, if the height H of the fin portion 15 is within this range, the OFF leak current may be suppressed from increasing and the writing characteristic may be improved, while the disturbance failure is sufficiently suppressed. That is, all of the characteristics that are in a trade-off relation with the height of the fin portion may be satisfied (refer to FIG. 18).

Referring to FIGS. 2A to 2C, each of the first and second transistors 19-1 and 19-2 is a trench gate type transistor and has the gate insulating film 21, the gate electrode 22 that is a saddle fin type buried word line, the buried insulating film 24, the first impurity diffusion region 28, and the second impurity diffusion region 29.

As shown in FIGS. 2A and 2B, the first and second transistors 19-1 and 19-2 are arranged to be adjacent to each other. The second impurity diffusion region 29 functions as an impurity diffusion region (drain region in the case of the structure shown in FIGS. 2A and 2B) that is common to the first and second transistors 19-1 and 19-2.

That is, the second side 18b of the gate electrode groove 18 that forms the first transistor 19-1 and the second side 18b of the gate electrode groove 18 that forms the second transistor 19-2 are configured to face each other through the second impurity diffusion region 29.

Referring to FIGS. 2A to 2C, the gate insulating film 21 is provided to cover the first and second sides 18a and 18b of the gate electrode groove 18 and the bottom portion 18c of the gate electrode groove 18. The gate insulating film 21 is provided to cover the surface (that is, the upper portion 15a and the pair of facing sides 15b and 15c) of the fin portion 15 provided in the bottom portion 18c of the gate electrode groove 18.

As the gate insulating film 21, a silicon oxide film ($SiO_2$ film) of a single layer, a silicon oxynitride film (SiON film), a stacked silicon oxide film ($SiO_2$ film), and a stacked film obtained by stacking a silicon nitride film (SiN film) on a silicon oxide film ($SiO_2$ film) may be used.

When the silicon oxide film ($SiO_2$ film) of the single layer is used as the gate insulating film 21, the thickness of the gate insulating film 21 may be set to 6 nm.

Referring to FIGS. 2A to 2C, the gate electrode 22 adopts the saddle fin type buried word line to decrease the OFF leak current and improve the writing characteristic. Because the S factor may be decreased by adopting the saddle fin type, a threshold voltage may be decreased while the OFF leak current is maintained. Because the current driving capability may be improved by adopting the saddle fin type, the writing characteristic may be improved.

The gate electrode 22 is arranged to bury a lower portion of the gate insulating groove 18 through the gate insulating film 21. Thereby, the gate electrode 22 is provided to step over the fin portion 15 through the gate insulating film 21. The top surface 22a of the gate electrode 22 is arranged at a position lower than the main surface 13a of the semiconductor substrate 13. The gate electrode 22 may have a stacked structure in which a titanium nitride film and a tungsten film are sequentially stacked.

In the semiconductor device according to this embodiment, the threshold voltages of the first and second transistors 19-1 and 19-2 may be appropriately adjusted by adjusting the thickness of the gate insulating film 21 and a work function of the gate electrode 22. In the saddle fin type cell transistor, the threshold voltage is preferably set in a range of 0.5 to 1.0 V. In this case, if the threshold voltage is less than 0.5 V, the off leak current increases and the information retention characteristic is deteriorated.

Meanwhile, if the threshold voltage is more than 1.0 V, this is not preferable because the current driving capability is lowered, writing of information becomes insufficient, and the information retention characteristic is deteriorated.

Specifically, if the equivalent oxide thickness of the gate insulating film 21 is set within a range of 4 to 6 nm and the work function of the gate electrode 22 is set within a range of 4.6 to 4.8 eV, the threshold voltage of one of or both the first and second transistors 19-1 and 19-2 may be set to 0.8 to 1.0 V.

Referring to FIGS. 2A and 2B, the buried insulating film 24 is arranged to bury the gate electrode groove 18 provided with the gate insulating film 21, to cover the top surface 22a of the gate electrode 22.

The upper portion of the buried insulating film 24 protrudes more than the main surface 13a of the semiconductor substrate 13 and the top surface 24a of the protruding portion is flush with the top surface 26a of the mask insulating film 26. As the buried insulating film 24, a silicon oxide film ($SiO_2$ film) may be used.

Referring to FIGS. 2A and 2B, the mask insulating film 26 is provided on the top surface 28a of the first impurity diffusion region 28. The mask insulating film 26 has an opening 26A having a groove shape that is formed on the second element isolation groove 54. The mask insulating film 26 functions as an etching mask when the second element isolation groove 54 is formed in the semiconductor substrate 13 by anisotropic etching. As the mask insulating film 26, a silicon nitride film may be used. In this case, the thickness of the mask insulating film 26 may be set to 50 nm.

Referring to FIGS. 2A and 2B, the first impurity diffusion region 28 is provided in the semiconductor substrate 13 positioned at the side of the first side 18a, to cover the upper portion 21A of the gate insulating film 21 formed in the first side 18a of the gate electrode groove 18.

That is, the first side 18a of the gate electrode groove 18 that forms the first transistor 19-1 and the first side 18a of the gate electrode groove 18 that forms the second transistor 19-2 are configured to face the sides of the second element isolation grooves 54 through the semiconductor substrate 13, respectively.

Therefore, the first impurity diffusion region 28 is provided to include the top surface 13a of the semiconductor substrate 13 interposed between the first side 18a and the second element isolation groove 54 and cover the upper portion 21A of the gate insulating film 21 formed on the first side 18a.

The bottom surface 28b of the first impurity diffusion region 28 is arranged at a position higher than the top surface 22a of the gate electrode 22 buried in the gate electrode groove 18 (position of the side of the top surface 13a of the semiconductor substrate 13). The distance between a horizontal line including the bottom surface 28b of the first impurity diffusion region 28 and a horizontal line including the top surface 22a of the buried gate electrode 22 is preferably in a range of 5 to 10 nm. If the distance is less than 5 nm, the current driving capacity may be lowered and the writing characteristic may be deteriorated. Meanwhile, if the distance is more than 10 nm, the junction electric field may increase and the information retention characteristic may be deteriorated.

The first impurity diffusion region 28 is provided with respect to each of the gate electrodes 22 forming the first and second transistors 19-1 and 19-2.

The first impurity diffusion region 28 is an impurity diffusion region that functions as a source/drain region (source region in the case of the structure shown in FIGS. 2A and 2B) of each of the first and second transistors 19-1 and 19-2. When the semiconductor substrate 13 is a p-type silicon substrate, the first impurity diffusion region 28 is formed by ion-implanting n-type impurities into the semiconductor substrate 13.

Referring to FIGS. 2A and 2B, the second impurity diffusion region 29 is provided in a portion of the semiconductor substrate 13 that is arranged between the two gate electrode grooves 18. Specifically, the second impurity diffusion region 29 is provided such that the depth thereof is less than the depth of the bottom portion 18c of the gate electrode groove 18 and is more than the depth of the top portion of the fin portion 15 (portion of the top surface 15a closest to the surface 13a of the semiconductor substrate 13). That is, the bottom portion of the second impurity diffusion region 29 is positioned between the top portion of the top surface 15a of the fin portion 15 and the bottom portion 18c of the gate electrode groove 18. In other words, with respect to the junction position between the second impurity diffusion region 29 (for example, n-type diffusion region) and the semiconductor substrate 13 (for example, p-type channel), the lower limit of the depth is set as the position of the top portion of the fin portion 15 and the upper limit of the depth is set as the position of the bottom portion 18c of the gate electrode groove 18. Thereby, the second impurity diffusion region 29 is arranged to cover all of the portions other than a lower end of the gate insulating film 21 provided in the second side 18b of each of the two gate electrode grooves 18.

Figure 19:
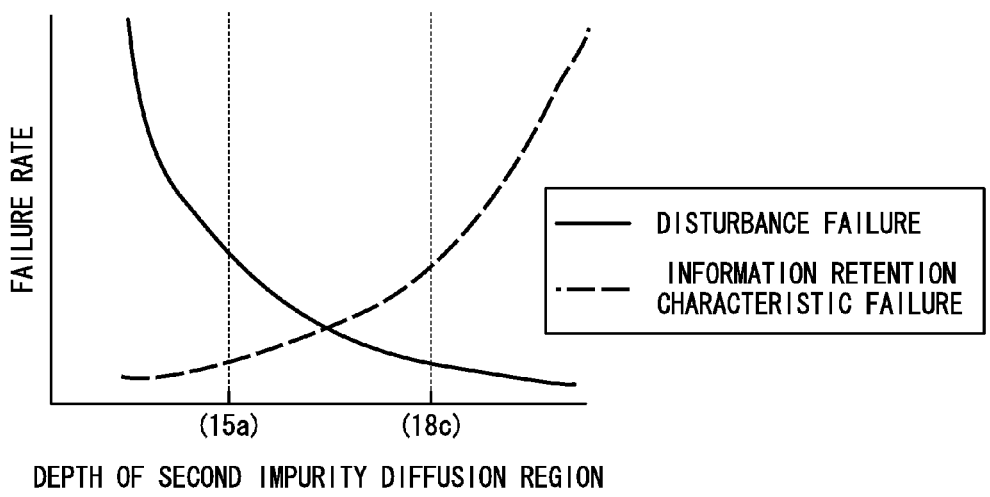
FIG. 19 is a diagram illustrating variation of failure rate over depth of second impurity diffusion region.

In this case, if the depth of the second impurity diffusion region 29 is less than the depth of the top portion of the fin portion 15, the disturbance failure becomes remarkable. Meanwhile, if the depth of the second impurity diffusion region 29 is more than the depth of the bottom portion 18c of the gate electrode groove 18, the voltage may be lower than the predetermined threshold voltage (Vt), because the doped impurities (for example, n-type impurities) reach the fin portion 15. If the channel concentration of the semiconductor substrate 13 (for example, concentration of the p-type impurities) is increased to compensate for the decrease in the threshold voltage (Vt), the strength of the electric field in the junction between the first impurity diffusion region 28 (for example, n-type diffusion layer) and the semiconductor substrate 13 (for example, p channel) increases and the information retention characteristic is remarkably deteriorated (refer to FIG. 19).

The second impurity diffusion region 29 is an impurity diffusion region that functions as a source/drain region (drain region in the case of the structure shown in FIG. 2) common to the first and second transistors 19-1 and 19-2. When the semiconductor substrate 13 is a p-type silicon substrate, the second impurity diffusion region 29 is formed by ion-implanting the n-type impurities into the semiconductor substrate 13. Thereby, the fin portion 15 becomes a p-type.

Figure 20:
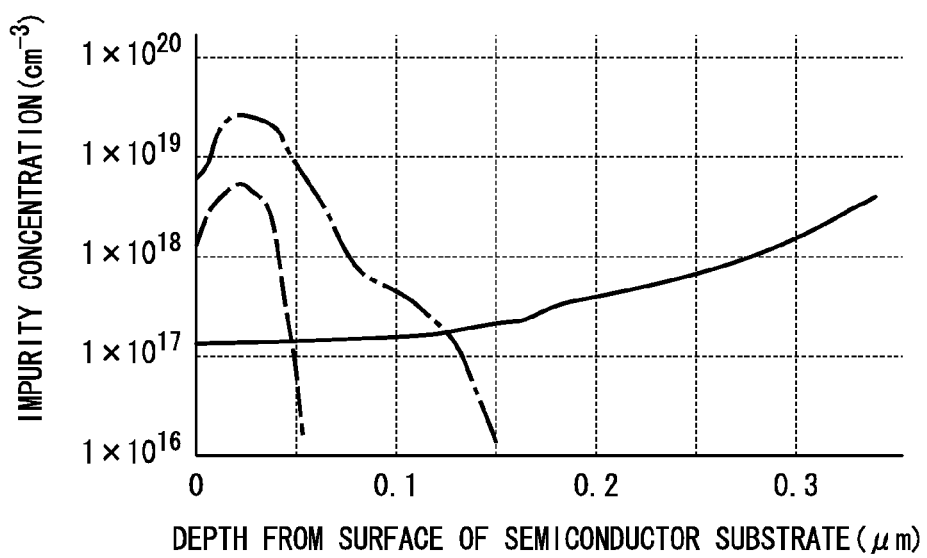
FIG. 20 is a diagram illustrating variation of impurity concentration over depth from surface of semiconductor substrate.

FIG. 20 is a relation diagram showing a junction position of each impurity diffusion region in the semiconductor device 10 according to this embodiment. In FIG. 20, a horizontal axis shows the depth from the surface 13a of the semiconductor substrate 13 and a vertical axis shows an impurity concentration of each of the semiconductor substrate 13 and the first and second impurity diffusion regions 28 and 29. In FIG. 20, an intersection of each profile of the first and second impurity diffusion regions 28 and 29 and a profile of the semiconductor substrate 13 becomes a metallurgical junction position.

FIG. 20 shows a relation among the depth of the gate electrode groove 18, the height H of the fin portion 15, and the junction position of the second impurity diffusion region 29.

As such, in the semiconductor device 10 according to this embodiment, the fin portion 15 is provided in the bottom portion 18c of the gate electrode groove 18 and the first impurity diffusion region 28 that includes the top surface 13a of the semiconductor substrate 13 interposed between the first side 18a and the second element isolation groove 54 and covers the upper portion 21A of the gate insulating film 21 arranged on the first side 18a and the second impurity diffusion region 29 that is arranged in the portion of the semiconductor substrate 13 positioned between the two gate electrode grooves 18 and covers all of the portions other than the lower end of the gate insulating film 21 arranged on the second side 18b of the pair of gate electrode grooves 18 are provided. Thereby, when the first and second transistors 19-1 and 19-2 are operated, the first channel region is formed in the fin portion 15, the second channel region is formed in the portions of the semiconductor substrate 13 that contacts the lower portion of the gate insulating film 21 arranged on the first side 18a, contacts the bottom portion 18c of the gate electrode groove 18, and is positioned at a lower side of the bottom portion of the second impurity diffusion region 29 arranged on the second side 18b, and the channel region is not provided in the portion of the semiconductor substrate 13 that contacts the second side 18b and is positioned at the upper side of the bottom portion of the second impurity diffusion region 29.

In other words, the channel region is configured of the fin portion 15 covered to step over the gate electrode through the gate insulating film 21 and three surfaces constituting the gate electrode groove 18.

That is, when the first and second transistors 19-1 and 19-2 are turned on, the fin portion 15 is fully depleted. Therefore, in the first and second transistors 19-1 and 19-2, the resistance becomes low and the current can easily flow, as compared with the transistors according to the related art. Thereby, in a miniaturized memory cell, the channel resistance may be decreased and the on-state current may be increased.

When one of the first and second transistors 19-1 and 19-2 is operated, the other transistor may be suppressed from being erroneously operated.

Therefore, even when the size of the semiconductor device 10 is decreased and the gate electrodes 22 are arranged at a narrow pitch, the first and second transistors 19-1 and 19-2 may be operated independently and stably.

The fin portion 15 is provided in the bottom portion 18c of each of the two gate electrode grooves 18 arranged to be adjacent to each other and the depth H of the fin portion 15 is set to 40 nm or less. Thus, in the state in which "L" is stored in the lower electrode 57 electrically connected to the first transistor 19-1 and "H" is stored in the lower electrode 57 electrically connected to the second transistor 19-2, when on/off of the gate electrode 22 (word line) corresponding to the first transistor 19-1 is repeated, the fin portion 15 becoming the channel region of the first transistor 19-1 is a p-type and it becomes difficult to induce the electrons e⁻ (not shown in the drawings). Therefore, the electrons e⁻ induced in the channel of the first transistor 19-1 may be suppressed from reaching the second impurity diffusion region 28 (drain region) forming the second transistor 19-2.

Thereby, the electrons e⁻ induced in the channel of the first transistor 19-1 may be prevented from destroying H information stored in the lower electrode 57 electrically connected to the second transistor 19-2 to change the state to the L state. Therefore, generation of the disturbance failure in which the operation state of one adjacent cell changes a storage state of the other cell may be suppressed.

In the DRAM in which the interval between the two gate electrodes 22 arranged to be adjacent to each other is 50 nm or less, the generation of the disturbance failure may be suppressed.

Referring to FIGS. 2A and 2B, the opening 32 is formed between the buried insulating films 24 protruding from the two gate electrode grooves 18. The opening 32 is formed to expose the top surface 29a of the second impurity diffusion region 29.

Referring to FIGS. 2A and 2B, the bit line contact plug 33 is provided to bury the opening 32 and is configured integrally with the bit line 34. The lower end of the bit line contact plug 33 contacts the top surface 29a of the second impurity diffusion region 29. When the bit line 34 is configured using a stacked film obtained by sequentially stacking a polysilicon film, a titanium nitride (TiN) film, and a tungsten (W) film, the bit line contact plug 33 may be configured using the polysilicon film.

Referring to FIGS. 2A and 2B, the bit line 34 is provided on a top surface 24a of the buried insulating film 24 and is configured integrally with the bit line contact plug 33.

Thereby, the bit line 34 is electrically connected to the second impurity diffusion region 29 through the bit line contact plug 33.

As the material of the bit line 34, a stacked film obtained by sequentially stacking a polysilicon film, a titanium nitride film, and a tungsten film, the polysilicon film, or the titanium nitride film may be used.

Referring to FIGS. 2A and 2B, the cap insulating film 36 is provided to cover the top surface of the bit line 34. The cap insulating film 36 protects the top surface of the bit line 34 and functions as an etching mask when a base material becoming the bit line 34 is patterned by anisotropic etching (specifically, dry etching). As the cap insulating film 36, a stacked film that is obtained by sequentially stacking a silicon nitride film (SiN film) and a silicon oxide film ($SiO_2$ film) may be used.

Referring to FIGS. 2A and 2B, the sidewall film 37 is provided to cover a side of the bit line 34. The sidewall film 37 has a function for protecting the sidewall of the bit line 34. As the sidewall film 37, a stacked film that is obtained by sequentially stacking a silicon nitride film (SiN film) and a silicon oxide film ($SiO_2$ film) may be used.

Referring to FIGS. 2A and 2B, the interlayer insulating film 38 is provided on the top surface 26a of the mask insulating film 26 and the top surface 55a of the second element isolation insulating film 55. A top surface 38a of the interlayer insulating film 38 is flush with a top surface 36a of the cap insulating film 36. As the interlayer insulating film 38, a silicon oxide film ($SiO_2$ film) formed by a CVD method or a coating-based insulating film (silicon oxide film ($SiO_2$ film)) formed by an SOG method may be used.

Referring to FIGS. 2A and 2B, a contact hole 41 is formed in the buried insulating film 24, the mask insulating film 26, and the interlayer insulating film 38 to expose a part of the top surface 28a of the first impurity diffusion region 28.

Referring to FIGS. 2A and 2B, the capacitor contact plug 42 is provided to bury the contact hole 41. The lower end of the capacitor contact plug 42 contacts a part of the top surface 28a of the first impurity diffusion region 28. Thereby, the capacitor contact plug 42 is electrically connected to the first impurity diffusion region 28. A top surface 42a of the capacitor contact plug 42 is flush with the top surface 38a of the interlayer insulating film 38. The capacitor contact plug 42 may have a stacked structure that is obtained by sequentially stacking a titanium nitride film and a tungsten film.

Referring to FIGS. 2A and 2B, a capacitor contact pad 44 is provided on the top surface 38a of the interlayer insulating film 38, such that a part thereof is connected to the top surface 42a of the capacitor contact plug 42. The lower electrode 57 that forms the capacitor 48 is connected to an upper side of the capacitor contact pad 44. Thereby, the capacitor contact pad 44 electrically connects the capacitor contact plug 42 and the lower electrode 57.

Referring to FIG. 1, the capacitor contact pad 14 is formed in a circular shape and is arranged at a position different from the position of the capacitor contact plug 42 in the Y direction. The capacitor contact pad 44 is arranged between the adjacent bit lines 34 in the X direction.

That is, the capacitor contact pads 44 are arranged at the different positions such that the center portions of the capacitor contact pads 44 are repetitively arranged on every other gate electrode 22 along the Y direction or the side of every other gate electrode 22 along the Y direction. In other words, the capacitor contact pads 44 are arranged in a zigzag shape in the Y direction.

Referring to FIGS. 2A and 2B, the silicon nitride film 46 is provided on the top surface 38a of the interlayer insulating film 38 to surround an outer circumferential portion of the capacitor contact pad 44.

The capacitor 48 is provided with respect to each capacitor contact pad 44.

One capacitor 48 has one lower electrode 57, a capacitor insulating film 58 common to the plurality of lower electrodes 57, and an upper electrode 59 to be an electrode common to the plurality of lower electrodes 57.

The lower electrode 57 is provided on the capacitor contact pad 44 and is connected to the capacitor contact pad 44. The lower electrode 57 is formed in a coronal shape.

The capacitor insulating film 58 is provided to cover surfaces of the plurality of lower electrodes 57 exposed from the silicon nitride film 46 and a top surface of the silicon nitride film 46.

The upper electrode 59 is provided to cover the surface of the capacitor insulating film 58. The upper electrode 59 is arranged to bury an inner portion of the lower electrode 57 provided with the capacitor insulating film 58 and gaps between the plurality of lower electrodes 57. A top surface 59a of the upper electrode 59 is arranged on an upper side of upper ends of the plurality of lower electrodes 57.

The capacitor 48 that has the above-described configuration is electrically connected to the first impurity diffusion region 28 through the capacitor contact pad 44.

An interlayer insulating film (not shown in the drawings) that covers the top surface 59a of the upper electrode 59, a contact plug (not shown in the drawings) that is provided in the interlayer insulating film, and a wiring (not shown in the drawings) that is connected to the contact plug may be provided.

The semiconductor device 10 according to the embodiment of the present invention has the following configuration. The semiconductor device 10 includes a plurality of first element isolation regions 14 that are formed of the semiconductor substrate 13, are provided in the semiconductor substrate 13 to extend in the first direction, and partition the active region 16 having the plurality of element formation regions R, a plurality of second element isolation regions 17 that are provided in the semiconductor substrate 13 to extend in the second direction crossing the first direction and partition the active region 16 in the plurality of element formation regions R, a pair of gate electrode grooves 18 that are provided to extend in the second direction crossing the first element isolation region 14 and the active region 16 in the surface layer of the semiconductor substrate 13 between the second element isolation regions 17 to be adjacent to each other and have the first and second sides 18a and 18b facing each other and the bottom portion 18c, a fin portion 15 that is formed such that a part of the active region 16 protrudes from the bottom portion 18c of the gate electrode groove 18, by setting the depth of the second groove portion 18B formed in the first element isolation region 14 to be more than the depth of the first groove portion 18A of the gate electrode groove 18 formed in the active region 16 and setting the depth of the portion of the first groove portion 18A facing the second groove portion 18B to be almost equal to the depth of the second groove portion 18B, the gate insulating film 21 that covers the gate electrode groove 18 and the surface of the fin portion 15, a pair of gate electrodes 22 that are buried in the lower portions of the pair of gate electrode grooves 18 and are formed to step over the fin portion 15 through the gate insulating film 21, two first impurity diffusion regions 28 that are provided on the top surface 13a of the semiconductor substrate 13 between the second element isolation region 17 and the gate electrode groove 18 and are connected to the capacitors 48, and one second impurity diffusion region 29 that is provided in the semiconductor substrate 13 between the pair of gate electrode grooves 18 arranged such that the second sides 18b face each other and is connected to the bit line 34. The element formation region R has the first transistor 19-1 and the second transistor 19-2 that share the second impurity diffusion region 29. The first transistor 19-1 is configured of at least one of the gate electrodes 22, the fin portion 15, and one of the first impurity diffusion regions 28 and the second transistor 19-2 is configured of at least the other of the gate electrodes 22, the fin portion 15, and the other of the first impurity diffusion regions 28. The depth of the bottom portion 18c of the gate electrode groove 18 is 150 to 200 nm from the surface 13a of the semiconductor substrate 13 and the height from the bottom portion 18c of the gate electrode groove 18 to the top portion (upper portion) of the fin portion 15 is 10 to 40 nm.

The second impurity diffusion region 29 is provided such that the depth thereof is less than the depth of the bottom portion 18c of the gate electrode groove 18 and is more than the depth of the top portion (upper portion) of the fin portion 15.

According to the semiconductor device 10 according to this embodiment, the fin portion 15 is provided in the bottom portion 18c of the gate electrode groove 18. The first impurity diffusion region 28 that includes the top surface 13a of the semiconductor substrate 13 interposed between the first side 18a and the second element isolation groove 54 and covers the upper portion 21A of the gate insulating film 21 arranged on the first side 18a and the second impurity diffusion region 29 that is arranged in the portion of the semiconductor substrate 13 positioned between the two gate electrode grooves 18 and covers all of the portions other than the lower end of the gate insulating film 21 arranged on the second sides 18b of the pair of gate electrode grooves 18 are provided. Thereby, when the first and second transistors 19-1 and 19-2 are operated, the first channel region is formed in the fin portion 15, the second channel region is formed in the portions of the semiconductor substrate 13 that contacts the lower portion of the gate insulating film 21 arranged on the first side 18a, contacts the bottom portion 18c of the gate electrode groove 18, and is positioned at the lower side of the bottom portion of the second impurity diffusion region 29 arranged on the second side 18b, and the channel region is not provided in the portion of the semiconductor substrate 13 that contacts the second side 18b and is positioned at the upper side of the bottom portion of the second impurity diffusion region 29.

In other words, the channel region may be configured of the fin portion 15 that is covered to step over the gate electrode 22 through the gate insulating film 21 and the three surfaces that form the gate electrode groove 18.

That is, when the first and second transistors 19-1 and 19-2 are turned on, the fin portion 15 is fully depleted. Therefore, in the first and second transistors 19-1 and 19-2, the resistance becomes low and the current can easily flow, as compared with the transistors according to the related art. Thereby, in the miniaturized memory cell, the channel resistance may be decreased and the on-state current may be increased.

When one of the first and second transistors 19-1 and 19-2 is operated, the other transistor may be suppressed from being erroneously operated.

Therefore, even when the size of the semiconductor device 10 is decreased and the gate electrodes 22 are arranged at a narrow pitch, the first and second transistors 19-1 and 19-2 may be operated independently and stably.

The fin portion 15 is provided in the bottom portion 18c of each of the two gate electrode grooves 18 arranged to be adjacent to each other and the depth H of the fin portion 15 is set to 40 nm or less. Thus, in the state in which "L" is stored in the lower electrode 57 electrically connected to the first transistor 19-1 and "H" is stored in the lower electrode 57 electrically connected to the second transistor 19-2, when on/off of the gate electrode 22 (word line) corresponding to the first transistor 19-1 is repeated, the fin portion 15 becoming the channel region of the first transistor 19-1 is a p-type and it becomes difficult to induce the electrons $e^-$ (not shown in the drawings). For this reason, the electrons $e^-$ induced in the channel of the first transistor 19-1 may be suppressed from reaching the second impurity diffusion region 28 (drain region) forming the second transistor 19-2.

Thereby, the electrons $e^-$ induced in the channel of the first transistor 19-1 may be prevented from destroying H information stored in the lower electrode 57 electrically connected to the second transistor 19-2 to change the state to the L state. Therefore, generation of the disturbance failure in which the operation state of one adjacent cell changes a storage state of the other cell may be suppressed.

In the DRAM in which the interval between the two gate electrodes 22 arranged to be adjacent to each other is 50 nm or less, the generation of the disturbance failure may be suppressed.

The gate electrode 22 that is arranged to bury the lower portion of the gate electrode groove 18 through the gate insulating film 21 and the buried insulating film 24 that is arranged to bury the gate electrode groove 18 and covers the top surface 22a of the gate electrode 22 are provided and the gate electrode 22 may be prevented from protruding to the upper side of the surface 13a of the semiconductor substrate 13.

Thereby, in this embodiment, when the DRAM is used as the semiconductor device 10, the bit line 34 or the capacitor 48 that is formed in the process after the process for forming the gate electrode 22 may be easily formed. Therefore, the semiconductor device 10 may be easily manufactured.

Referring to FIGS. 3A to 3D, 4A to 4D, 5A to 5D, 6A to 6D, 7A to 7D, 8A to 8D, 9A to 9D, 10A to 10C, 11A to 11C, 12A to 12C, 13A to 13C, 14, 15, and 16, a method of manufacturing the semiconductor device 10 (specifically, a memory cell array 11) according to this embodiment will be described.

In this case, a line A-A shown in FIGS. 3A to 13A corresponds to a line A-A shown in FIG. 1 and a line B-B shown in FIGS. 3B to 13B corresponds to a line B-B shown in FIG. 1.

Cross-sections taken along a line C-C shown in FIGS. 3A to 9A are shown in FIGS. 3D to 9D, respectively. The cross-section taken along the line C-C shows a cross-section along an extension direction of the gate electrode 22 that is the buried word line in the semiconductor device 10 according to this embodiment.

First, in the processes shown in FIGS. 3A to 3D, a pad oxide film 65 is formed on the main surface 13a of the semiconductor substrate 13. Next, a silicon nitride film 66 having an opening 66a of a groove shape is formed on the pad oxide film 65.

Figure 3A:
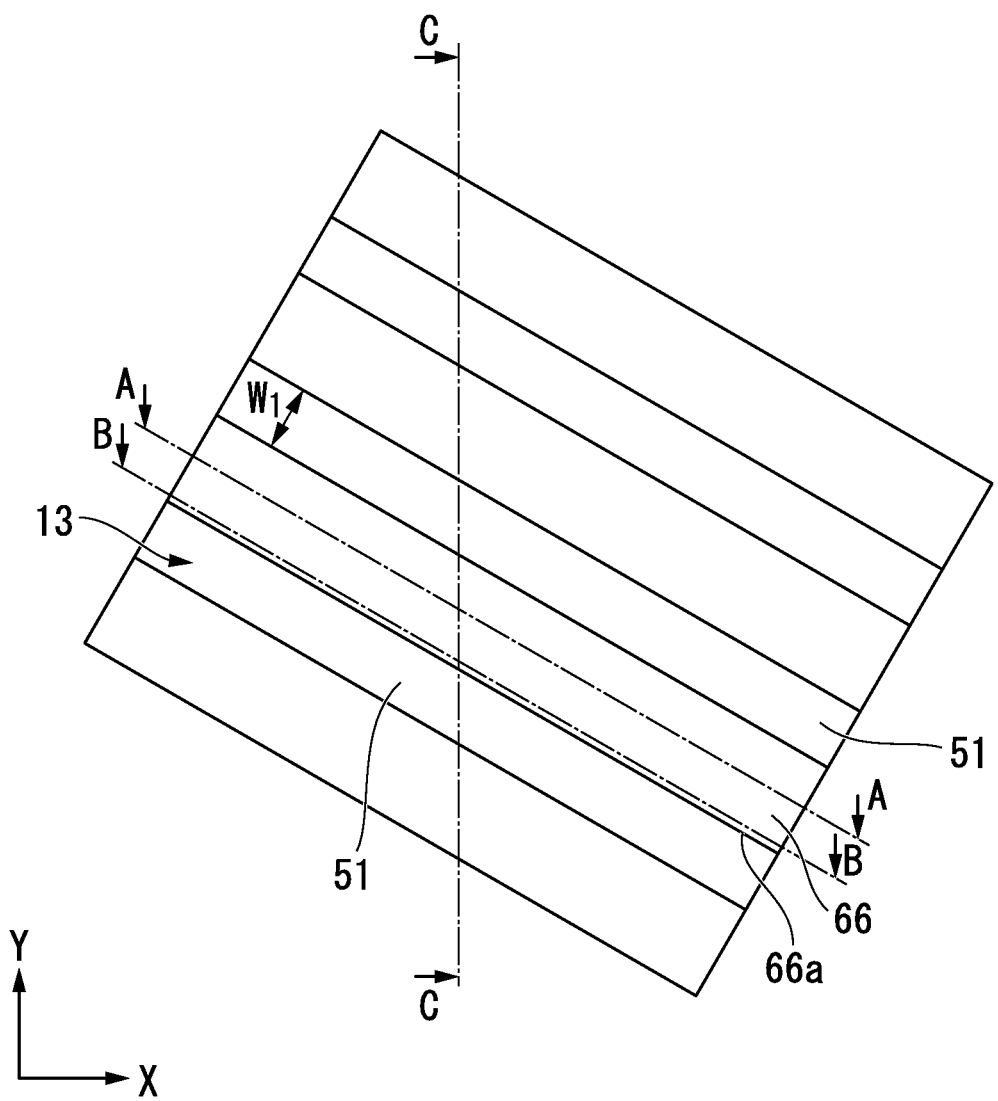
FIG. 3A is a fragmentary plan view of a step involved in a method of forming a memory cell array of the semiconductor device of FIGS. 1, 2A, 2B, and 2C.
Figure 3B:
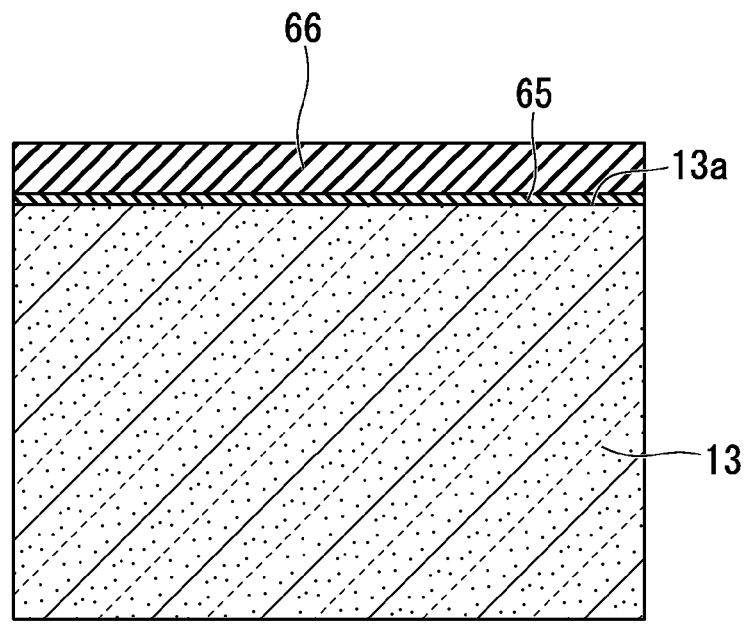
FIG. 3B is a fragmentary cross sectional elevation view, taken along an A-A line of FIG. 3A, of the step involved in the method of forming the memory cell array of the semiconductor device of FIGS. 1, 2A, 2B, and 2C.
Figure 3C:
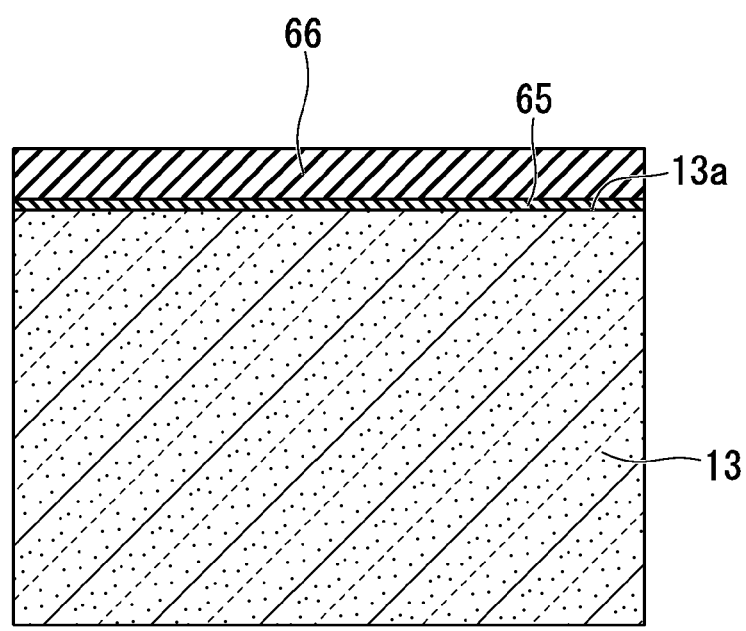
FIG. 3C is a fragmentary cross sectional elevation view, taken along a B-B line of FIG. 3A, of the step involved in the method of forming the memory cell array of the semiconductor device of FIGS. 1, 2A, 2B, and 2C.
Figure 3D:
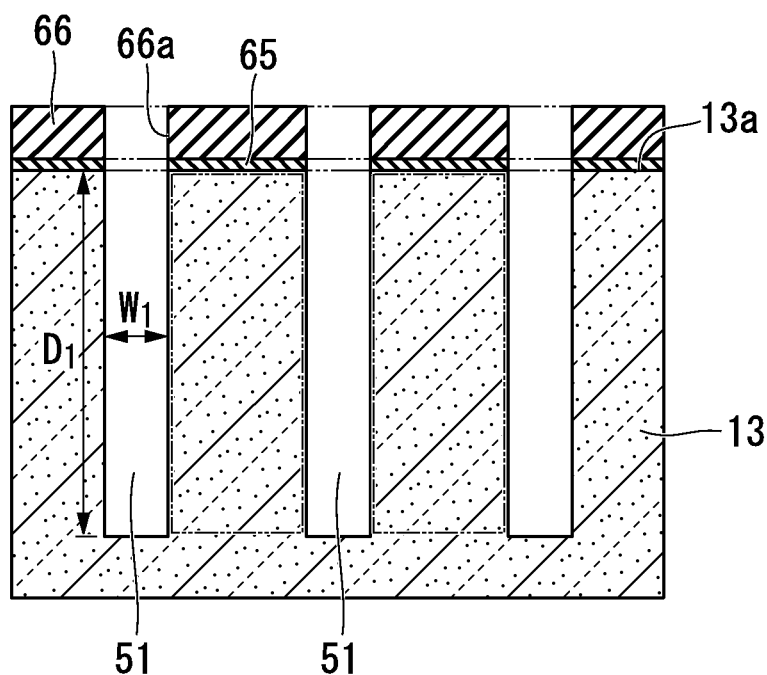
FIG. 3D is a fragmentary cross sectional elevation view, taken along a C-C line of FIG. 3A, of the step involved in the method of forming the memory cell array of the semiconductor device of FIGS. 1, 2A, 2B, and 2C.
Figure 4A:
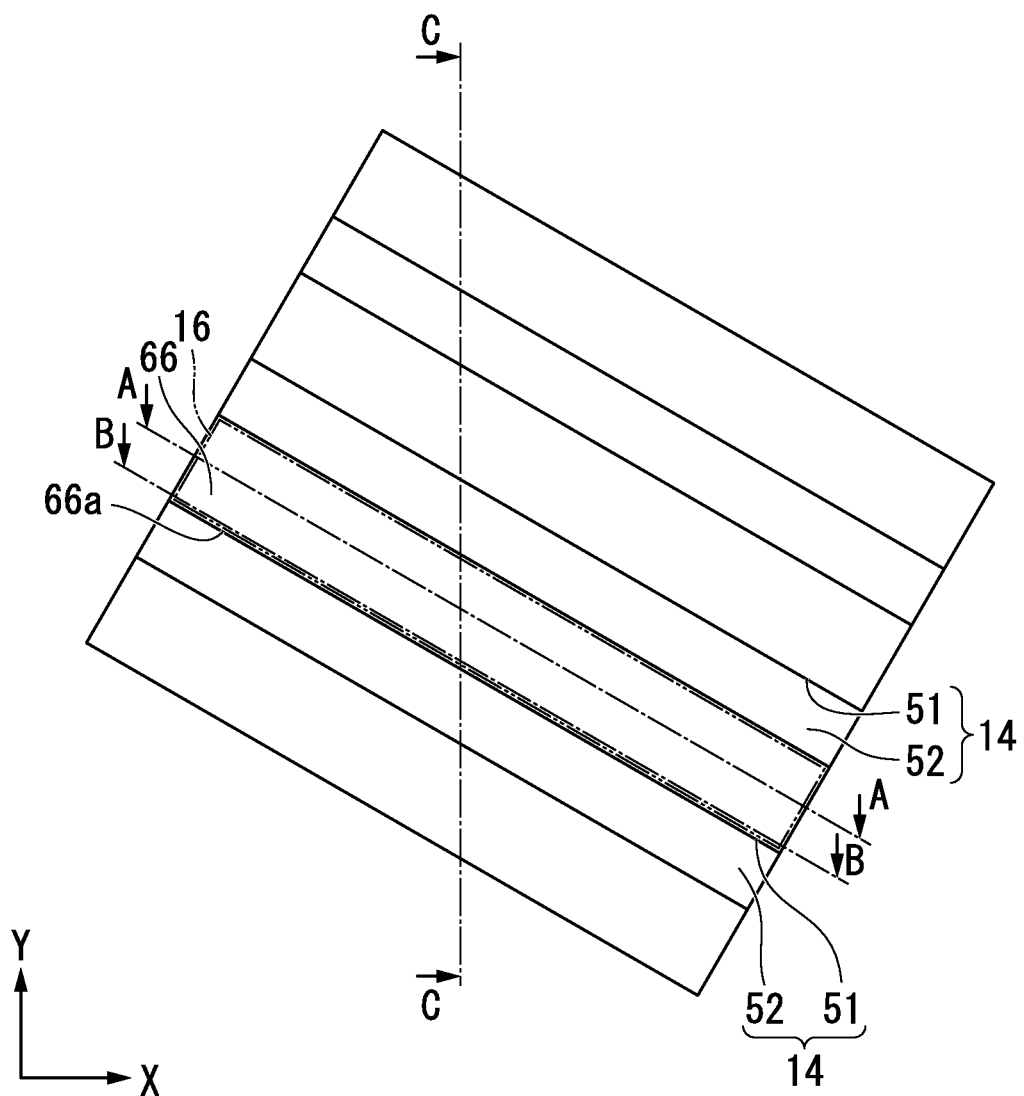
FIG. 4A is a fragmentary plan view of a step, subsequent to the step of FIGS. 3A, 3B, 3C and 3D, involved in a method of forming a memory cell array of the semiconductor device of FIGS. 1, 2A, 2B, and 2C.
Figure 4B:
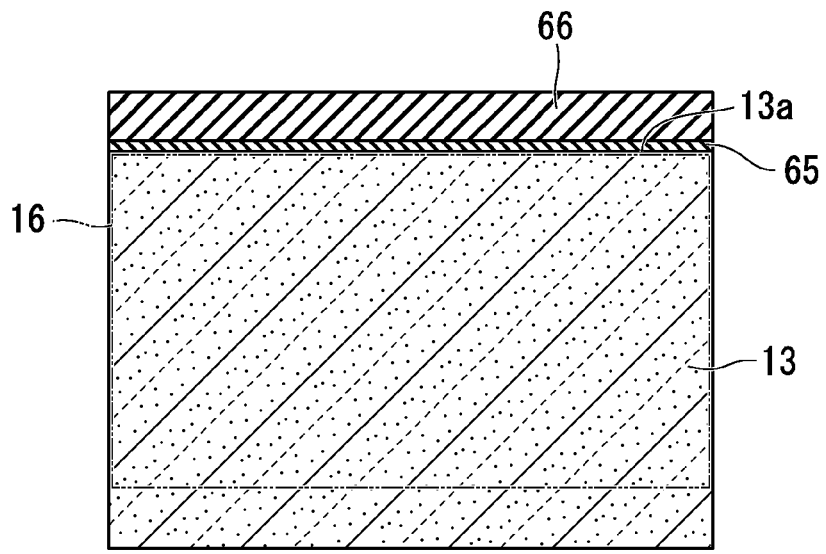
FIG. 4B is a fragmentary cross sectional elevation view, taken along an A-A line of FIG. 4A, of the step, subsequent to the step of FIGS. 3A, 3B, 3C and 3D, involved in the method of forming the memory cell array of the semiconductor device of FIGS. 1, 2A, 2B, and 2C.
Figure 4C:
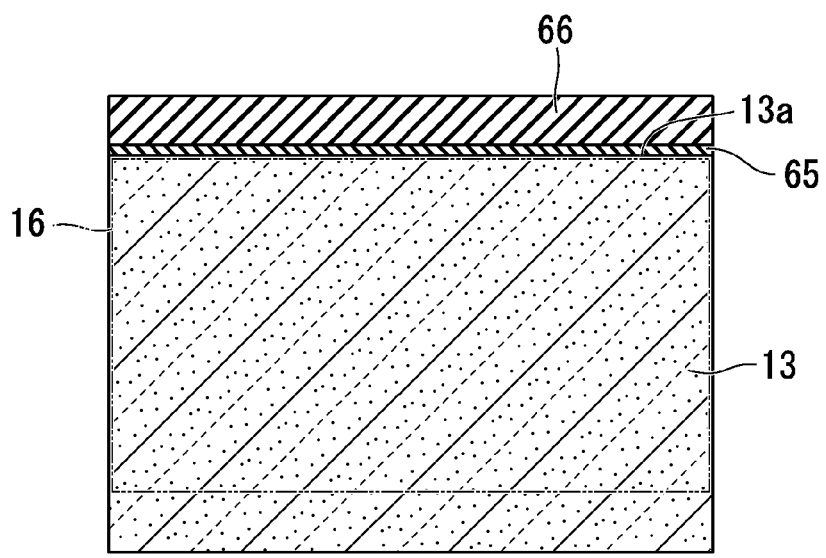
FIG. 4C is a fragmentary cross sectional elevation view, taken along a B-B line of FIG. 4A, of the step, subsequent to the step of FIGS. 3A, 3B, 3C and 3D, involved in the method of forming the memory cell array of the semiconductor device of FIGS. 1, 2A, 2B, and 2C.
Figure 4D:
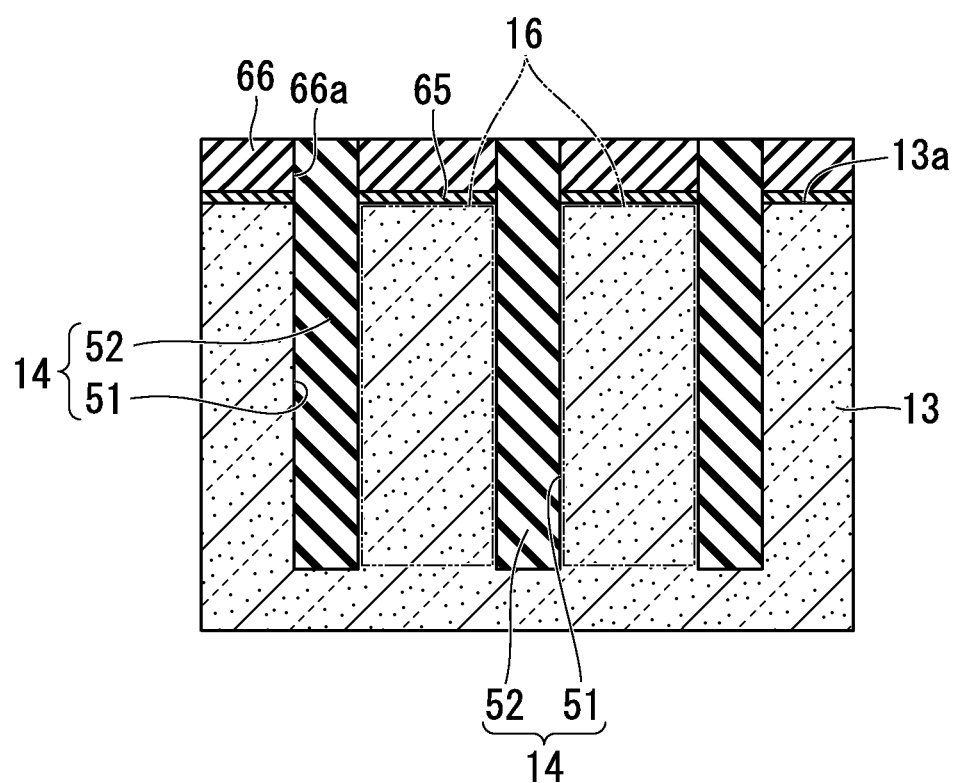
FIG. 4D is a fragmentary cross sectional elevation view, taken along a C-C line of FIG. 4A, of the step, subsequent to the step of FIGS. 3A, 3B, 3C and 3D, involved in the method of forming the memory cell array of the semiconductor device of FIGS. 1, 2A, 2B, and 2C.
Figure 5A:
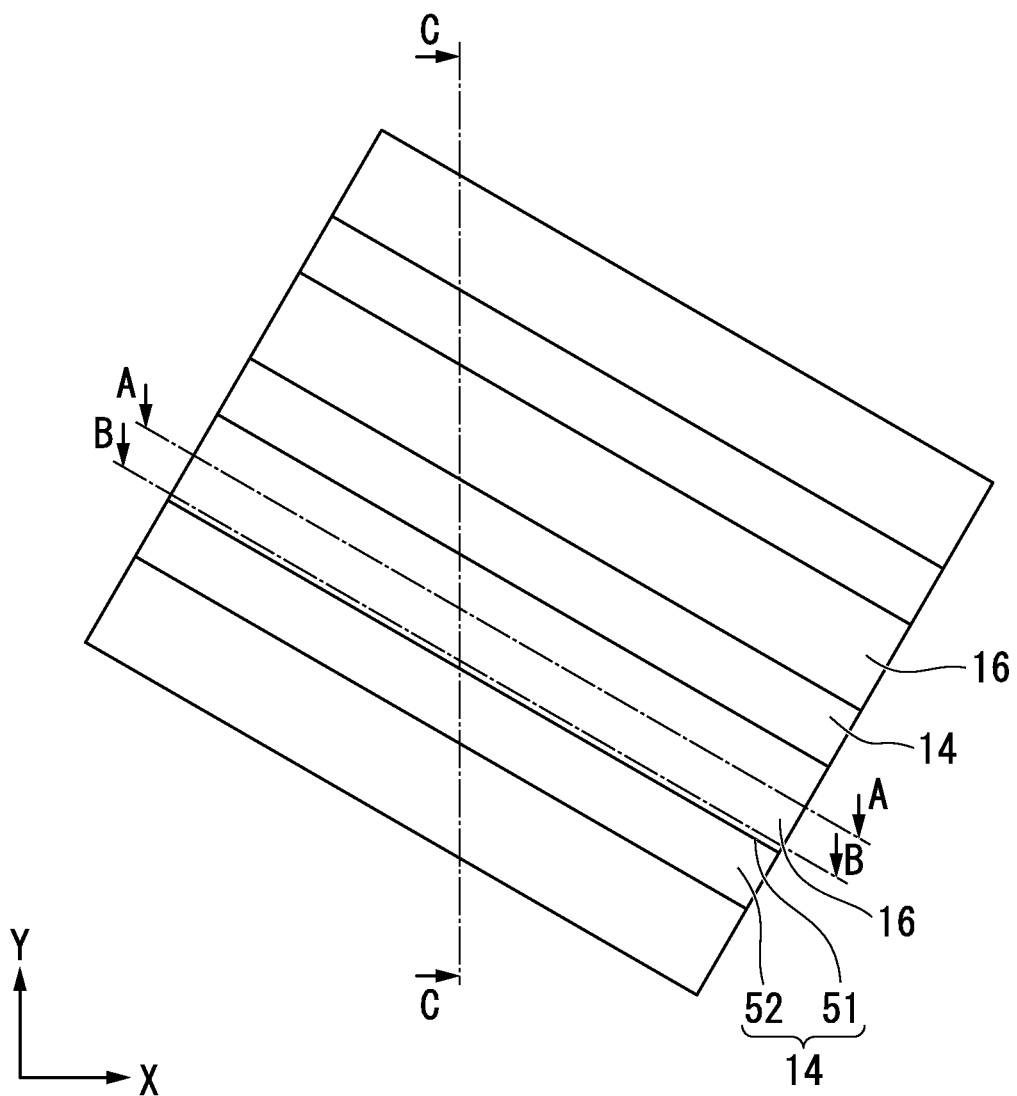
FIG. 5A is a fragmentary plan view of a step, subsequent to the step of FIGS. 4A, 4B, 4C and 4D, involved in a method of forming a memory cell array of the semiconductor device of FIGS. 1, 2A, 2B, and 2C.
Figure 5B:
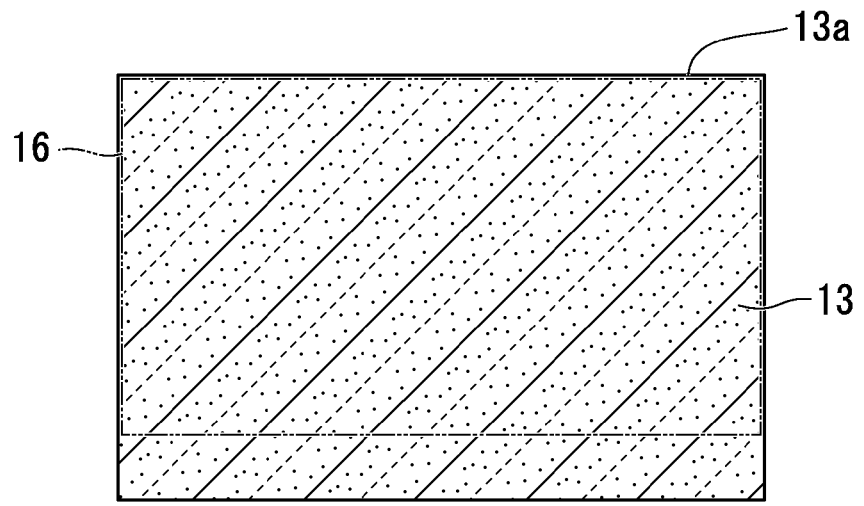
FIG. 5B is a fragmentary cross sectional elevation view, taken along an A-A line of FIG. 5A, of the step, subsequent to the step of FIGS. 4A, 4B, 4C and 4D, involved in the method of forming the memory cell array of the semiconductor device of FIGS. 1, 2A, 2B, and 2C.
Figure 5C:
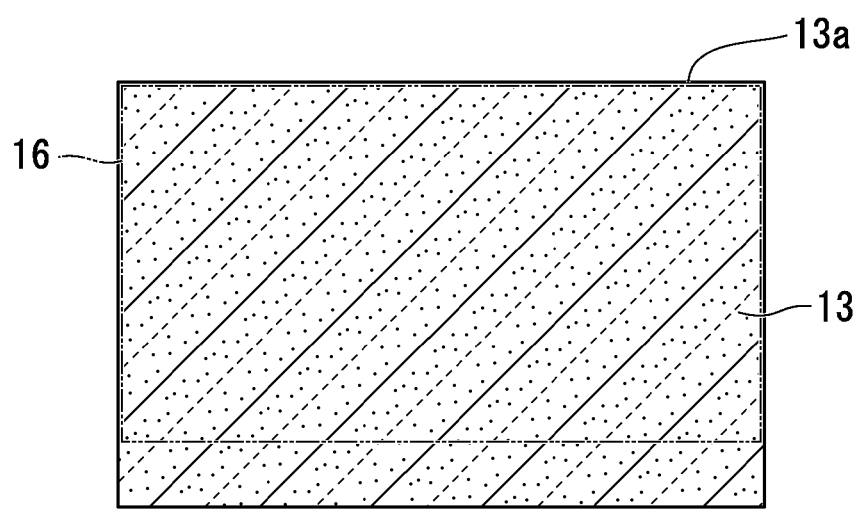
FIG. 5C is a fragmentary cross sectional elevation view, taken along a B-B line of FIG. 5A, of the step, subsequent to the step of FIGS. 4A, 4B, 4C and 4D, involved in the method of forming the memory cell array of the semiconductor device of FIGS. 1, 2A, 2B, and 2C.
Figure 5D:
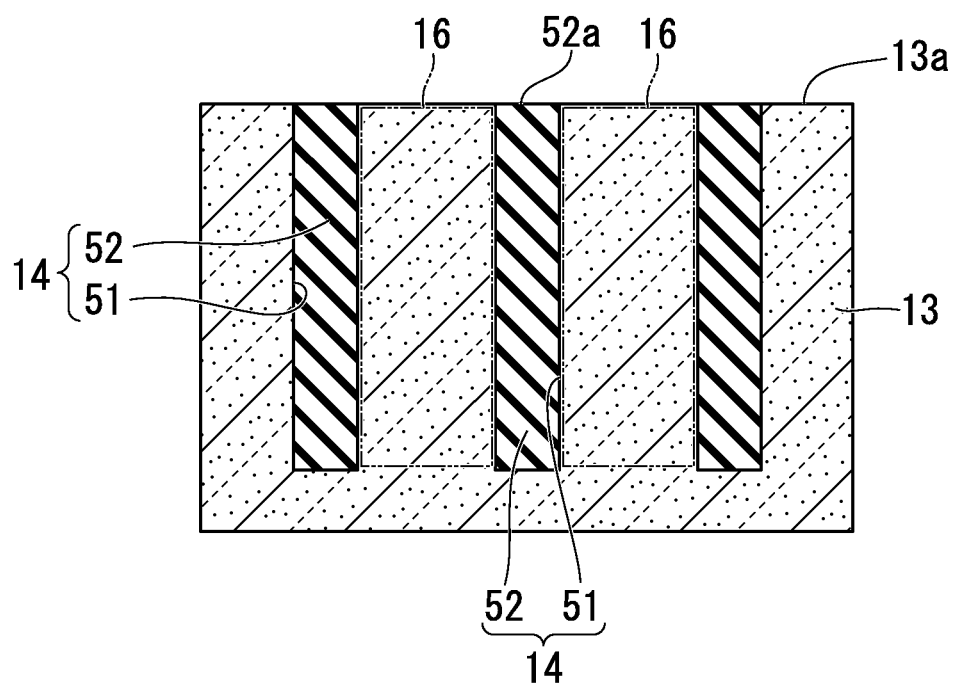
FIG. 5D is a fragmentary cross sectional elevation view, taken along a C-C line of FIG. 5A, of the step, subsequent to the step of FIGS. 4A, 4B, 4C and 4D, involved in the method of forming the memory cell array of the semiconductor device of FIGS. 1, 2A, 2B, and 2C.
Figure 6A:
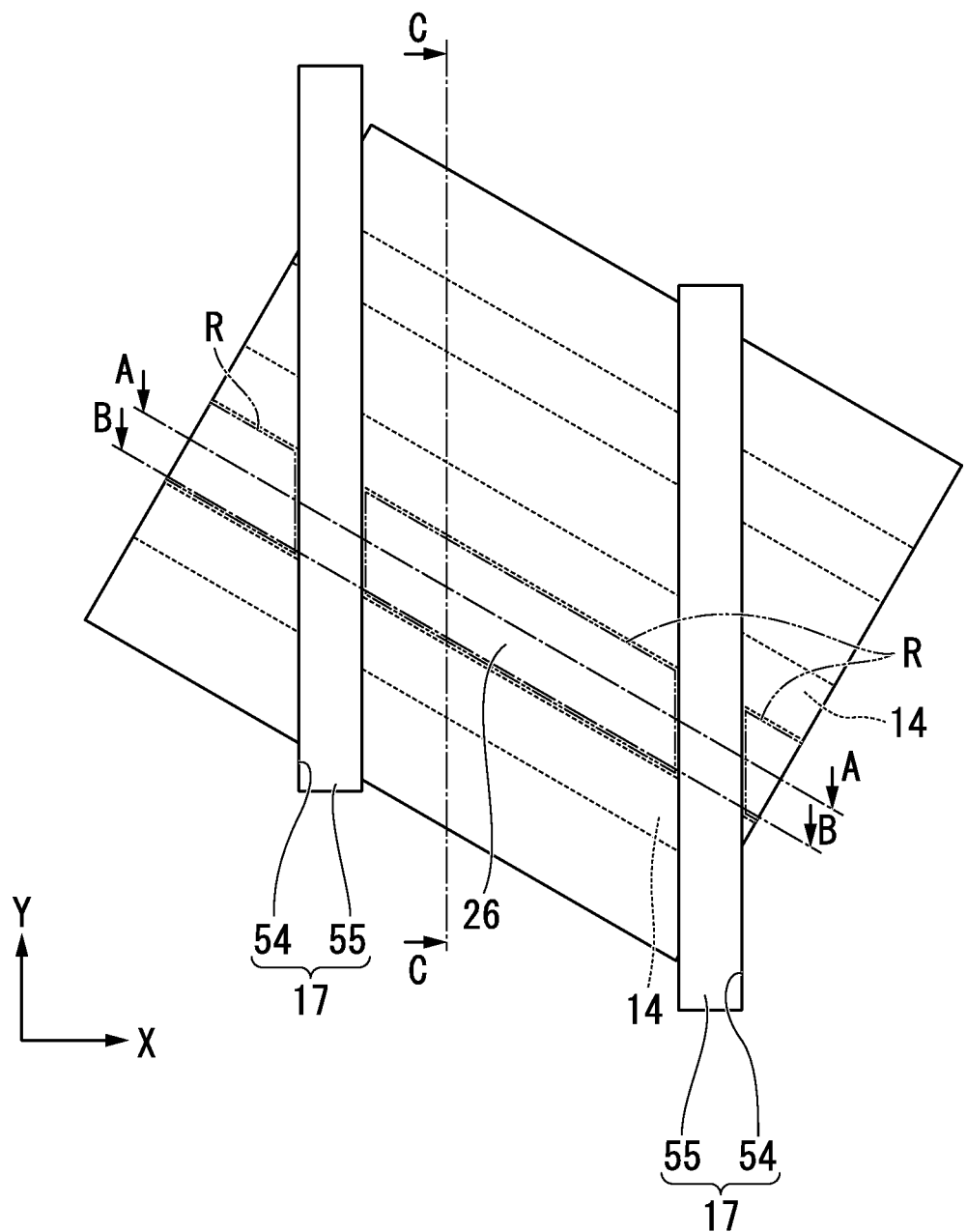
FIG. 6A is a fragmentary plan view of a step, subsequent to the step of FIGS. 5A, 5B, 5C and 5D, involved in a method of forming a memory cell array of the semiconductor device of FIGS. 1, 2A, 2B, and 2C.
Figure 6B:
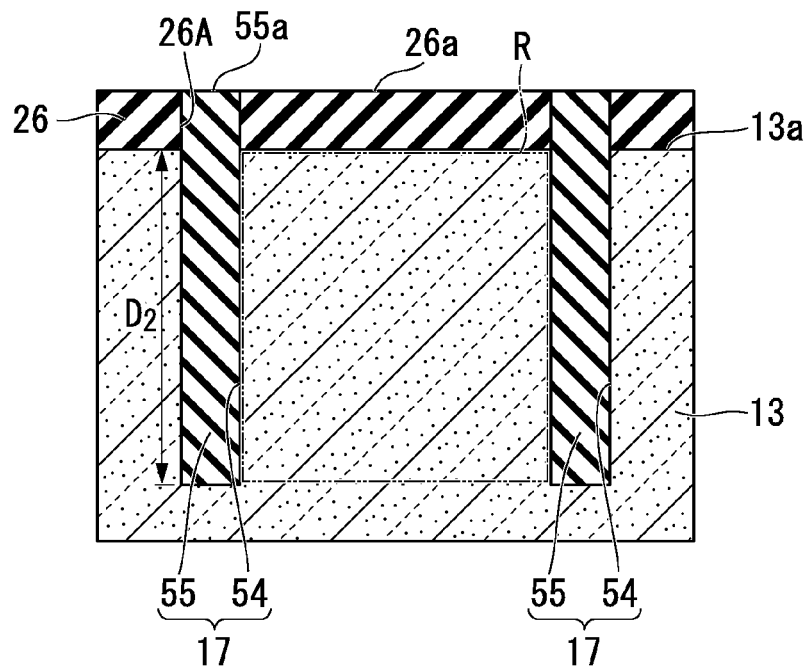
FIG. 6B is a fragmentary cross sectional elevation view, taken along an A-A line of FIG. 6A, of the step, subsequent to the step of FIGS. 5A, 5B, 5C and 5D, involved in the method of forming the memory cell array of the semiconductor device of FIGS. 1, 2A, 2B, and 2C.
Figure 6C:
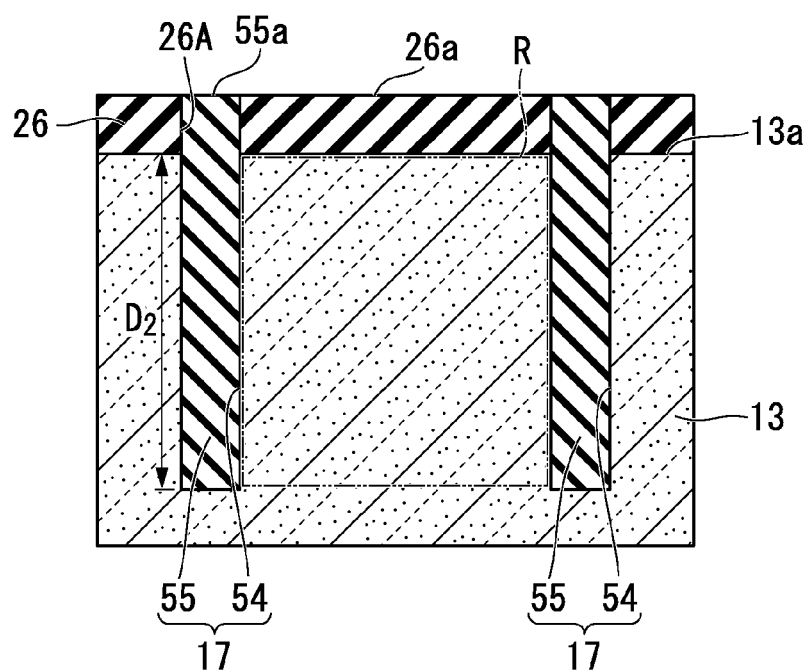
FIG. 6C is a fragmentary cross sectional elevation view, taken along a B-B line of FIG. 6A, of the step, subsequent to the step of FIGS. 5A, 5B, 5C and 5D, involved in the method of forming the memory cell array of the semiconductor device of FIGS. 1, 2A, 2B, and 2C.
Figure 6D:
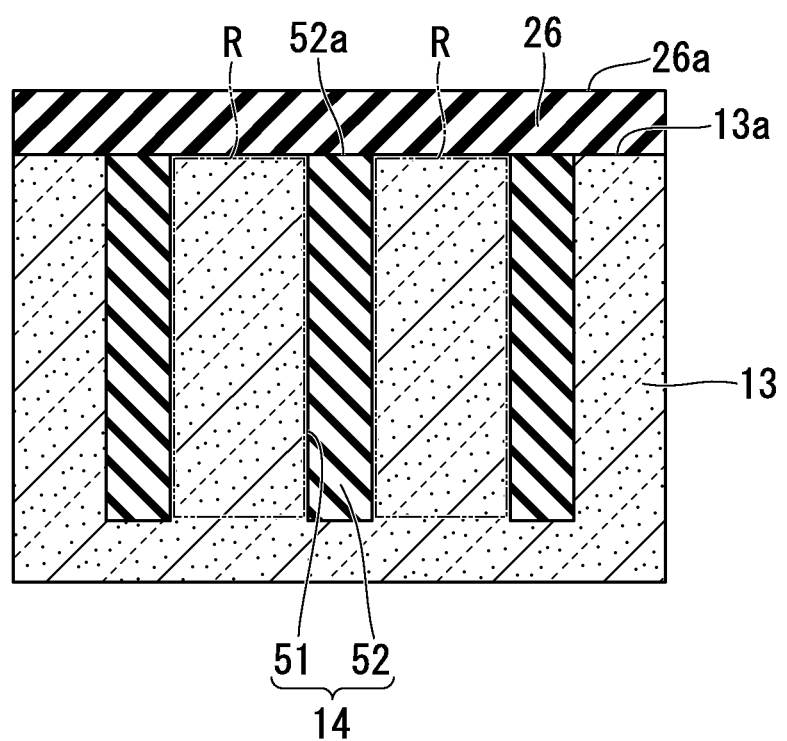
FIG. 6D is a fragmentary cross sectional elevation view, taken along a C-C line of FIG. 6A, of the step, subsequent to the step of FIGS. 5A, 5B, 5C and 5D, involved in the method of forming the memory cell array of the semiconductor device of FIGS. 1, 2A, 2B, and 2C.

As shown in FIGS. 3A and 3B, the openings 66a extend in a stripe shape in a direction (first direction) inclined with respect to the X direction by the predetermined angle and are formed at the predetermined interval in the Y direction.

At this time, the opening 66a is formed to expose a top surface of the pad oxide film 65 corresponding to a formation region of the first element isolation groove 51. The opening 66a is formed by forming a patterned photoresist (not shown in the drawings) on the silicon nitride film 66 and etching the silicon nitride film 66 by anisotropic etching using the photoresist as a mask. The photoresist is removed after the opening 66a is formed.

Next, the first element isolation groove 51 that extends in the first direction is formed by etching the semiconductor substrate 13 by anisotropic etching (dry etching) using the silicon nitride film 66 having the opening 66a as a mask.

A width $W_1$ of the first element isolation groove 51 may be set to 43 nm. The depth $D_1$ of the first element isolation groove 51 (depth from the main surface 13a of the semiconductor substrate 13) may be set to 250 nm.

Next, in the processes shown in FIGS. 4A to 4D, a first element isolation insulating film 52 that buries the first element isolation groove 51 is formed.

Specifically, the first element isolation groove 51 is buried by a silicon oxide film ($SiO_2$ film) formed by a high density plasma (HDP) method or a coating-based silicon oxide film ($SiO_2$ film) formed by a spin on glass (SOG) method.

Next, the silicon oxide film ($SiO_2$ film) that is formed on the upper side of the top surface of the silicon nitride film 66 is removed by a chemical mechanical polishing (CMP) method to form the first element isolation insulating film 52 formed of the silicon oxide film ($SiO_2$ film) in the first element isolation groove 51.

Thereby, the first element isolation region 14 that includes the first element isolation groove 51 and the first element isolation insulating film 52 and partitions the active region 16 of the stripe shape extending in the first direction is formed.

Next, in the processes shown in FIGS. 5A to 5D, the silicon nitride film 66 shown in FIGS. 4A to 4D is removed and the pad oxide film 65 is removed. Specifically, the silicon nitride film 66 is removed by hot phosphoric acid and the pad oxide film 65 is removed by a hydrogen fluoride (HF)-based etching liquid. Thereby, the active region 16 having the stripe shape is exposed.

Next, the portion of the first element isolation insulating film 52 that protrudes from the main surface 13a of the semiconductor substrate 13 is removed to make the top surface 52a of the first element isolation insulating film 52 flush with the main surface 13a of the semiconductor substrate 13. The first element isolation insulating film 52 that protrudes from the main surface 13a of the semiconductor substrate 13 is removed by wet etching.

Next, in the processes shown in FIGS. 6A to 6D, the mask insulating film 26 that has the opening 26A of the groove shape is formed on the main surface 13a of the semiconductor substrate 13 and the top surface 52a of the first element isolation insulating film 52 shown in FIGS. 5A to 5D.

Specifically, the mask insulating film 26 is formed as follow. A silicon nitride film (base material of the mask insulating film 26) that covers the main surface 13a of the semiconductor substrate 13 and the top surface 52a of the first element isolation insulating film 52 is formed. Next, a patterned photoresist (not shown in the drawings) is formed on the silicon nitride film and the opening 26A is formed in the mask insulating layer 26 by anisotropic etching using the photoresist as a mask.

At this time, a plurality of openings 26A extend in the Y direction (second direction) and are formed at the predetermined interval with respect to the X direction (refer to FIG.

6A). The opening 26A is formed to expose the main surface 13a of the semiconductor substrate 13 corresponding to a formation region of the second element isolation groove 54. The photoresist (not shown in the drawings) is removed after the opening 26A is formed.

Next, the second element isolation groove 54 that extends in the first direction is formed by etching the semiconductor substrate 13 by anisotropic etching (dry etching) using the mask insulating film 26 having the opening 26a as a mask.

A depth $D_2$ of the second element isolation groove 54 (depth from the main surface 13a of the semiconductor substrate 13) may be set to 250 nm.

Next, the second element isolation insulating film 55 that buries the second element isolation groove 54 is formed.

Specifically, the second element isolation groove 54 is buried by a silicon oxide film ($SiO_2$ film) formed by an HDP method or a coating-based silicon oxide film ($SiO_2$ film) formed by an SOG method.

Next, the insulating film that is formed on the upper side of the top surface 26a of the mask insulating film 26 is removed by the CMP method to form the second element isolation insulating film 55 formed of the silicon oxide film ($SiO_2$ film) and having the top surface 55a flush with the top surface 26a of the mask insulating film 26 in the second element isolation groove 54.

Thereby, the second element isolation region 17 that includes the second element isolation groove 54 and the second element isolation insulating film 55 and partitions the active region 16 of the stripe shape shown in FIGS. 5A to 5D into the plurality of element formation regions R is formed.

As such, after the first element isolation region 14 including the first element isolation groove 51 formed in the semiconductor substrate 13 and the first element isolation insulating film 52 burying the first element isolation groove 51 and partitioning the active region 16 having the stripe shape is formed, the second element isolation region 17 including the second element isolation groove 54 formed in the semiconductor substrate 13 and the second element isolation insulating film 55 burying the second element isolation groove 54 and partitioning the plurality of element formation regions R is formed. As a result, as compared with the case in which a dummy gate electrode (not shown in the drawings) to which negative potential is applied is provided in the second element isolation groove 54 through the gate insulating film 21 and the plurality of element formation regions R are partitioned, the potential of the dummy gate electrode does not exert a bad influence upon the first and second transistors 19-1 and 19-2 (refer to FIG. 2). Therefore, the first and second transistors 19-1 and 19-2 may be easily turned on and a retention characteristic of the data of the memory cell array 11 may be improved.

Next, in the processes shown in FIGS. 7A to 7D, the two openings 26B having the groove shape that extend in the Y direction are formed in the mask insulating film 26 positioned between the two second element isolation regions 17.

At this time, the opening 26B is formed to expose the main surface 13a of the semiconductor substrate 13 corresponding to a formation region of the gate electrode groove 18. The opening 26B is formed by forming a patterned photoresist (not shown in the drawings) on the mask insulating film 26 and etching the mask insulating film 26 by anisotropic etching (specifically, dry etching) using the photoresist as a mask. The photoresist is removed after the opening 26B is formed.

Figure 7A:
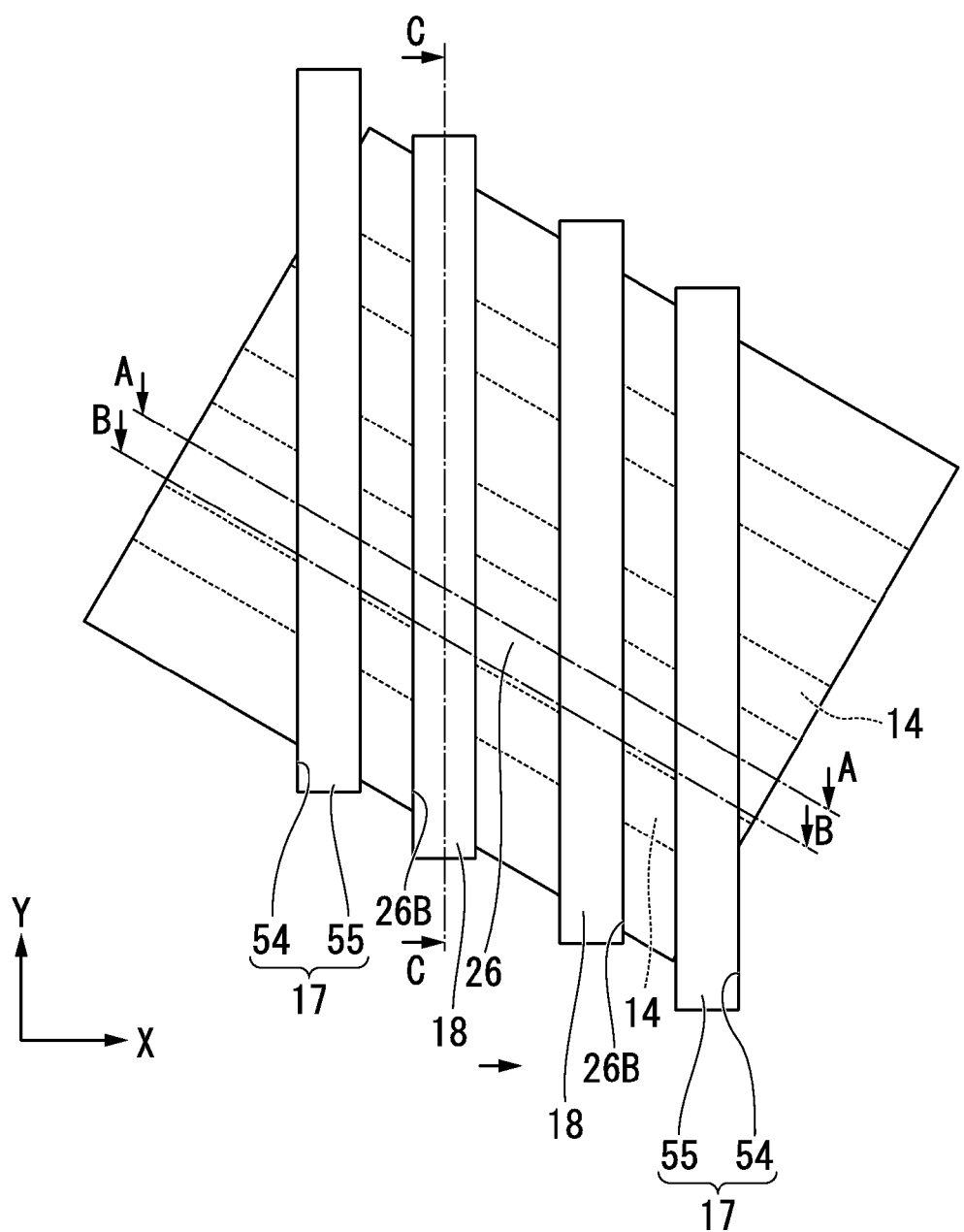
FIG. 7A is a fragmentary plan view of a step, subsequent to the step of FIGS. 6A, 6B, 6C and 6D, involved in a method of forming a memory cell array of the semiconductor device of FIGS. 1, 2A, 2B, and 2C.
Figure 7B:
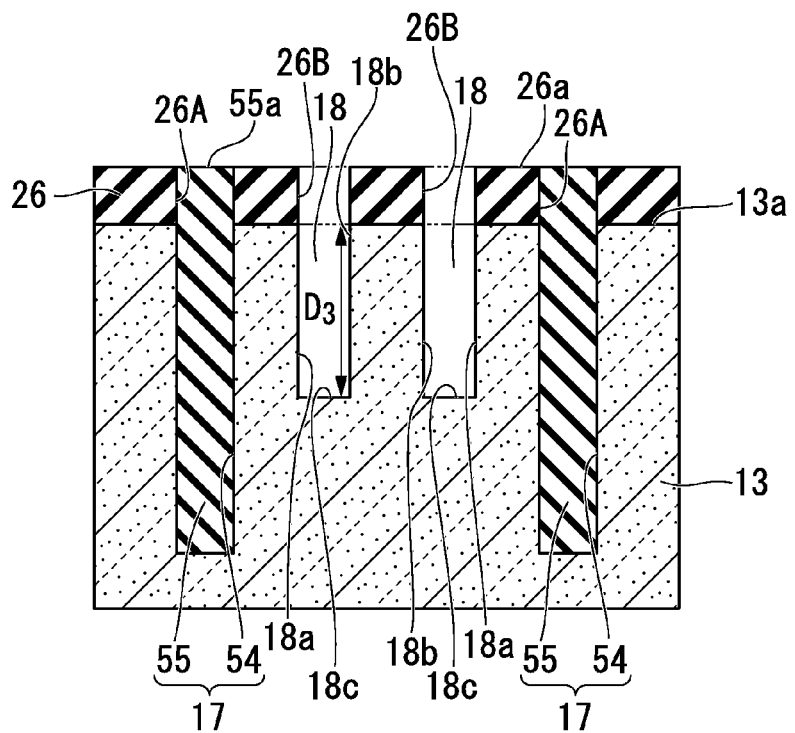
FIG. 7B is a fragmentary cross sectional elevation view, taken along an A-A line of FIG. 7A, of the step, subsequent to the step of FIGS. 6A, 6B, 6C and 6D, involved in the method of forming the memory cell array of the semiconductor device of FIGS. 1, 2A, 2B, and 2C.
Figure 7C:
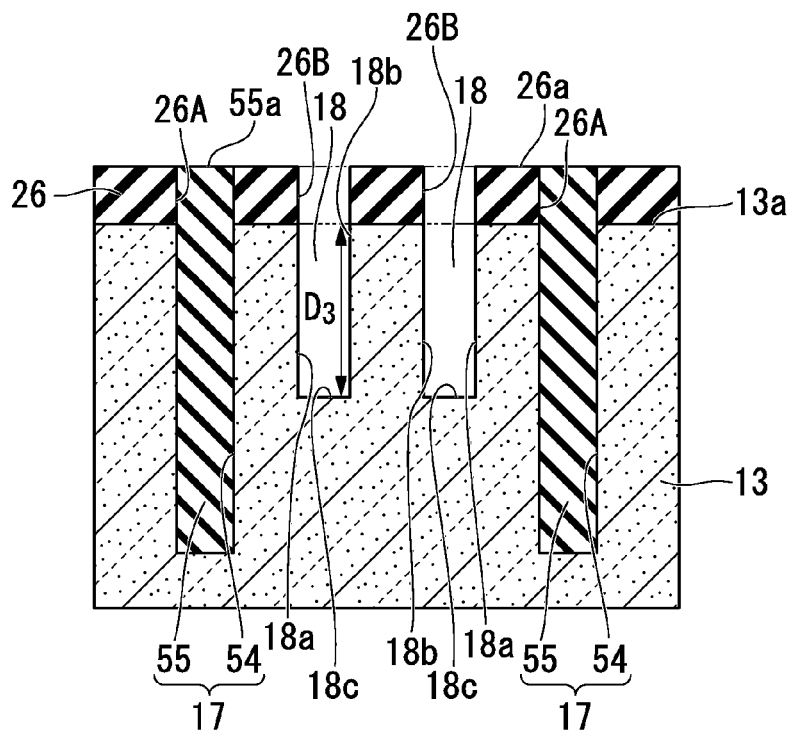
FIG. 7C is a fragmentary cross sectional elevation view, taken along a B-B line of FIG. 7A, of the step, subsequent to the step of FIGS. 6A, 6B, 6C and 6D, involved in the method of forming the memory cell array of the semiconductor device of FIGS. 1, 2A, 2B, and 2C.
Figure 7D:
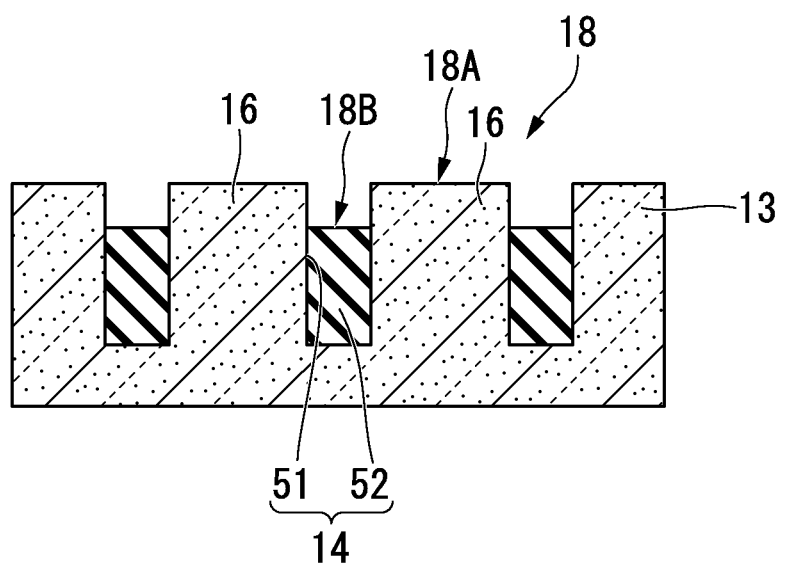
FIG. 7D is a fragmentary cross sectional elevation view, taken along a C-C line of FIG. 7A, of the step, subsequent to the step of FIGS. 6A, 6B, 6C and 6D, involved in the method of forming the memory cell array of the semiconductor device of FIGS. 1, 2A, 2B, and 2C.

Next, as shown in FIG. 7D, first, the element isolation insulating film 52 that forms the first element isolation region 14 is selectively etched by anisotropic etching (specifically, dry etching) using the mask insulating film 26 having the opening 26B as a mask. Thereby, the second groove portion 18B of the gate electrode groove 18 is formed in the first element isolation region 14. In this case, the second groove portion 18B is formed such that a depth $D_4$ thereof (depth from the main surface 13a of the semiconductor substrate 13 (not shown in the drawings)) is less than the depths $D_1$ and $D_2$ of the first and second element isolation grooves 51 and 54. Specifically, the depth $D_4$ of the second groove portion 18B may be set in a range of 150 to 200 nm when the depths $D_1$ and $D_2$ of the first and second element isolation grooves 51 and 54 are 250 nm.

Next, the semiconductor substrate 13 that forms the active region 16 is selectively etched. Thereby, the first groove portion 18A of the gate electrode groove 18 is formed in the active region 16. In this case, the first groove portion 18A is formed such that a depth $D_3$ thereof (depth from the main surface 13a of the semiconductor substrate 13) is less than the depth $D_4$ of the second groove portion 18B. Specifically, the first groove portion 18A is formed such that the depth $D_3$ thereof is less than the depth $D_4$ of the second groove portion 18B by 10 to 40 nm. The depth $D_4$ of the gate electrode groove 18 may be set to 150 nm when the depths $D_1$ and $D_2$ of the first and second element isolation grooves 51 and 54 are 250 nm.

Next, in the processes shown in FIGS. 8A to 8D, the portion of the first groove portion 18A forming the gate electrode groove 18 facing the second groove portion 18B is selectively etched by isotropic etching (specifically, dry wet etching) using the mask insulating film 26 having the opening 26B as a mask, until the depth of the portion becomes almost equal to the depth of the second groove portion 18B.

Figure 8A:
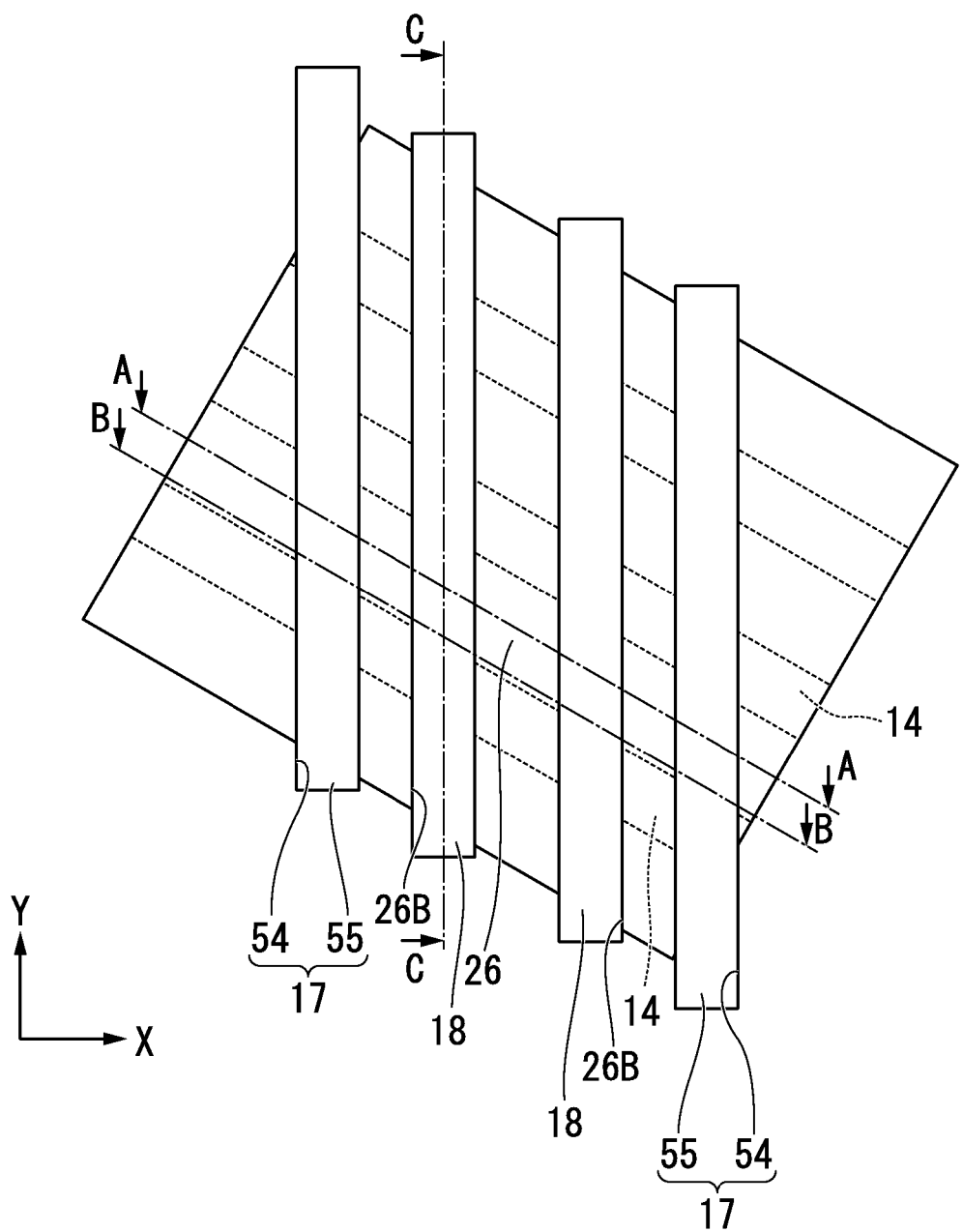
FIG. 8A is a fragmentary plan view of a step, subsequent to the step of FIGS. 7A, 7B, 7C and 7D, involved in a method of forming a memory cell array of the semiconductor device of FIGS. 1, 2A, 2B, and 2C.
Figure 8B:
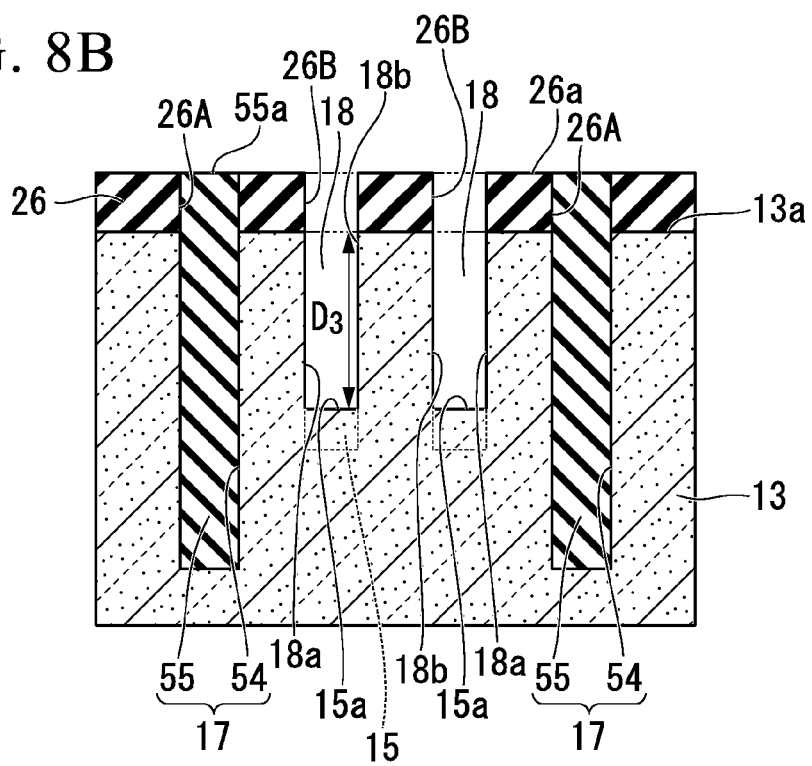
FIG. 8B is a fragmentary cross sectional elevation view, taken along an A-A line of FIG. 8A, of the step, subsequent to the step of FIGS. 7A, 7B, 7C and 7D, involved in the method of forming the memory cell array of the semiconductor device of FIGS. 1, 2A, 2B, and 2C.
Figure 8C:
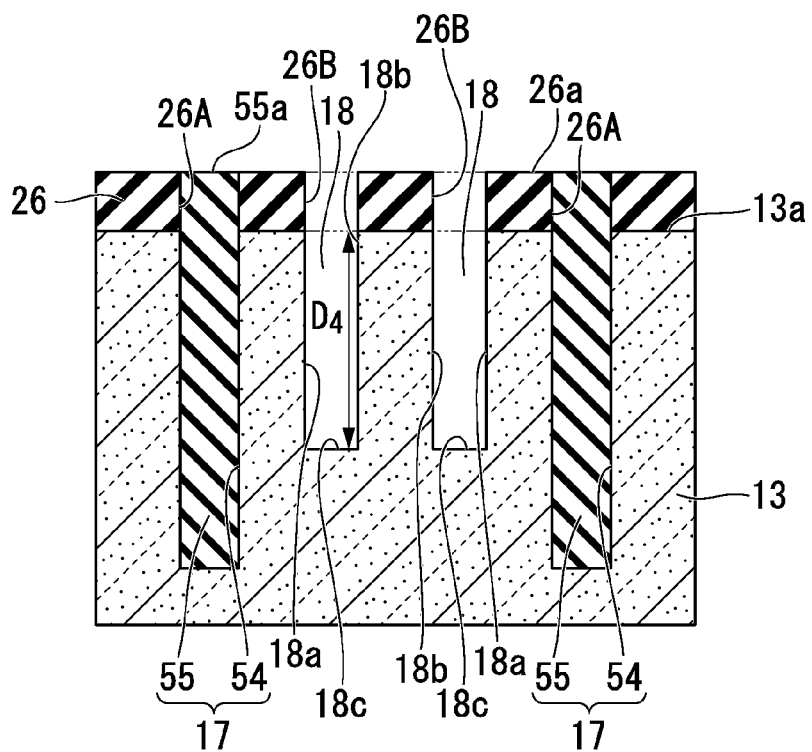
FIG. 8C is a fragmentary cross sectional elevation view, taken along a B-B line of FIG. 8A, of the step, subsequent to the step of FIGS. 7A, 7B, 7C and 7D, involved in the method of forming the memory cell array of the semiconductor device of FIGS. 1, 2A, 2B, and 2C.
Figure 8D:
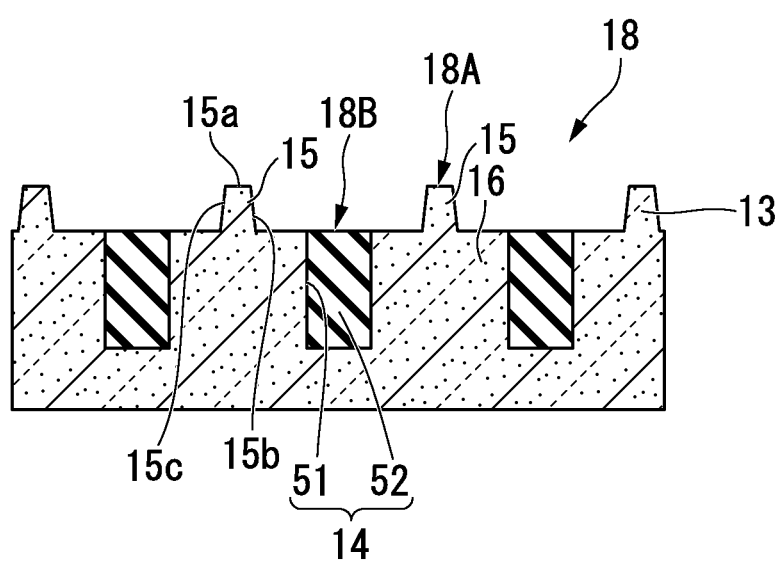
FIG. 8D is a fragmentary cross sectional elevation view, taken along a C-C line of FIG. 8A, of the step, subsequent to the step of FIGS. 7A, 7B, 7C and 7D, involved in the method of forming the memory cell array of the semiconductor device of FIGS. 1, 2A, 2B, and 2C.

In this way, the first groove portion 18A of the gate electrode groove 18 that is formed in the active region 16 may be formed such that the depth of the end facing the second groove portion 18B becomes equal to the depth (that is, $D_4$) of the second groove portion 18B (refer to FIGS. 8C and 8D). Meanwhile, the first groove portion 18A may be formed such that the depth of the center portion becomes $D_3$ (refer to FIGS. 8B and 8D). That is, the gate electrode groove 18 that has the first and second sides 18a and 18b and the bottom portion 18c and the fin portion 15 that is provided such that a part of the active region 16 protrudes from the bottom portion 18c may be formed.

Next, in the processes shown in FIGS. 9A to 9D, the gate insulating film 21 that covers the surfaces of each gate electrode groove 18 (that is, the first and second sides 18a and 18b and the bottom portion 18c of the gate electrode groove 18) and the surface of the fin portion 15 (that is, the upper portion 15a and the pair of facing sides 15b and 15c) is formed.

As the gate insulating film 21, a silicon oxide film ($SiO_2$ film) of a single layer, a silicon oxynitride film (SiON film), a stacked silicon oxide film ($SiO_2$ film), and a stacked film obtained by stacking a silicon nitride film (SiN film) on a silicon oxide film ($SiO_2$ film) may be used.

When the silicon oxide film ($SiO_2$ film) of the single layer is used as the gate insulating film 21, the gate insulating film 21 may be formed by a heat oxidation method. In this case, the thickness of the gate insulating film 21 may be set to 6 nm.

Figure 9A:
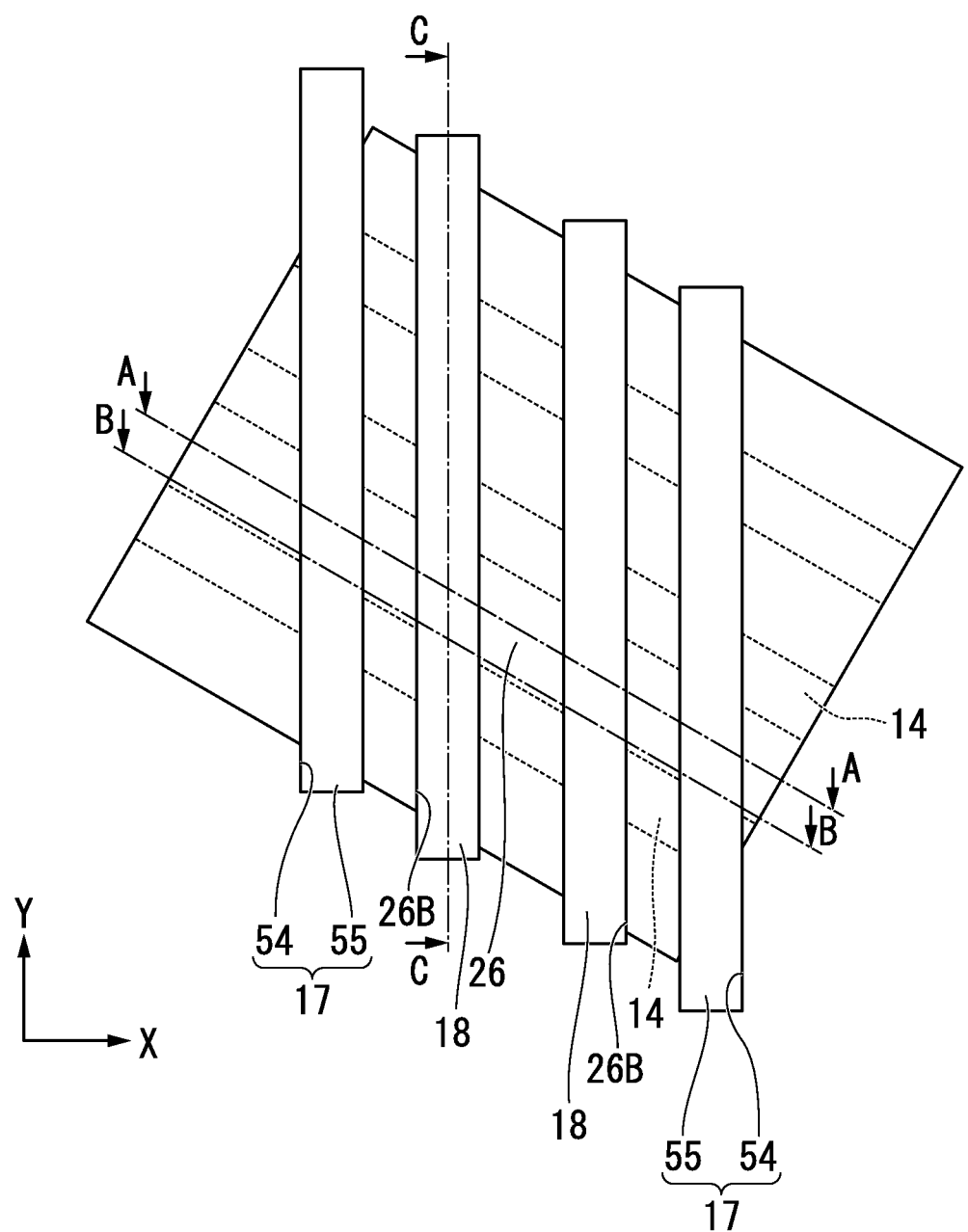
FIG. 9A is a fragmentary plan view of a step, subsequent to the step of FIGS. 8A, 8B, 8C and 8D, involved in a method of forming a memory cell array of the semiconductor device of FIGS. 1, 2A, 2B, and 2C.
Figure 9B:
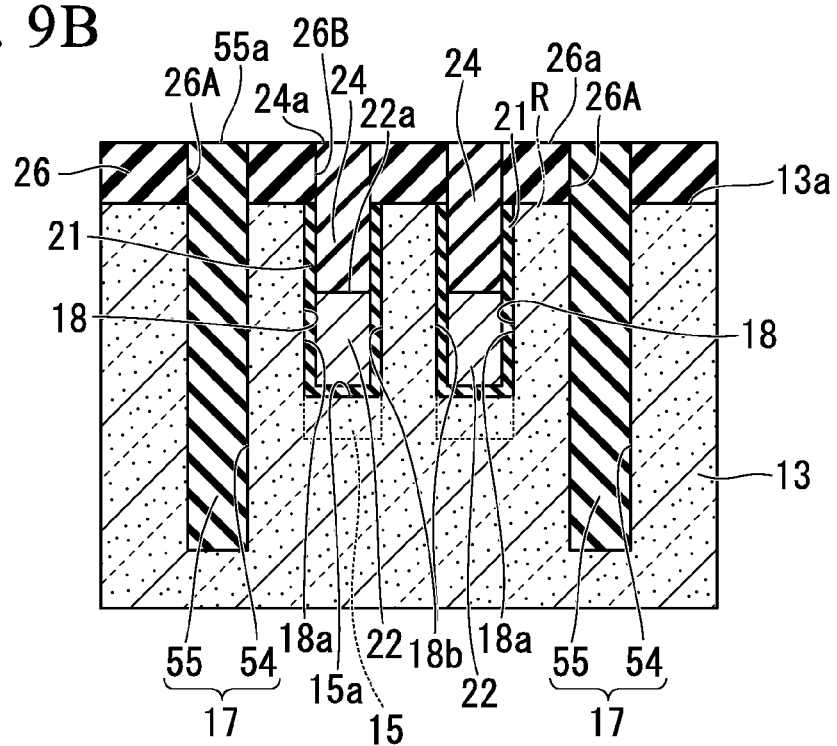
FIG. 9B is a fragmentary cross sectional elevation view, taken along an A-A line of FIG. 9A, of the step, subsequent to the step of FIGS. 8A, 8B, 8C and 8D, involved in the method of forming the memory cell array of the semiconductor device of FIGS. 1, 2A, 2B, and 2C.
Figure 9C:
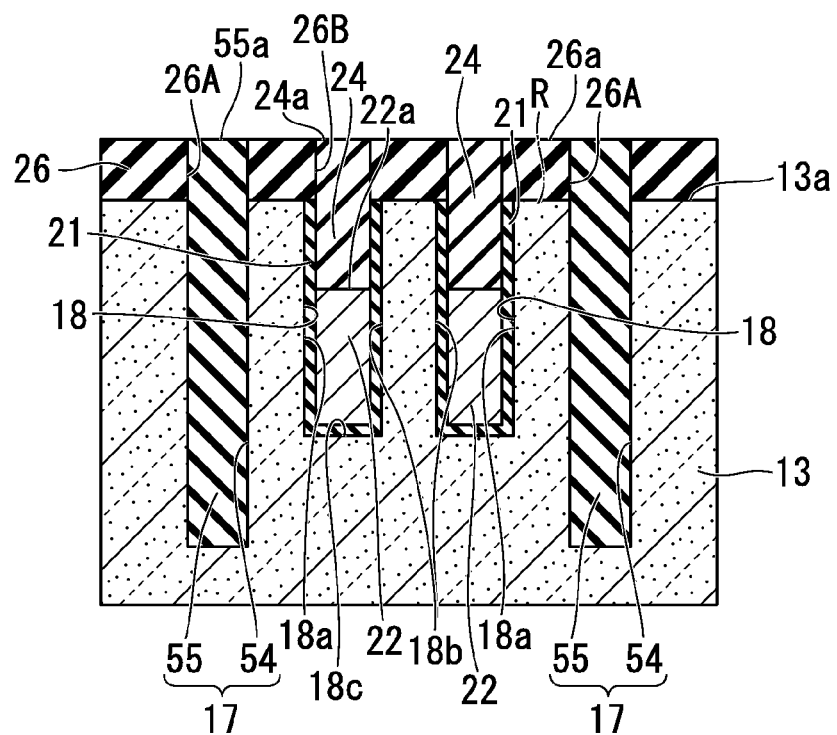
FIG. 9C is a fragmentary cross sectional elevation view, taken along a B-B line of FIG. 9A, of the step, subsequent to the step of FIGS. 8A, 8B, 8C and 8D, involved in the method of forming the memory cell array of the semiconductor device of FIGS. 1, 2A, 2B, and 2C.
Figure 9D:
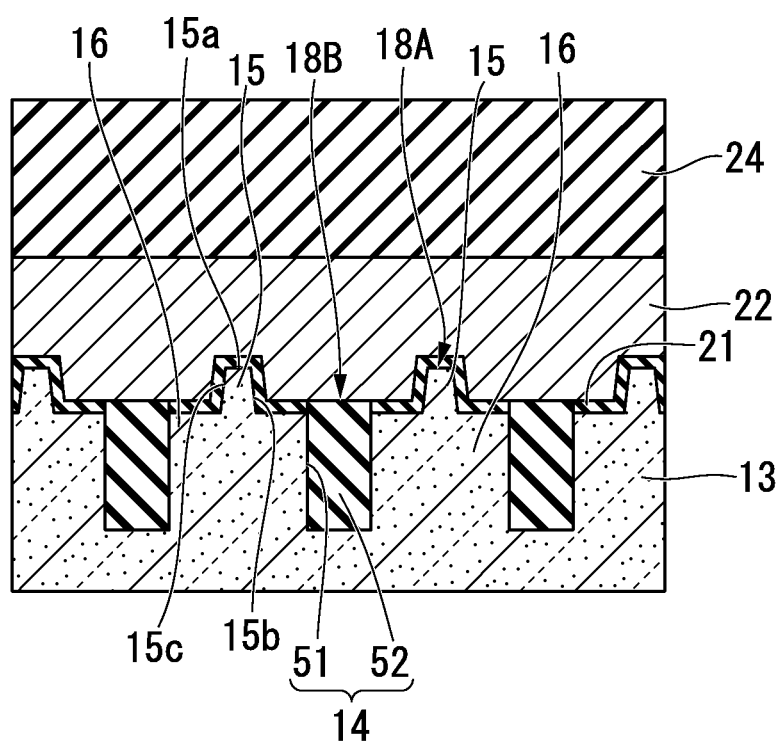
FIG. 9D is a fragmentary cross sectional elevation view, taken along a C-C line of FIG. 9A, of the step, subsequent to the step of FIGS. 8A, 8B, 8C and 8D, involved in the method of forming the memory cell array of the semiconductor device of FIGS. 1, 2A, 2B, and 2C.

Next, the gate electrode 22 that buries the lower portion of the gate electrode groove 18 to step over each fin portion 15 through the gate insulating film 21 is formed such that the top surface 22a becomes lower than the main surface 13a of the semiconductor substrate 13 (refer to FIG. 9D).

Specifically, a titanium nitride film and a tungsten film are sequentially stacked by a CVD method to bury the gate electrode groove 18. Next, the titanium nitride film and the tungsten film are blanket-etched by dry etching such that the titanium nitride film and the tungsten film remain on the lower portion of the gate electrode groove 18 and the gate electrode 22 that includes the titanium nitride film and the tungsten film is formed. Each gate electrode 22 forms a word line of the memory cell.

Next, the buried insulating film 24 that covers the top surface 22a of the gate electrode 22 and buries the gate electrode groove 18 and the opening 26B having the groove shape is formed.

Specifically, the upper portion of the gate electrode groove 18 and the opening 26B are buried by an insulating film (for example, silicon oxide film ($SiO_2$ film)) formed by an HDP method or a coating-based insulating film (for example, silicon oxide film ($SiO_2$ film)) formed by an SOG method.

Next, the insulating film that is formed on the upper side of the top surface 26a of the mask insulating film 26 is removed by a CMP method. Thereby, the buried insulating film 24 that is formed of the insulating film (for example, silicon oxide film ($SiO_2$ film)) burying the gate electrode groove 18 and the opening 26B and has the top surface 24a flush with the top surface 26a of the mask insulating film 26 is formed.

Because the saddle fin type gate electrode 22 that becomes the buried word line is formed by the processes shown in FIGS. 3D to 9D, the description of the cross-sectional views taken along the line C-C shown in FIGS. 3A to 9A is omitted.

Figure 10A:
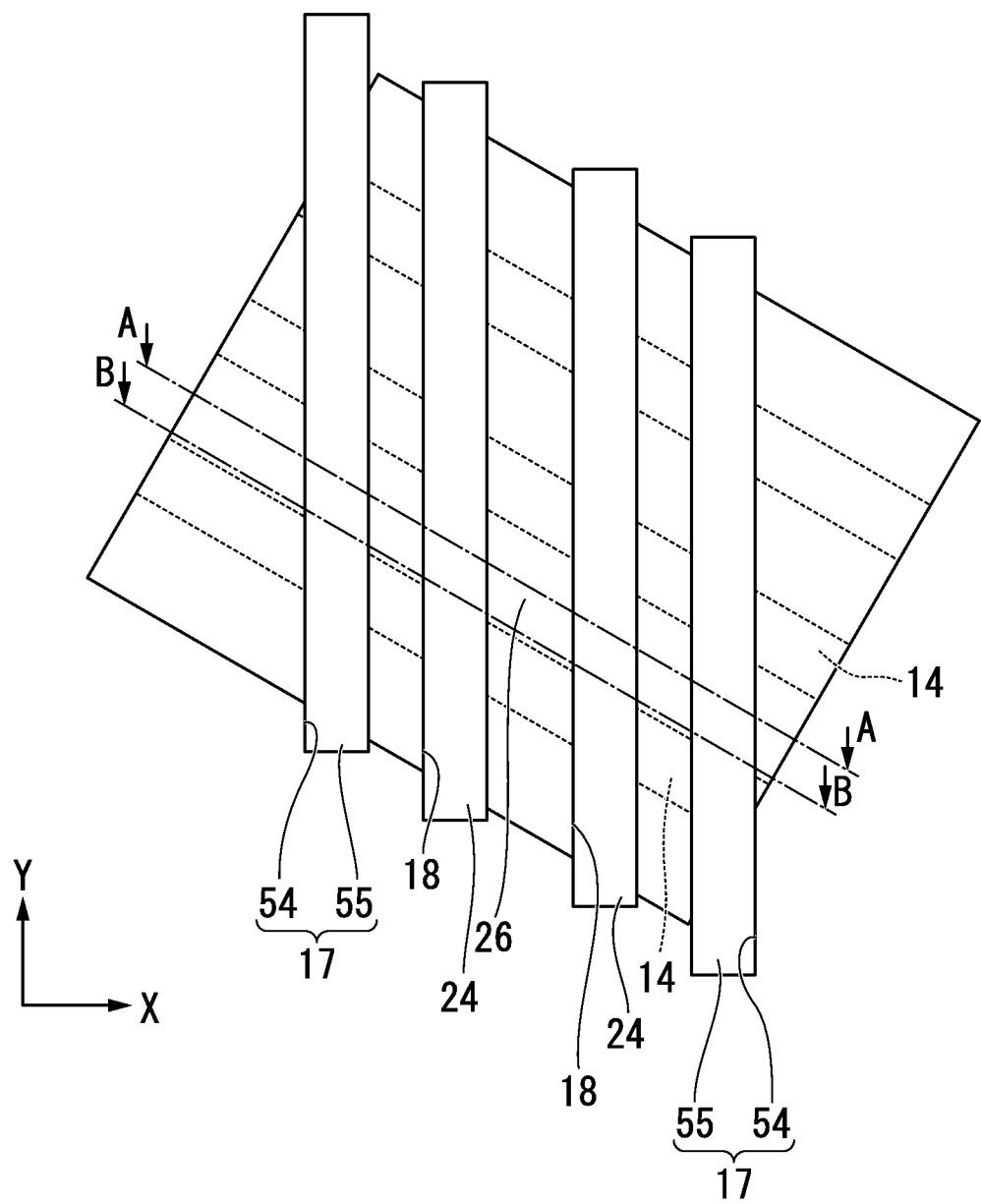
FIG. 10A is a fragmentary plan view of a step, subsequent to the step of FIGS. 9A, 9B, 9C and 9D, involved in a method of forming a memory cell array of the semiconductor device of FIGS. 1, 2A, 2B, and 2C.
Figure 10B:
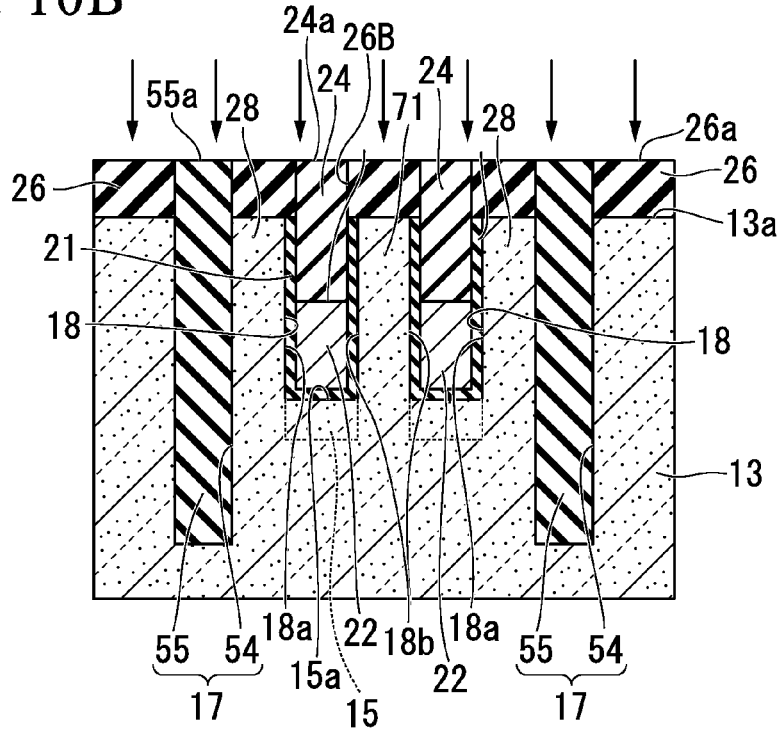
FIG. 10B is a fragmentary cross sectional elevation view, taken along an A-A line of FIG. 10A, of the step, subsequent to the step of FIGS. 9A, 9B, 9C and 9D, involved in the method of forming the memory cell array of the semiconductor device of FIGS. 1, 2A, 2B, and 2C.
Figure 10C:
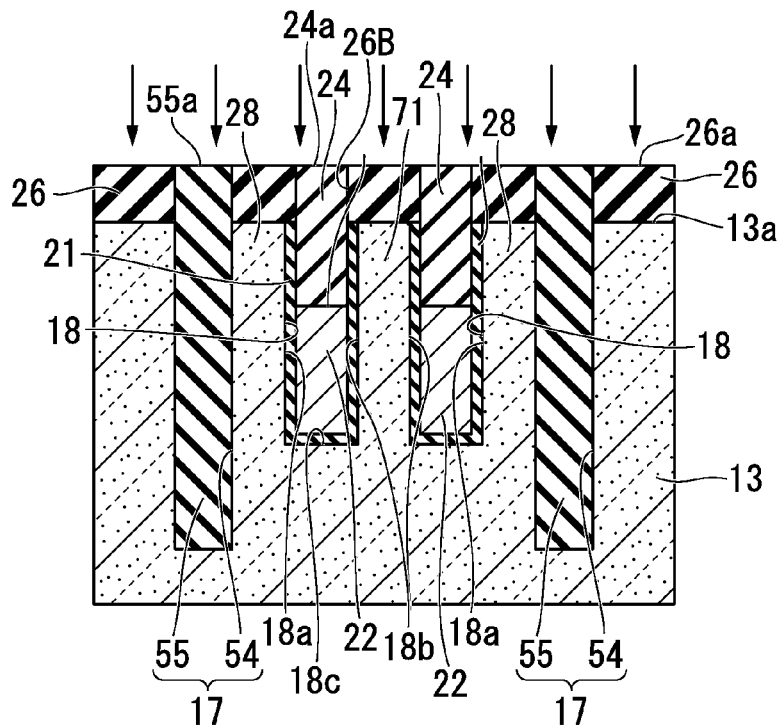
FIG. 10C is a fragmentary cross sectional elevation view, taken along a B-B line of FIG. 10A, of the step, subsequent to the step of FIGS. 9A, 9B, 9C and 9D, involved in the method of forming the memory cell array of the semiconductor device of FIGS. 1, 2A, 2B, and 2C.

Next, in the processes shown in FIGS. 10A to 10C, phosphorus (P) is ion-implanted as an n-type impurity (conductive impurity different from a p-type silicon substrate to be the semiconductor substrate 13) into an entire top surface of the structure shown in FIGS. 9A to 9C, under conditions in which energy is 100 KeV and a dose amount is 1E14 atoms/cm$^2$, the first impurity diffusion region 28 is formed in the semiconductor substrate 13 positioned between the gate electrode groove 18 and the first element isolation region 17, and the impurity diffusion region 71 that becomes a part of the second impurity diffusion region 29 is formed in the semiconductor substrate 13 positioned between the two gate electrode grooves 18.

Thereby, the first impurity diffusion region 28 is formed in the semiconductor substrate 13 positioned at the side of the first side 18a of the gate electrode groove 18 to cover the upper portion 21A of the gate insulating film 21 formed on the first side 18a.

At this time, the first impurity diffusion region 28 is formed to include the top surface 13a of the semiconductor substrate 13 interposed between the first side 18a and the second element isolation groove 54 and have the bottom surface 28b at a position higher than the top surface 22a of the buried gate electrode 22.

In this step, the thickness of the mask insulating film 26 may be set to 50 nm.

Figure 11A:
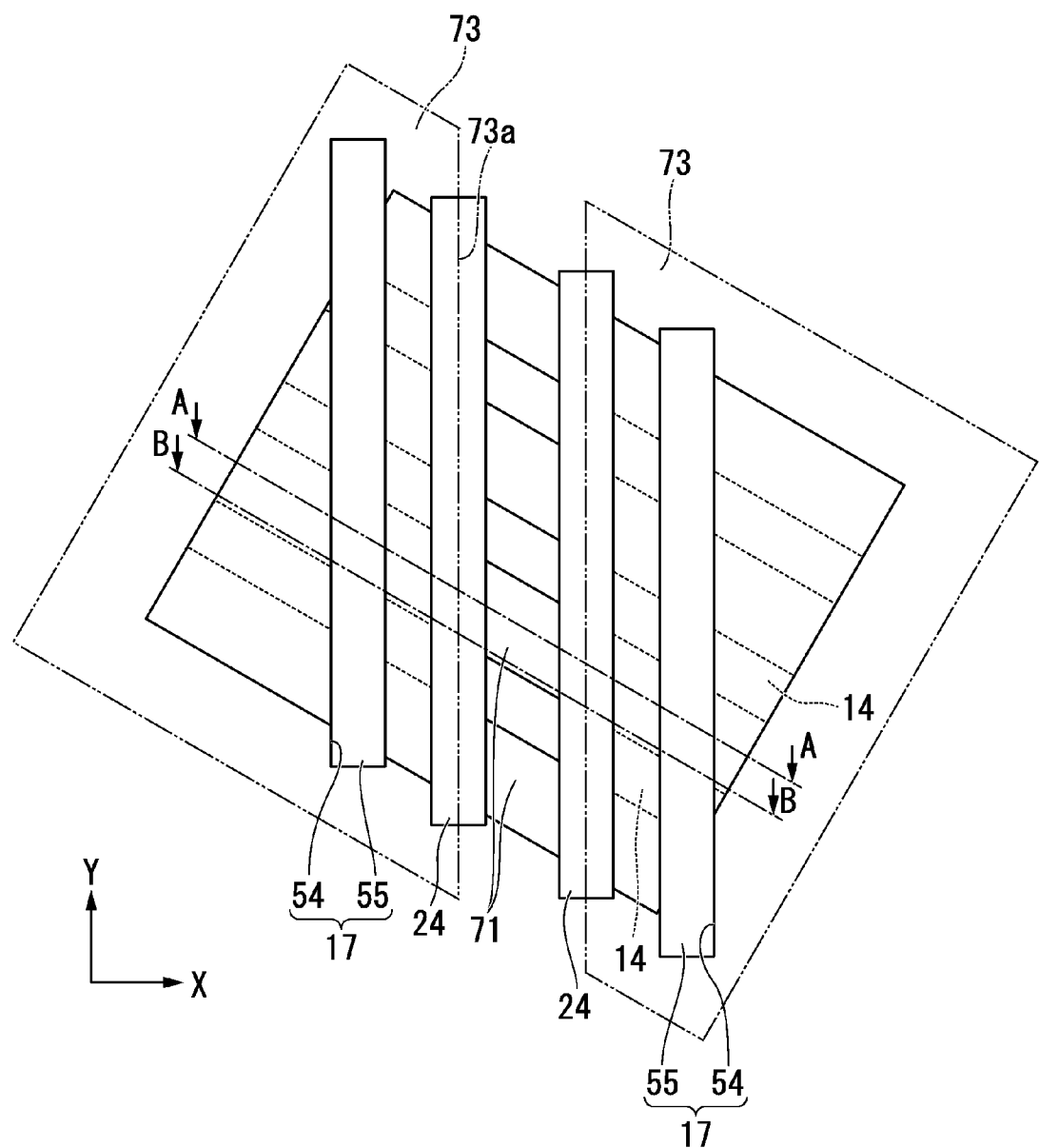
FIG. 11A is a fragmentary plan view of a step, subsequent to the step of FIGS. 10A, 10B, and 10C, involved in a method of forming a memory cell array of the semiconductor device of FIGS. 1, 2A, 2B, and 2C.
Figure 11B:
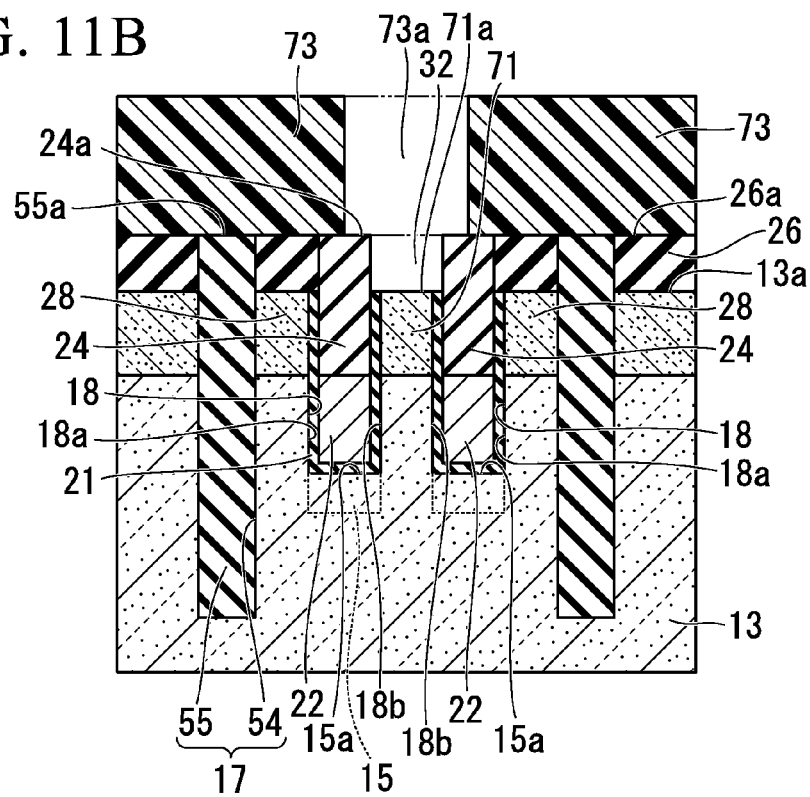
FIG. 11B is a fragmentary cross sectional elevation view, taken along an A-A line of FIG. 11A, of the step, subsequent to the step of FIGS. 10A, 10B, and 10C, involved in the method of forming the memory cell array of the semiconductor device of FIGS. 1, 2A, 2B, and 2C.
Figure 11C:
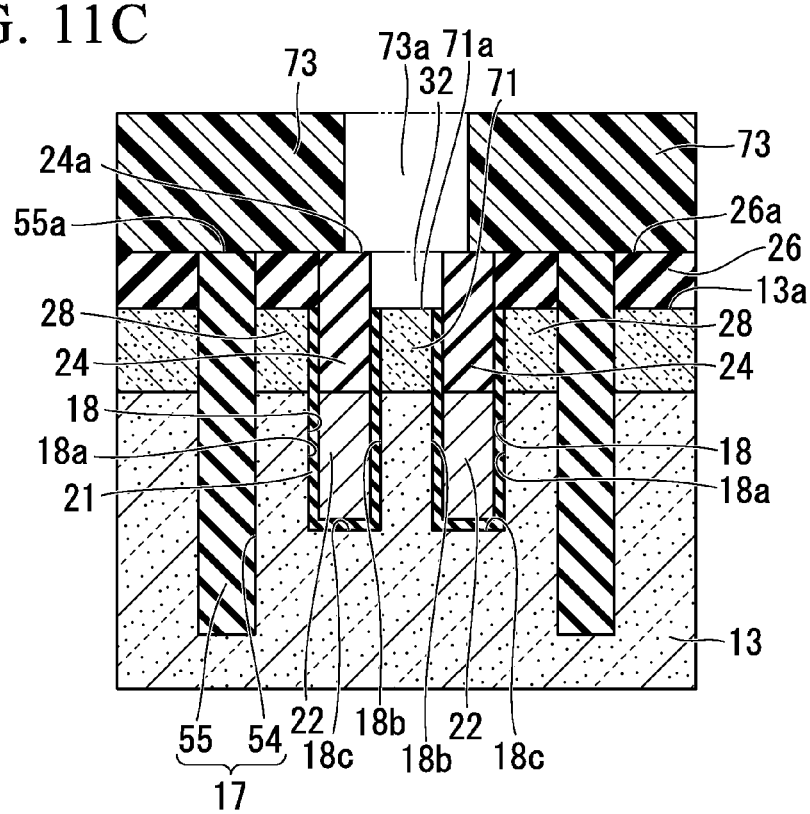
FIG. 11C is a fragmentary cross sectional elevation view, taken along a B-B line of FIG. 11A, of the step, subsequent to the step of FIGS. 10A, 10B, and 10C, involved in the method of forming the memory cell array of the semiconductor device of FIGS. 1, 2A, 2B, and 2C.

Next, in the processes shown in FIGS. 11A to 11C, a photoresist 73 that has an opening 73a of the groove shape exposing the top surface 26a of the mask insulating film 26 positioned between the buried insulating films 24 is formed on the top surface 24a of the buried insulating film 24, the top surface 26a of the mask insulating film 26, and the top surface 55a of the second element isolation insulating film 55.

Next, the mask insulating film 26 that is exposed from the opening 73a is removed by the etching (wet etching or dry etching) using the photoresist 73 as a mask.

Thereby, the top surface 71a of the impurity diffusion region 71 is exposed and a part of the top surface 52a of the first element isolation insulating film 52 that is flush with the top surface 71a of the impurity diffusion region 71 is exposed.

Figure 12A:
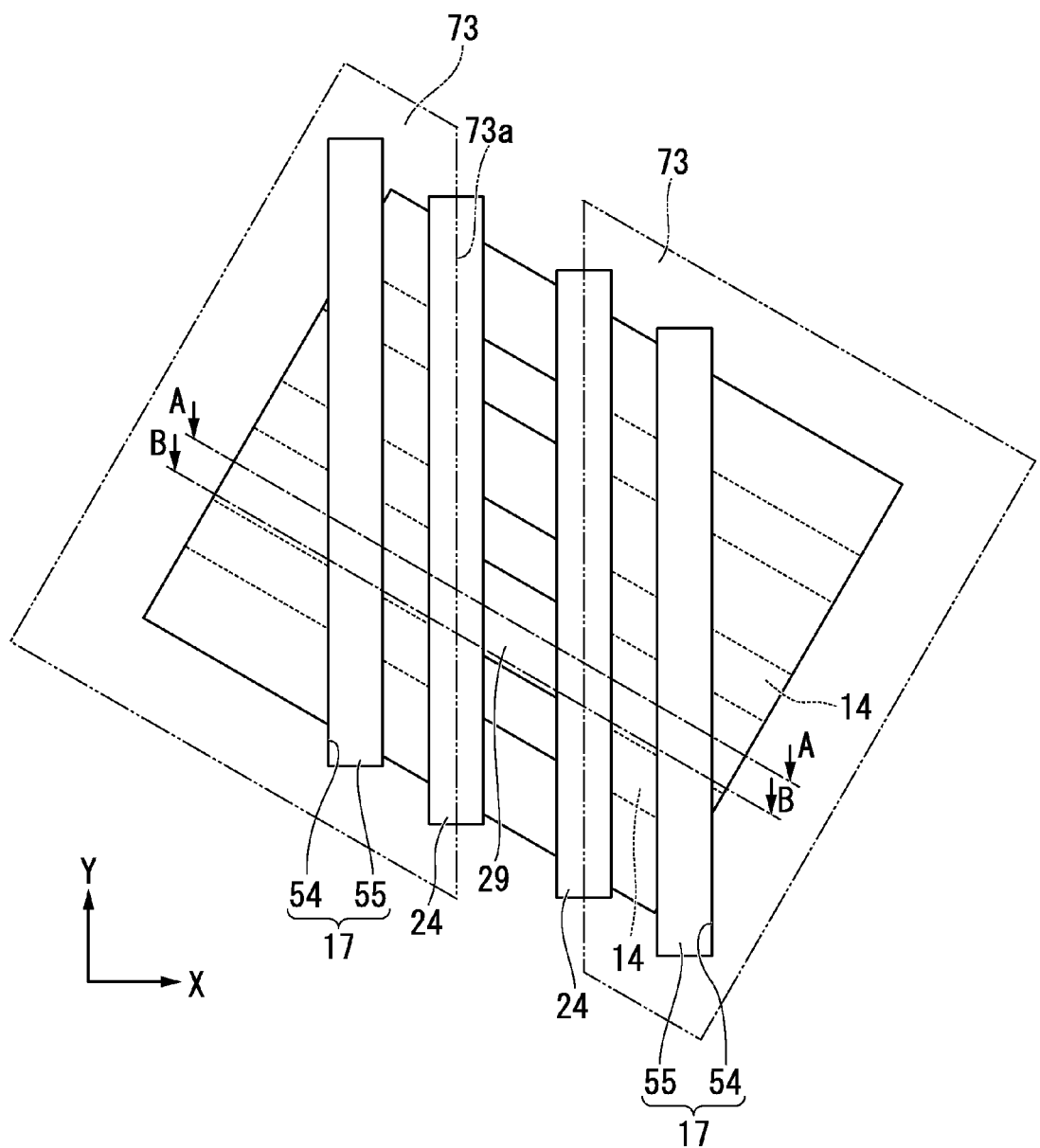
FIG. 12A is a fragmentary plan view of a step, subsequent to the step of FIGS. 11A, 11B, and 11C, involved in a method of forming a memory cell array of the semiconductor device of FIGS. 1, 2A, 2B, and 2C.
Figure 12B:
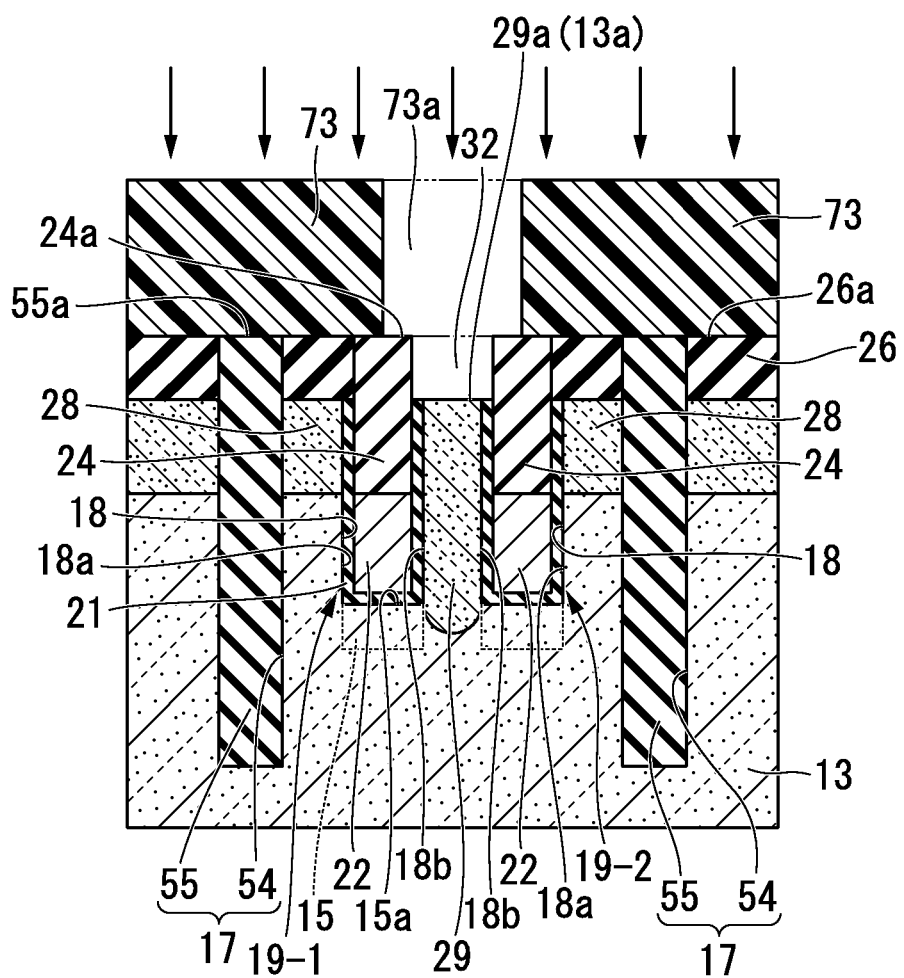
FIG. 12B is a fragmentary cross sectional elevation view, taken along an A-A line of FIG. 12A, of the step, subsequent to the step of FIGS. 11A, 11B, and 11C, involved in the method of forming the memory cell array of the semiconductor device of FIGS. 1, 2A, 2B, and 2C.
Figure 12C:
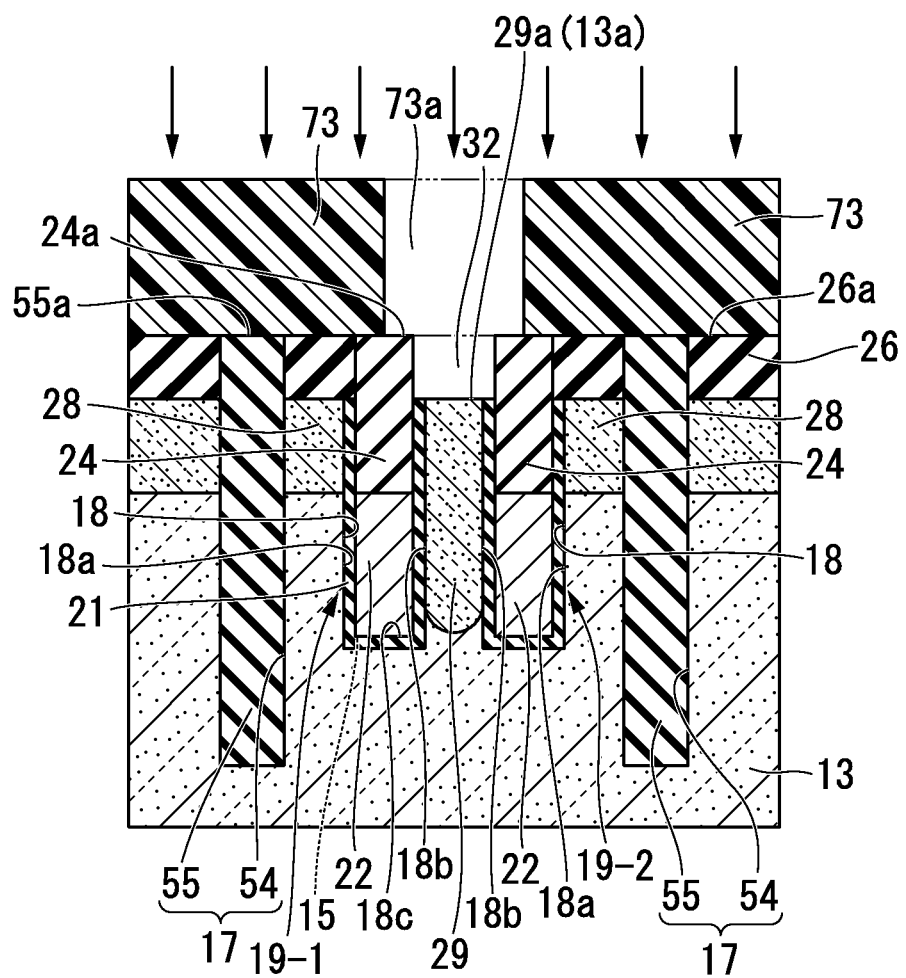
FIG. 12C is a fragmentary cross sectional elevation view, taken along a B-B line of FIG. 12A, of the step, subsequent to the step of FIGS. 11A, 11B, and 11C, involved in the method of forming the memory cell array of the semiconductor device of FIGS. 1, 2A, 2B, and 2C.

Next, in the processes shown in FIGS. 12A to 12C, phosphorus (P) is selectively ion-implanted as an n-type impurity (conductive impurity different from a p-type silicon substrate as the semiconductor substrate 13) into the impurity diffusion region 71 (in other words, the semiconductor substrate 13 where the impurity diffusion region 71 is formed) exposed from the photoresist 73, and the second impurity diffusion region 29 is formed in the semiconductor substrate 13 positioned between the two gate electrode grooves 18, such that the depth of the bottom portion becomes the depth between the top portion of the top surface 15a of the fin portion 15 and the bottom portion 18c of the gate electrode groove 18. In the ion implantation, after the first ion implantation is performed under conditions in which energy is 15 KeV and a dose amount is 5E14 atoms/cm$^2$, the second ion implantation is performed under conditions in which energy is 30 KeV and a dose amount is 2E13 atoms/cm$^2$ (implantation in two steps).

Thereby, the second impurity diffusion region 29 is formed to cover all of the portions other than the lower end of the gate insulating film 21 provided on the second side 18b of each of the two gate electrode grooves 18 and the first and second transistors 19-1 and 19-2 that include the gate insulating film 21, the fin portion 15, the gate electrode 22, the buried insulating film 24, the first impurity diffusion region 28, and the second impurity diffusion region 29 are formed.

As such, the fin portion 15 is provided in the bottom portion 18c of the gate electrode groove 18 and the first impurity diffusion region 28 that includes the top surface 13a of the semiconductor substrate 13 interposed between the first side 18a and the second element isolation groove 54 and covers the upper portion 21A of the gate insulating film 21 arranged on the first side 18a and the second impurity diffusion region 29 that is arranged on the portion of the semiconductor substrate 13 positioned between the two gate electrode grooves 18 and covers all of the portions other than the lower end of the gate insulating film 21 arranged on the second side 18b of each of the pair of gate electrode grooves 18 are provided. Thereby, when the first and second transistors 19-1 and 19-2 are operated, the first channel region is formed in the fin portion 15, the second channel region is formed in the portions of the semiconductor substrate 13 that contacts the lower portion of the gate insulating film 21 arranged on the first side 18a, contacts the bottom portion 18c of the gate electrode groove 18, and is positioned at the lower side of the bottom portion of the second impurity diffusion region 29 arranged on the second side 18b, and the channel region is not provided in the portion of the semiconductor substrate 13 that contacts the second side 18b and is positioned at the upper side of the bottom portion of the second impurity diffusion region 29.

In other words, when the first and second transistors 19-1 and 19-2 are turned on, the fin portion 15 is fully depleted. Therefore, in the first and second transistors 19-1 and 19-2, the resistance becomes low and the current can easily flow, as compared with the transistors according to the related art.

Thereby, in a miniaturized memory cell, the channel resistance may be decreased and the on-state current may be increased.

When one of the first and second transistors 19-1 and 19-2 is operated, the other transistor may be suppressed from being erroneously operated.

Therefore, even when the size of the semiconductor device 10 is decreased and the gate electrodes 22 are arranged at a narrow pitch, the first and second transistors 19-1 and 19-2 may be operated independently and stably.

The fin portion 15 is provided in the bottom portion 18c of each of the two gate electrode grooves 18 arranged to be adjacent to each other and the depth H of the fin portion 15 is set to 40 nm or less. Thus, in the state in which "L" is stored in the lower electrode 57 electrically connected to the first transistor 19-1 and "H" is stored in the lower electrode 57 electrically connected to the second transistor 19-2, when on/off of the gate electrode 22 (word line) corresponding to the first transistor 19-1 is repeated, the fin portion 15 becoming the channel region of the first transistor 19-1 is a p-type and it becomes difficult to induce the electrons e⁻ (not shown in the drawings). For this reason, the electrons e⁻ induced in the channel of the first transistor 19-1 may be suppressed from reaching the second impurity diffusion region 28 (drain region) forming the second transistor 19-2.

Thereby, the electrons e⁻ induced in the channel of the first transistor 19-1 may be prevented from destroying H information stored in the lower electrode 57 electrically connected to the second transistor 19-2 to change the state to the L state. Therefore, generation of the disturbance failure in which the operation state of one adjacent cell changes a storage state of the other cell may be suppressed.

In the DRAM in which the interval between the two gate electrodes 22 arranged to be adjacent to each other is 50 nm or less, the generation of the disturbance failure may be suppressed.

Figure 13A:
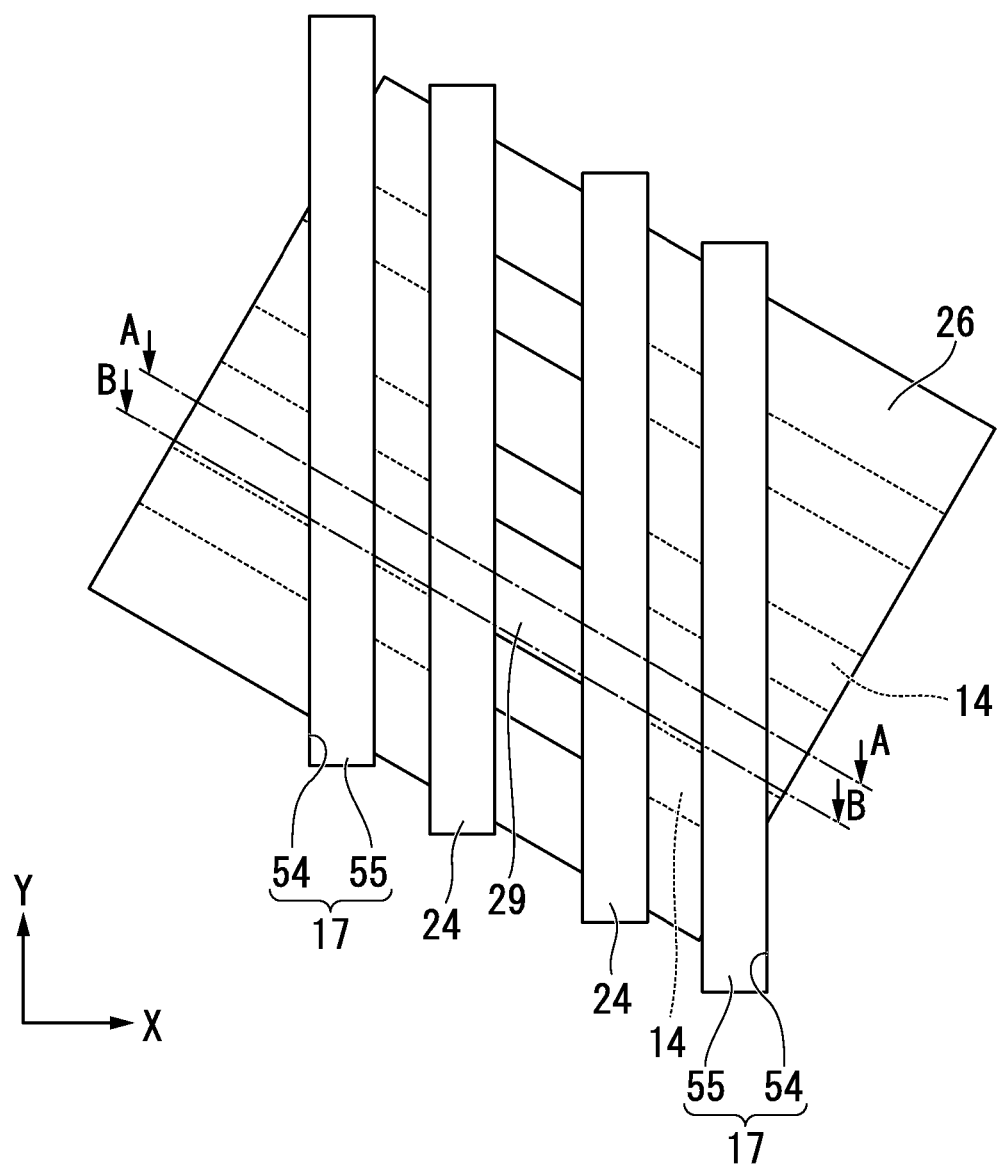
FIG. 13A is a fragmentary plan view of a step, subsequent to the step of FIGS. 12A, 12B, and 12C, involved in a method of forming a memory cell array of the semiconductor device of FIGS. 1, 2A, 2B, and 2C.
Figure 13B:
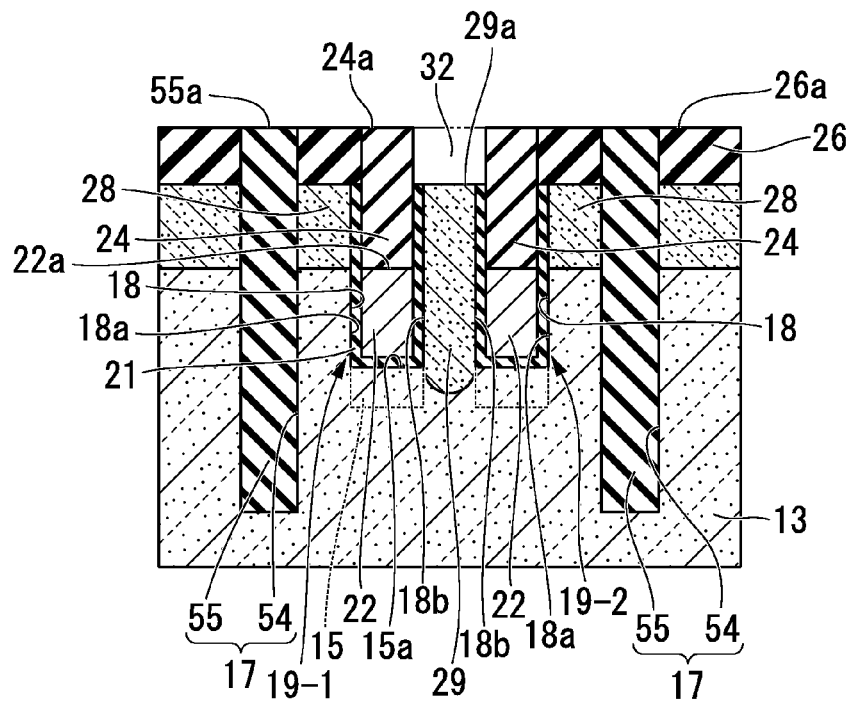
FIG. 13B is a fragmentary cross sectional elevation view, taken along an A-A line of FIG. 13A, of the step, subsequent to the step of FIGS. 12A, 12B, and 12C, involved in the method of forming the memory cell array of the semiconductor device of FIGS. 1, 2A, 2B, and 2C.
Figure 13C:
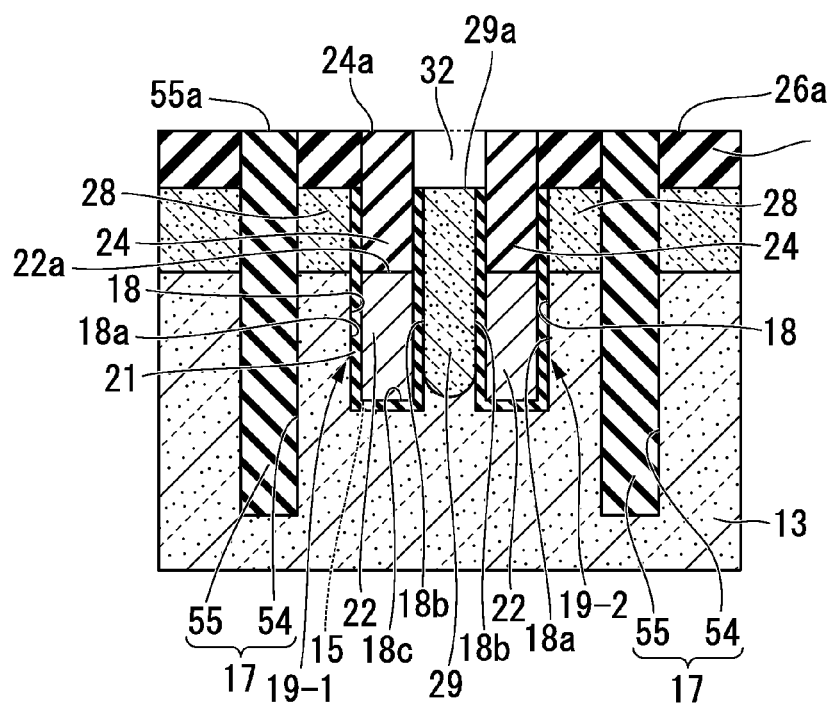
FIG. 13C is a fragmentary cross sectional elevation view, taken along a B-B line of FIG. 13A, of the step, subsequent to the step of FIGS. 12A, 12B, and 12C, involved in the method of forming the memory cell array of the semiconductor device of FIGS. 1, 2A, 2B, and 2C.

Next, in the processes shown in FIGS. 13A to 13C, the photoresist 73 shown in FIGS. 12A to 12C is removed.

Figure 14A:
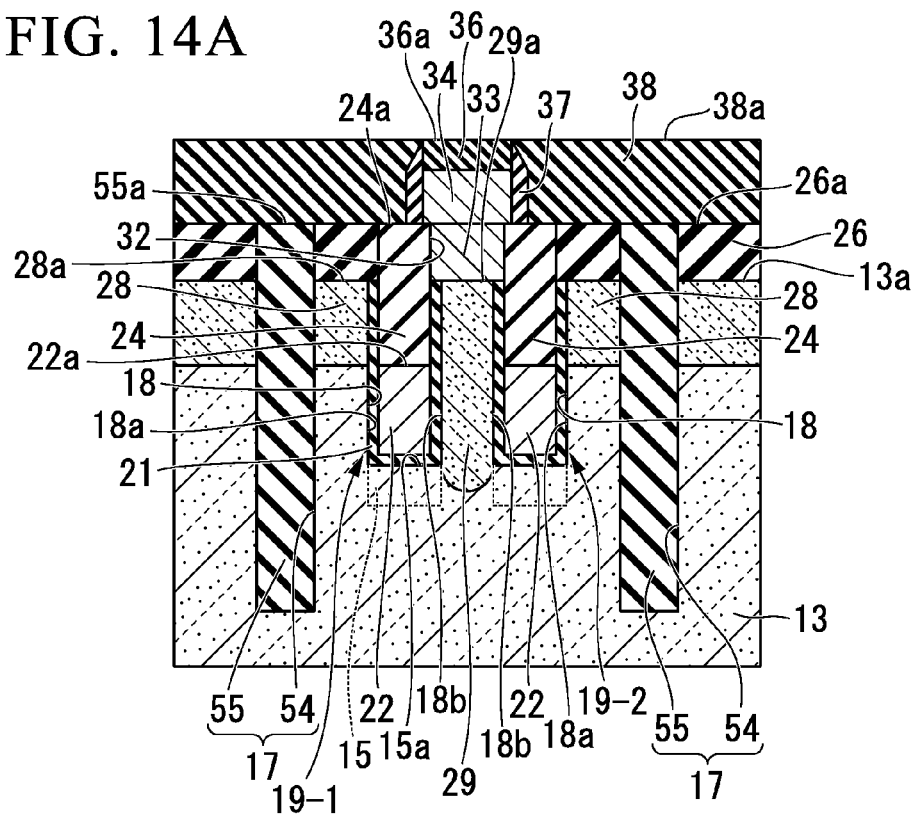
FIG. 14A is a fragmentary plan view of a step, subsequent to the step of FIGS. 13A, 13B, and 13C, involved in a method of forming a memory cell array of the semiconductor device of FIGS. 1, 2A, 2B, and 2C.
Figure 14B:
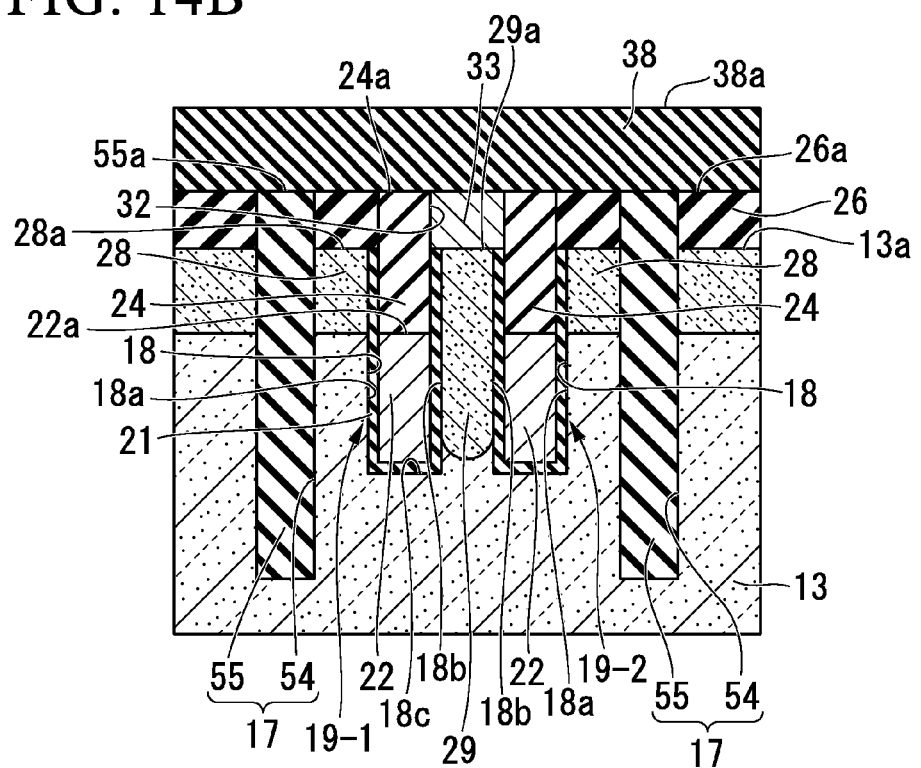
FIG. 14B is a fragmentary cross sectional elevation view, taken along an A-A line of FIG. 14A, of the step, subsequent to the step of FIGS. 13A, 13B, and 13C, involved in the method of forming the memory cell array of the semiconductor device of FIGS. 1, 2A, 2B, and 2C.

Next, in the processes shown in FIGS. 14A and 14B, the bit line contact plug 33 that buries the opening 32 and the bit line 34 (refer to FIG. 1) that is arranged on the bit line contact plug 33 and extends in the X direction are collectively formed.

Specifically, as shown in FIG. 14A, the polysilicon film, the titanium nitride film, and the tungsten film (not shown in the drawings) are sequentially formed (at this time, formed such that the polysilicon film buries the opening 32) on the top surface 24a of the buried insulating film 24 to bury the opening 32.

Next, a silicon nitride film (SiN film) (not shown in the drawings) that becomes a base material of the cap insulating film 36 is formed on the tungsten film (not shown in the drawings).

Next, a photoresist (not shown in the drawings) that covers a formation region of the bit line 34 is formed on the silicon nitride film (SiN film) using a photolithographic technique.

Next, the silicon nitride film (SiN film), the tungsten film, the titanium nitride film, and the polysilicon film are patterned by anisotropic etching (specifically, dry etching) using the photoresist as a mask, and the cap insulating film 36 that is formed of the silicon nitride film (SiN film), the bit line contact plug 33 that is formed of the polysilicon film and contacts the top surface 29a of the second impurity diffusion region 29, and the bit line 34 that is arranged on the bit line contact plug 33 and includes the polysilicon film, the titanium nitride film, and the tungsten film are collectively formed.

Next, the silicon nitride film (SiN film) and the silicon oxide film ($SiO_2$ film) (not shown in the drawings) are sequentially formed to cover the side of the bit line 34 and the cap insulating film 36. Next, the sidewall film 37 that covers the side of the cap insulating film 36 and the side of the bit line 34 is formed by etching the entire surfaces of the silicon oxide film ($SiO_2$ film) and the silicon nitride film (SiN film).

As such, when the sidewall film 37 is formed by sequentially stacking the silicon nitride film (SiN film) and the silicon oxide film ($SiO_2$ film) and the coating-based insulating film (specifically, silicon oxide film ($SiO_2$ film)) formed by an SOG method is formed as the interlayer insulating film 38, wettability of the silicon oxide film (coating-based insulating film) is improved. Therefore, a void may be suppressed from being generated in the silicon oxide film (coating-based insulating film).

Next, the interlayer insulating film 38 that covers the sidewall film 37 and has the top surface 38a flush with the top surface 36a of the cap insulating film 36 is formed on the top surface 24a of the buried insulating film 24, the top surface 26a of the mask insulating film 26, and the top surface 55a of the second element isolation insulating film 55. Thereby, the top surface 36a of the cap insulating film 36 is exposed from the interlayer insulating film 38.

Specifically, the coating-based insulating film (silicon oxide film ($SiO_2$ film)) that is formed by an SOG method is coated on the top surface 24a of the buried insulating film 24, the top surface 26a of the mask insulating film 26, and the top surface 55a of the second element isolation insulating film 55 to cover the sidewall film 37. Next, the silicon oxide film (coating-based insulating film) may be densified by performing the heat treatment.

When the silicon oxide film (coating-based insulating film) is formed by the SOG method, a coating liquid that contains polysilazane is used. The heat treatment may be performed under a water-vapor atmosphere.

Next, the silicon oxide film (coating-based insulating film) on which the heat treatment is performed is polished by a CMP method, until the top surface 36a of the cap insulating film 36 is exposed. Thereby, the interlayer insulating film 38 that has the top surface 38a flush with the top surface 36a of the cap insulating film 36 is formed.

In the structure shown in FIGS. 14A and 14B, although not shown in the drawings, the silicon oxide film ($SiO_2$ film) that covers the top surface 36a of the cap insulating film 36 and the top surface 38a of the interlayer insulating film 38 may be formed by a CVD method, after the silicon oxide film (coating-based insulating film) is polished.

Figure 15A:
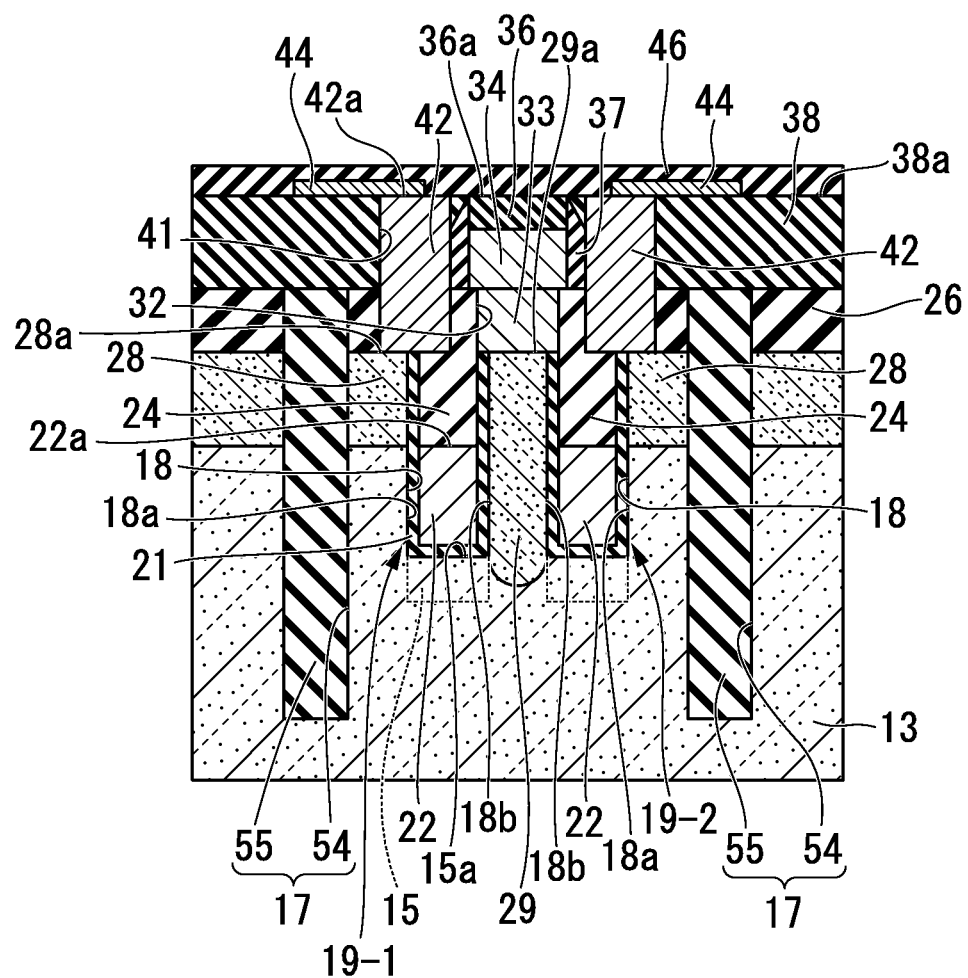
FIG. 15A is a fragmentary plan view of a step, subsequent to the step of FIGS. 14A, and 14B, involved in a method of forming a memory cell array of the semiconductor device of FIGS. 1, 2A, 2B, and 2C.
Figure 15B:
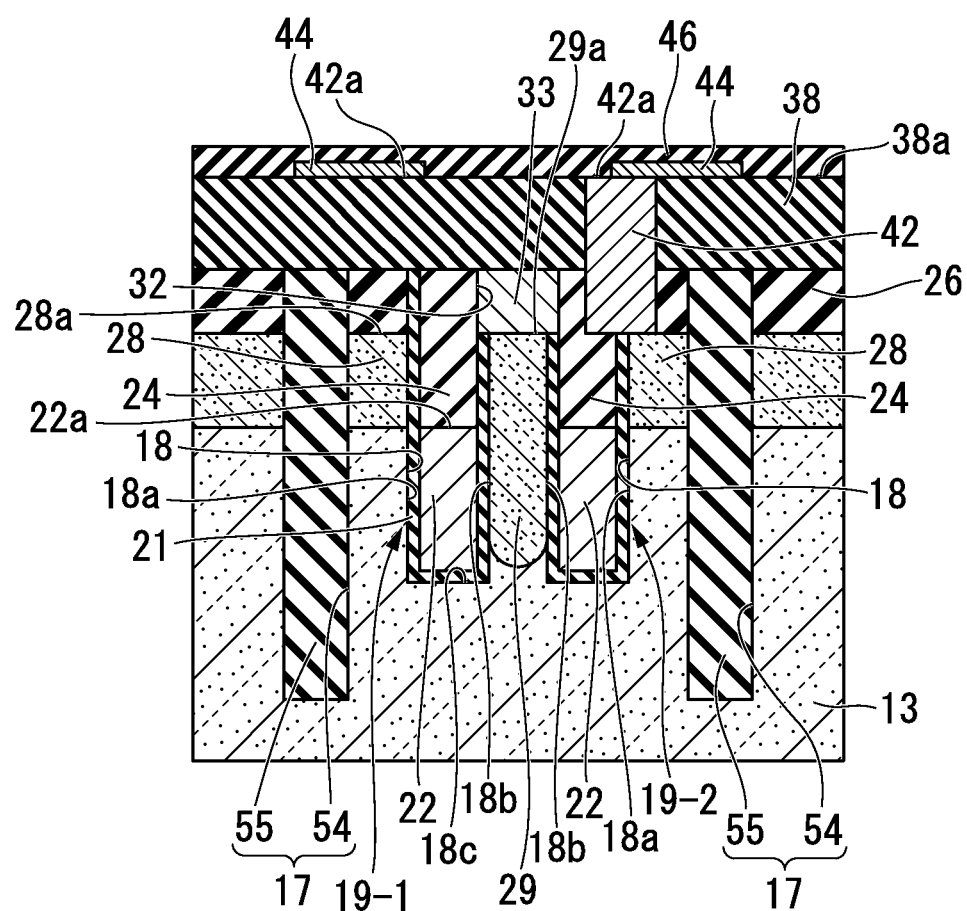
FIG. 15B is a fragmentary cross sectional elevation view, taken along an A-A line of FIG. 15A, of the step, subsequent to the step of FIGS. 14A, and 14B, involved in the method of forming the memory cell array of the semiconductor device of FIGS. 1, 2A, 2B, and 2C.

Next, in the processes shown in FIGS. 15A and 15B, by a self aligned contact (SAC) method, the interlayer insulating film 38, the mask insulating film 26, the buried insulating film 24, and the gate insulating film 21 are etched by anisotropic etching (specifically, dry etching) and the contact hole 41 that exposes a part of the top surface 28a of the first impurity diffusion region 28 is formed.

At this time, the dry etching is divided into a step of selectively etching the silicon oxide film ($SiO_2$ film) and a step of selectively etching the silicon nitride film (SiN film) and is performed.

Next, the capacitor contact plug 42 of which the top surface 42a is flush with the top surface 38a of the interlayer insulating film 38 and the lower end contacts the top surface 28*a* of the first impurity diffusion region 28 is formed in the contact hole 41.

Specifically, the titanium nitride film (not shown in the drawings) and the tungsten film (not shown in the drawings) are sequentially stacked by a CVD method to bury the contact hole 41. Next, the unnecessary titanium nitride film and tungsten film that are formed on the top surface 38*a* of the interlayer insulating film 38 are removed by polishing by a CMP method and the capacitor contact plug 42 that includes the titanium nitride film and the tungsten film is formed in the contact hole 41.

Next, the capacitor contact pad 44 that contacts a part of the top surface 42*a* of the capacitor contact plug 42 is formed on the top surface 38*a* of the interlayer insulating film 38.

Specifically, a metallic film (not shown in the drawings) that becomes a base material of the capacitor contact pad 44 is formed to cover the top surface 36*a* of the cap insulating film 36, the top surface 42*a* of the capacitor contact plug 42, and the top surface 38*a* of the interlayer insulating film 38.

Next, the photoresist (not shown in the drawings) that covers a surface corresponding to a formation region of the capacitor contact pad 44 in the top surface of the metallic film is formed on the silicon nitride film (SiN film) using a photolithographic technique. Next, the unnecessary metallic film that is exposed from the photoresist is removed by dry etching using the photoresist as a mask and the capacitor contact pad 44 that is formed of the metallic film is formed. After the capacitor contact pad 44 is formed, the photoresist (not shown in the drawings) is removed.

Next, the silicon nitride film 46 that covers the capacitor contact pad 44 is formed on the top surface 36*a* of the cap insulating film 36, the top surface 42*a* of the capacitor contact plug 42, and the top surface 38*a* of the interlayer insulating film 38.

Figure 16A:
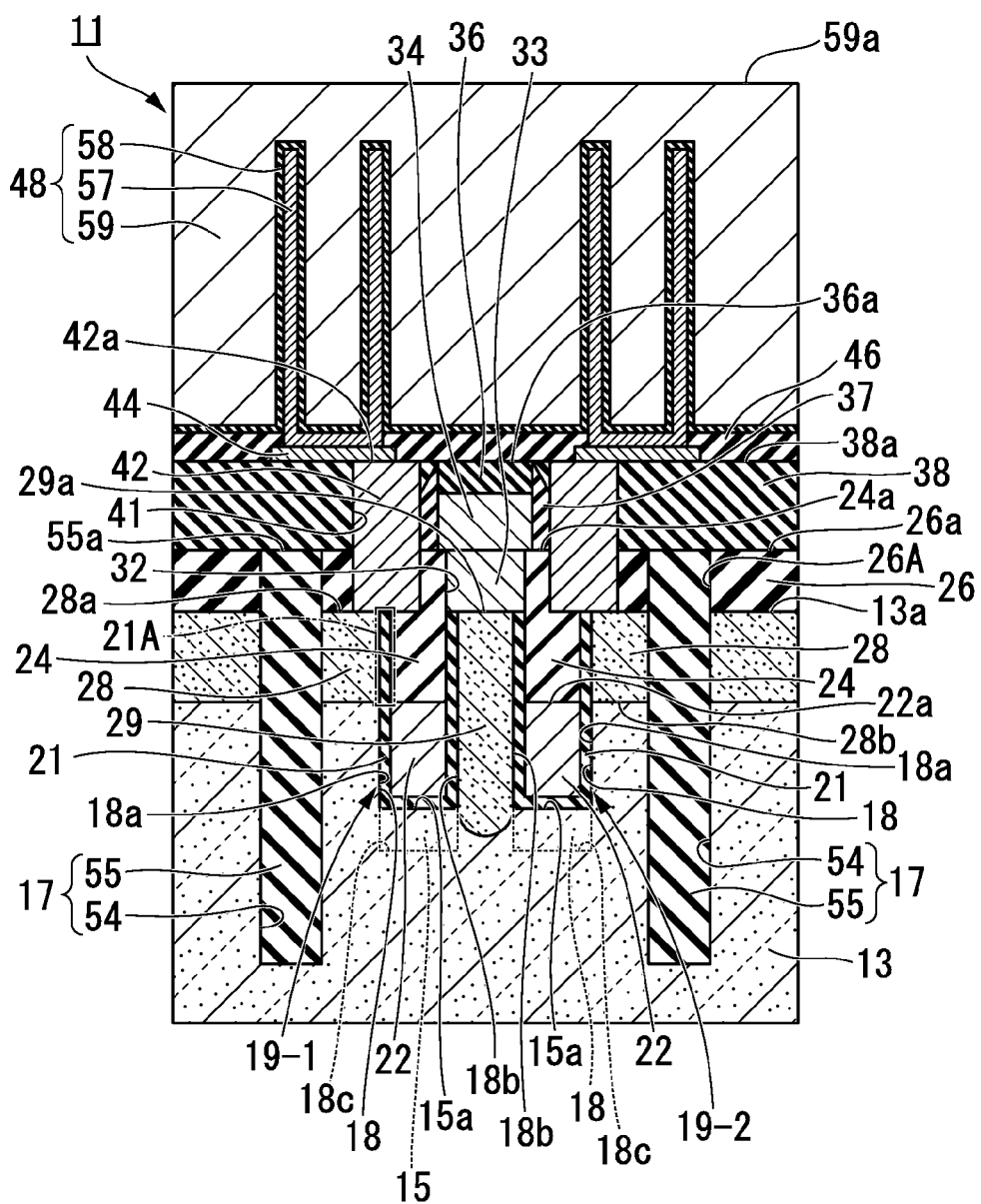
FIG. 16A is a fragmentary plan view of a step, subsequent to the step of FIGS. 15A, and 15B, involved in a method of forming a memory cell array of the semiconductor device of FIGS. 1, 2A, 2B, and 2C.
Figure 16B:
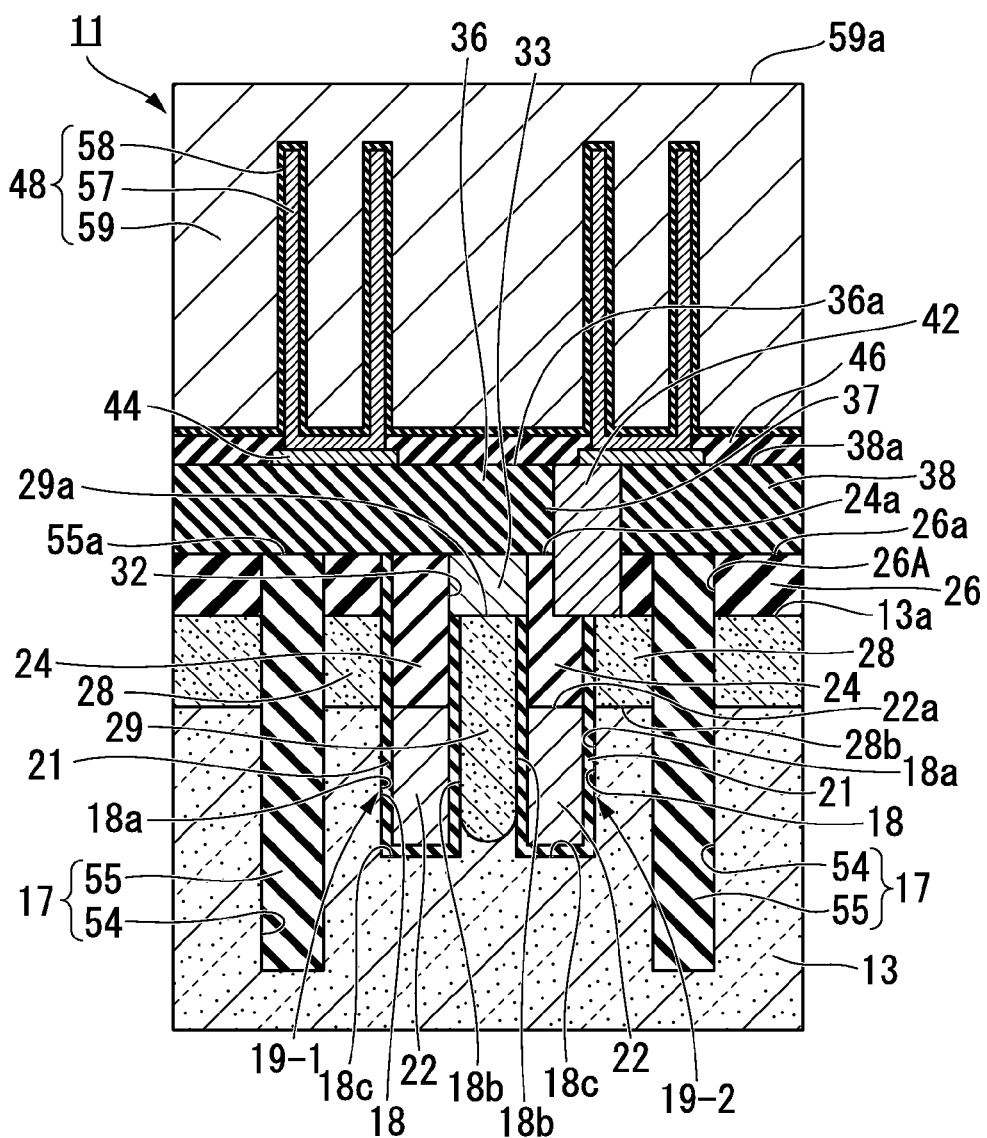
FIG. 16B is a fragmentary cross sectional elevation view, taken along an A-A line of FIG. 16A, of the step, subsequent to the step of FIGS. 15A, and 15B, involved in the method of forming the memory cell array of the semiconductor device of FIGS. 1, 2A, 2B, and 2C.

Next, in the processes shown in FIGS. 16A and 16B, the thick silicon oxide film (SiO$_2$ film) (not shown in the drawings) is formed on the silicon nitride film 46. The thickness of the silicon oxide film (SiO$_2$ film) may be set to 1500 nm.

Next, the patterned photoresist (not shown in the drawings) is formed on the silicon oxide film (SiO$_2$ film) using a photolithographic technique. Next, the silicon oxide film (not shown in the drawings) and the silicon nitride film 46 that are formed on the capacitor contact pad 44 are etched by dry etching using the photoresist as a mask and a cylinder hole (not shown in the drawings) that exposes the capacitor contact pad 44 is formed. Next, the photoresist (not shown in the drawings) is removed.

Next, a conductive film (for example, titanium nitride film) is formed on an inner surface of the cylinder hole (not shown in the drawings) and the top surface of the capacitor contact pad 44 and the lower electrode 57 that is formed of the conductive film and has a coronal shape is formed.

Next, the silicon oxide film (not shown in the drawings) is removed by wet etching and the top surface of the silicon nitride film 46 is exposed. Next, the capacitor insulating film 58 that covers the top surface of the silicon nitride film 46 and the lower electrode 57 is formed.

Next, the upper electrode 59 is formed to cover the surface of the capacitor insulating film 58. At this time, the upper electrode 59 is formed such that the top surface 59*a* of the upper electrode 59 is arranged on the upper side of the capacitor insulating film 58. Thereby, the capacitor 48 that includes the lower electrode 57, the capacitor insulating film 58, and the upper electrode 59 is formed on each capacitor contact pad 44.

Thereby, the semiconductor device 10 according to the first embodiment is manufactured. Actually, an interlayer insulating film, a via, and a wiring (not shown in the drawings) are formed on the top surface 59*a* of the upper electrode 59.

According to the method of manufacturing the semiconductor device according to the first embodiment, the fin portion 15 is provided in the bottom portion 18*c* of the gate electrode groove 18. The first impurity diffusion region 28 that includes the top surface 13*a* of the semiconductor substrate 13 interposed between the first side 18*a* and the second element isolation groove 54 and covers the upper portion 21A of the gate insulating film 21 arranged on the first side 18*a*, and the second impurity diffusion region 29 that is arranged on the portion of the semiconductor substrate 13 positioned between the two gate electrode grooves 18 and covers all of the portions other than the lower end of the gate insulating film 21 arranged on the second side 18*b* of each of the pair of gate electrode grooves 18 are provided. Thereby, when the first and second transistors 19-1 and 19-2 are operated, the first channel region is formed in the fin portion 15, the second channel region is formed in the portion of the semiconductor substrate 13 that contacts the lower portion of the gate insulating film 21 arranged on the first side 18*a*, contacts the bottom portion 18*c* of the gate electrode groove 18, and is positioned at the lower side of the bottom portion of the second impurity diffusion region 29 arranged on the second side 18*b*, and the channel region may not be provided in the portion of the semiconductor substrate 13 that contacts the second side 18*b* and is positioned at the upper side of the bottom portion of the second impurity diffusion region 29.

That is, when the first and second transistors 19-1 and 19-2 are turned on, the fin portion 15 is fully depleted. Therefore, in the first and second transistors 19-1 and 19-2, the resistance becomes low and the current can easily flow, as compared with the transistors according to the related art. Thereby, in a miniaturized memory cell, the channel resistance may be decreased and the on-state current may be increased.

When one of the first and second transistors 19-1 and 19-2 is operated, the other transistor may be suppressed from being erroneously operated.

Therefore, even when the size of the semiconductor device 10 is decreased and the gate electrodes 22 are arranged at a narrow pitch, the first and second transistors 19-1 and 19-2 may be operated independently and stably.

The fin portion 15 is provided in the bottom portion 18*c* of each of the two gate electrode grooves 18 arranged to be adjacent to each other and the depth H of the fin portion 15 is set to 40 nm or less. Thus, in the state in which "L" is stored in the lower electrode 57 electrically connected to the first transistor 19-1 and "H" is stored in the lower electrode 57 electrically connected to the second transistor 19-2, when on/off of the gate electrode 22 (word line) corresponding to the first transistor 19-1 is repeated, the fin portion 15 becoming the channel region of the first transistor 19-1 is a p-type and it becomes difficult to induce the electrons e$^-$ (not shown in the drawings). Therefore, the electrons e$^-$ induced in the channel of the first transistor 19-1 may be suppressed from reaching the second impurity diffusion region 28 (drain region) forming the second transistor 19-2.

Thereby, the electrons e$^-$ induced in the channel of the first transistor 19-1 may be prevented from destroying H information stored in the lower electrode 57 electrically connected to the second transistor 19-2 to change the state to the L state. Therefore, generation of the disturbance failure in which the operation state of one adjacent cell changes a storage state of the other cell may be suppressed.

In the DRAM in which an interval between the two gate electrodes 22 arranged to be adjacent to each other is 50 nm or less, the generation of the disturbance failure may be suppressed.

The gate electrode 22 is formed to bury the lower portion of each gate electrode groove 18 through the gate insulating film 21. Next, the buried insulating film 24 that covers the top surface 22a of the gate electrode 22 is formed to bury each gate electrode groove 18 and the gate electrode 22 may be prevented from protruding to the upper side of the surface 13a of the semiconductor substrate 13.

Thereby, as described in this embodiment, when the DRAM is used as the semiconductor device 10, the bit line 34 or the capacitor 48 that is formed in the process after the process for forming the gate electrode 22 may be easily formed. Therefore, the semiconductor device 10 may be easily manufactured.

In this embodiment, the silicon oxide film ($SiO_2$ film) is used as the buried insulating film 24 and the silicon nitride film (SiN film) is used as the mask insulating film 26. However, the silicon nitride film (SiN film) may be used as the buried insulating film 24 and the silicon oxide film ($SiO_2$ film) may be used as the mask insulating film 26.

Thereby, in the processes shown in FIGS. 15A and 15B, when the contact hole 41 is formed, the silicon nitride film (SiN film) that becomes the buried insulating film 24 functions as an etching stopper. Therefore, because the contact hole 41 may be prevented from exposing the top surface 22a of the gate electrode 22, the capacitor contact pad 44 and the gate electrode 22 may be prevented from becoming conductive, through the capacitor contact plug 42 formed in the contact hole 41.

The preferred embodiments of the present invention have been described in detail. However, the present invention is not limited to the specific embodiments and various changes and modifications may be made without departing from the spirit and scope of the present invention described in claims.

FIG. 17 is a plan view showing another example of the layout of a memory cell array that may be applied to the semiconductor device according to the embodiment of the present invention. In FIG. 17, the same components as those of the structure shown in FIG. 1 are denoted by the same reference numerals.

The semiconductor device 10 according to the embodiment described above can also be applied to the layout in which the active region 16 and the bit line 34 shown in FIG. 17 are formed in a zigzag shape.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate having a first gate groove;
a first fin structure underneath a top of the first gate groove;
a second gate groove in the semiconductor substrate running generally parallel to said first gate groove;
a second fin structure underneath a top of the second gate groove;
a first gate insulating film that covers the first gate groove and a surface of the first fin structure;
a second gate insulating film that covers the second gate groove and a surface of the second fin structure;
a first gate electrode on the first gate insulating film in a lower portion of the first gate groove, the first gate electrode extending over the first fin structure;
a second gate electrode on the second gate insulating film in a lower portion of the second gate groove, the second gate electrode extending over the second fin structure;
a first diffusion region in the semiconductor substrate, the first diffusion region covering an upper portion of a first side of the first gate groove;
a second diffusion region in the semiconductor substrate, the second diffusion region covering a second side of the first gate groove, the second diffusion region also covering a second side of the second gate groove;
a third diffusion region in the semiconductor substrate covering an upper portion of a first side of the second gate groove,
wherein a bottom of the second diffusion region is shallower than a bottom of the first fin structure, and
wherein the bottom of the second diffusion region is deeper than a top of the first fin structure.

2. The semiconductor device according to claim 1, wherein the first gate groove has a bottom that has a depth from a surface of the semiconductor substrate in the range from 150 nm to 200 nm, and the first fin structure has a height in the range from 10 nm to 40 nm.

3. The semiconductor device according to claim 1, further comprising a plurality of first isolation regions in the semiconductor device, the plurality of first isolation regions defining active regions, the plurality of first isolation regions extending in a first direction,
wherein the first and second gate grooves extend in a second direction and across the active regions and the plurality of first isolation regions.

* * * * *